(12) United States Patent
Tojima et al.

(10) Patent No.: US 6,826,731 B2
(45) Date of Patent: Nov. 30, 2004

(54) METHOD OF DESIGNING SEMICONDUCTOR INTEGRATED CIRCUIT DEVICE

(75) Inventors: Masayoshi Tojima, Fukuoka (JP); Masahiro Ohashi, Fukuoka (JP); Mana Hamada, Fukuoka (JP); Miki Arita, Fukuoka (JP); Yuji Sugisawa, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/330,083

(22) Filed: Dec. 30, 2002

(65) Prior Publication Data

US 2003/0135833 A1 Jul. 17, 2003

Related U.S. Application Data

(62) Division of application No. 09/710,910, filed on Nov. 14, 2000, now Pat. No. 6,647,539.

(30) Foreign Application Priority Data

Nov. 15, 1999 (JP) .......................................... 11-323602

(51) Int. Cl.[7] .............................................. G06F 17/50
(52) U.S. Cl. ............................................. 716/1; 716/18
(58) Field of Search ....................................... 716/1–18

(56) References Cited

U.S. PATENT DOCUMENTS

| | | | |
|---|---|---|---|
| 5,487,018 A | | 1/1996 | Loos et al. |
| 5,600,567 A | | 2/1997 | Kucukcakar et al. |
| 6,198,978 B1 | * | 3/2001 | Takahashi ..................... 700/97 |
| 6,289,498 B1 | * | 9/2001 | Dupenloup ................... 716/18 |
| 6,389,264 B1 | * | 5/2002 | Halonen .................. 455/67.11 |
| 6,412,101 B1 | * | 6/2002 | Chang et al. ................. 716/10 |
| 6,425,115 B1 | * | 7/2002 | Risler et al. ................. 716/17 |
| 6,448,810 B1 | * | 9/2002 | Nomura ....................... 326/82 |
| 6,457,166 B1 | * | 9/2002 | Shoyama ..................... 716/18 |

FOREIGN PATENT DOCUMENTS

| | | |
|---|---|---|
| JP | 64-86276 | 3/1989 |
| JP | 6-139305 | 5/1994 |
| JP | 6-332971 | 12/1994 |
| JP | 9-91335 | 4/1997 |

* cited by examiner

*Primary Examiner*—Vuthe Siek
(74) *Attorney, Agent, or Firm*—McDermott Will & Emery LLP

(57) ABSTRACT

A system which allows signal transmission between circuit blocks is constructed promptly by automatically generating an I/F circuit in response to the adjustment of a timing relationship and to a modification in a waveform on a GUI and automatically inserting the I/F circuit between the circuit blocks or adding the I/F circuit to any of the circuit block. A circuit for outputting an operation enable for a receiving side is generated automatically between a plurality of blocks operating with different frequencies, whereby the use of the circuit blocks is expanded in spite of the different frequencies. Further, the design of a large-scale system is performed efficiently by automatically generating a desired waveform by a simple editing operation, generating a desired signal waveform by forming a combinational circuit of signals in the circuit block, and automatically generating a logic synthesis script.

6 Claims, 40 Drawing Sheets

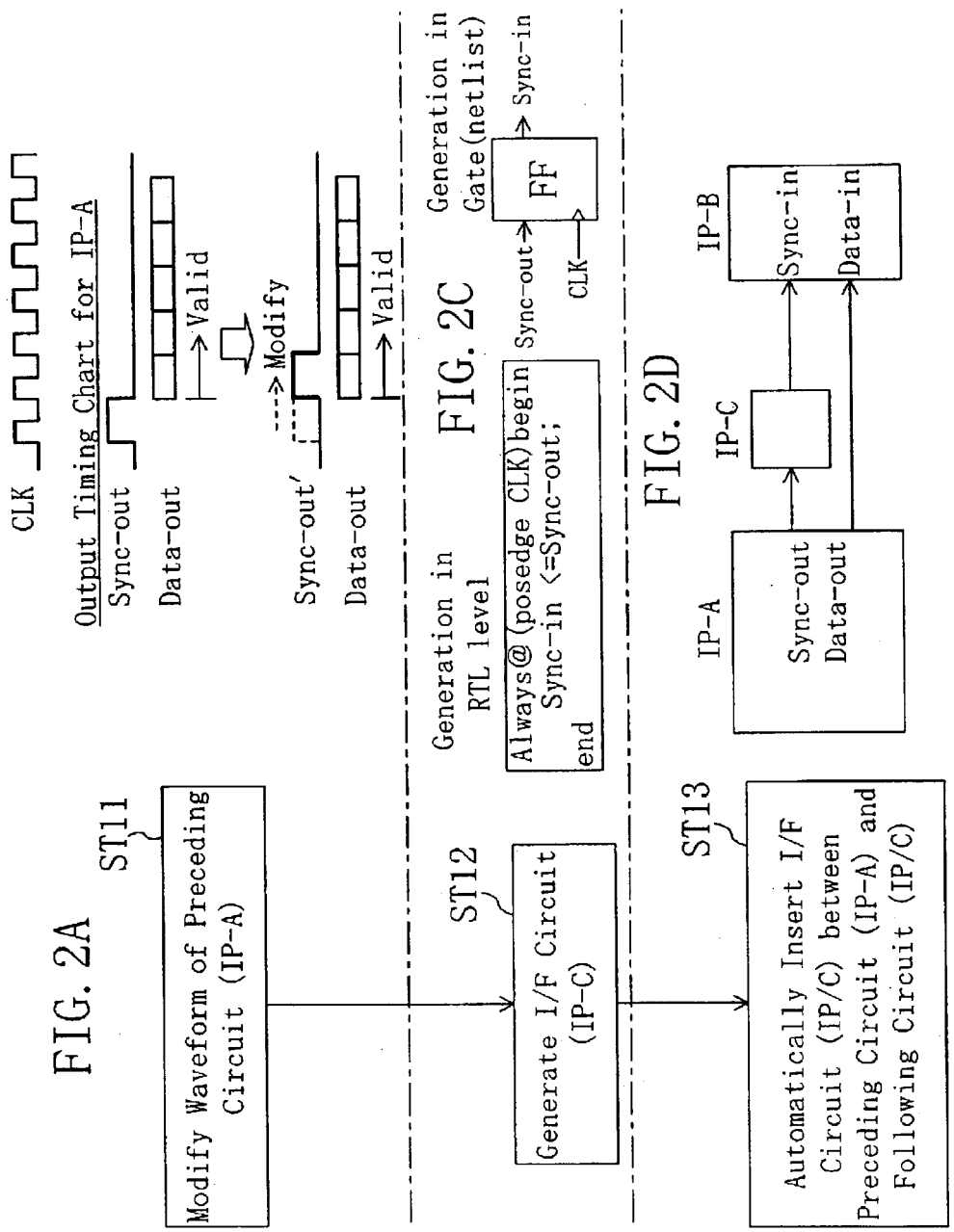

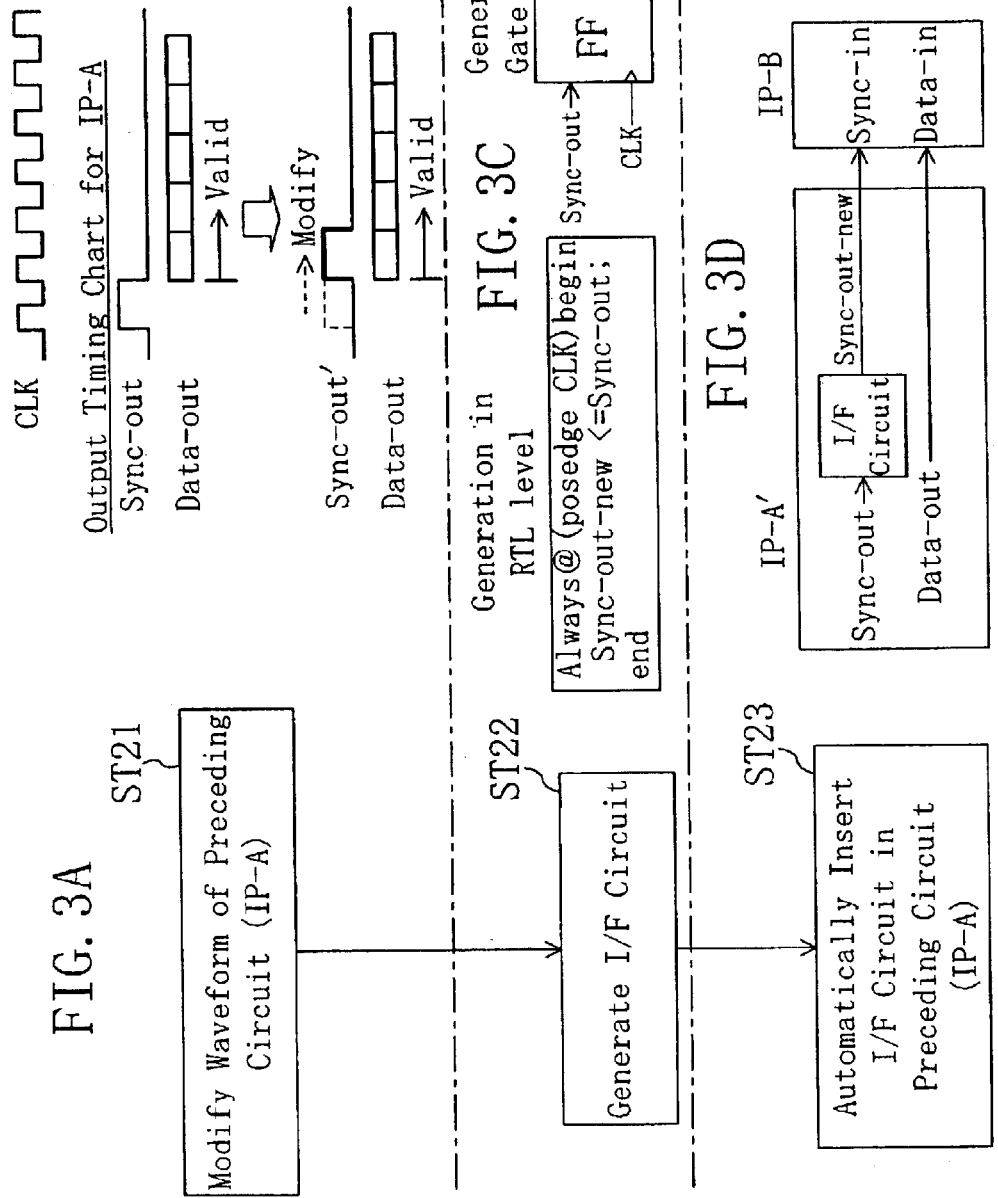

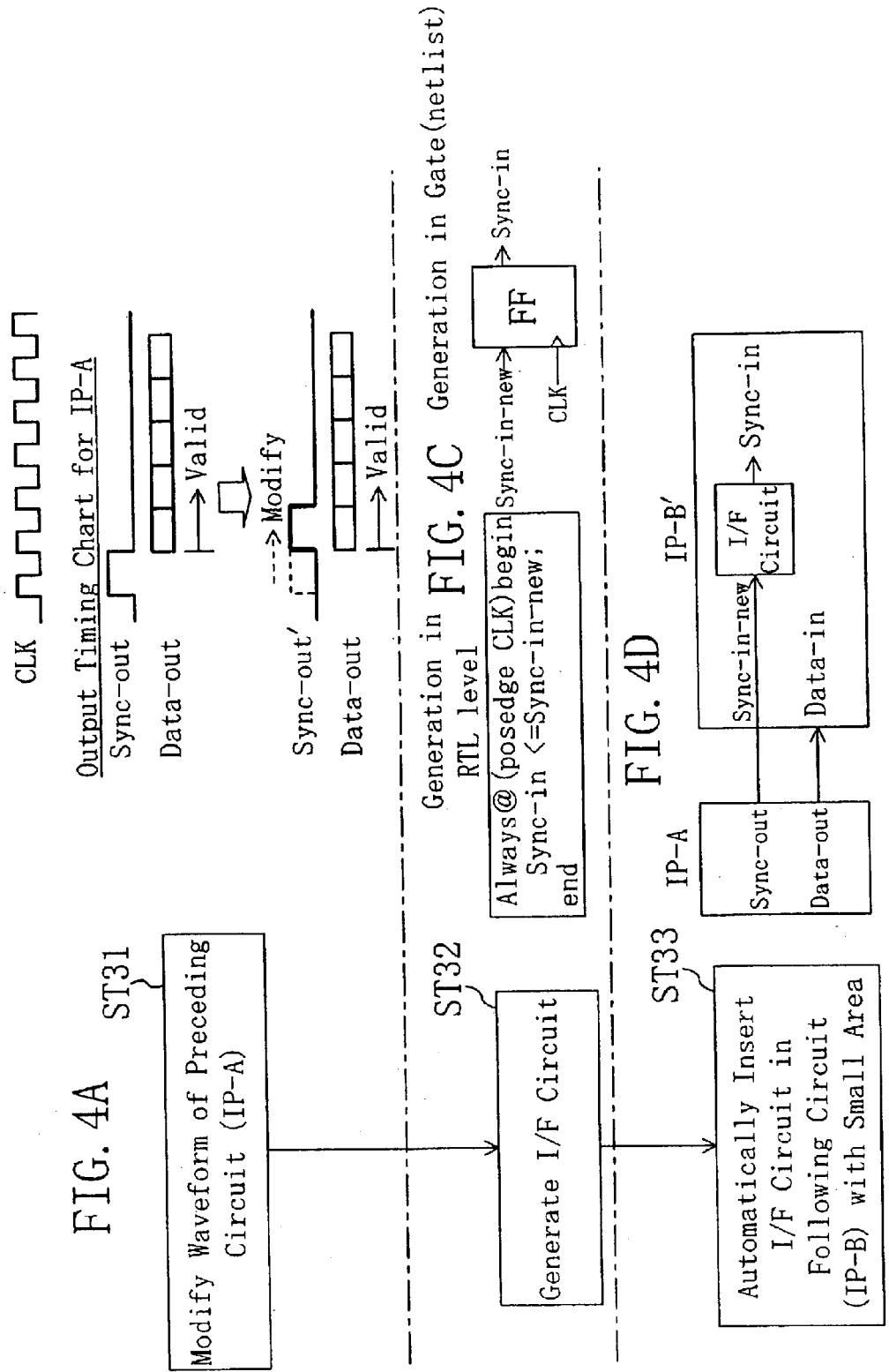

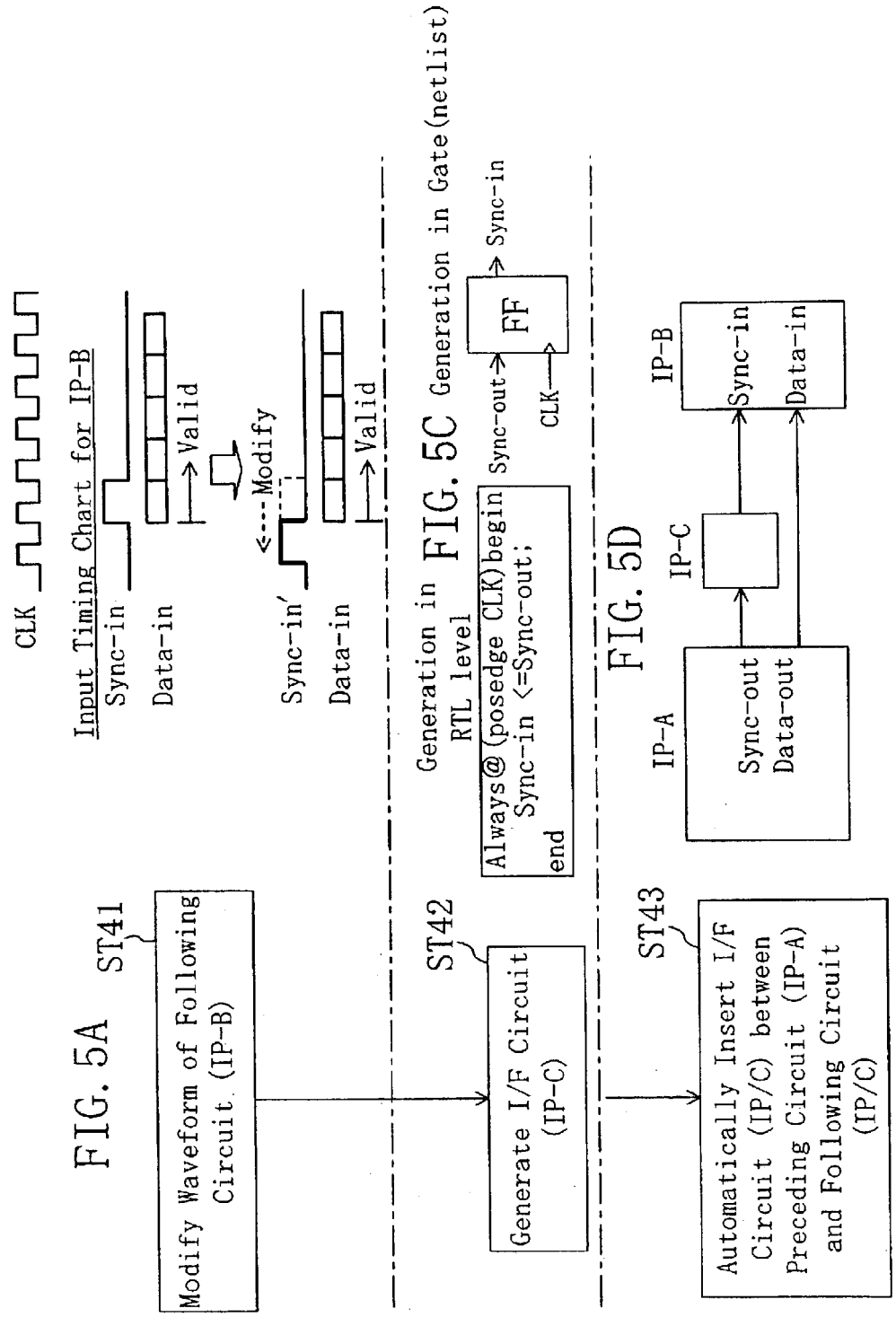

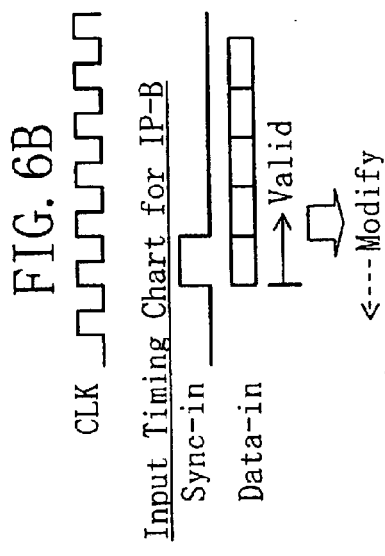
FIG. 6B
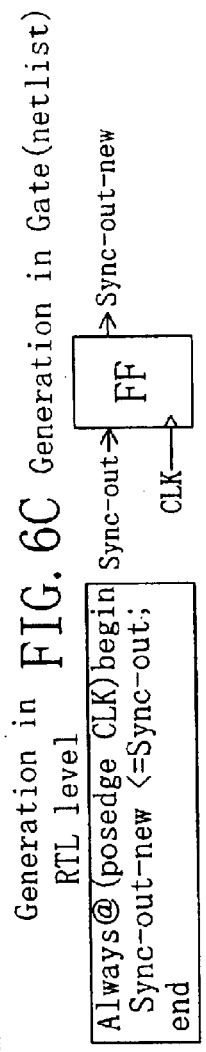
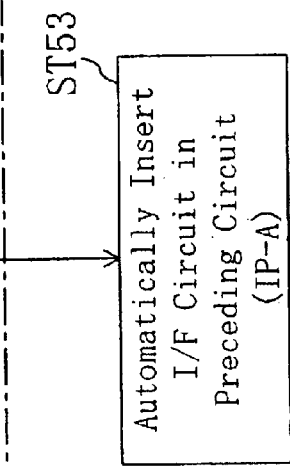
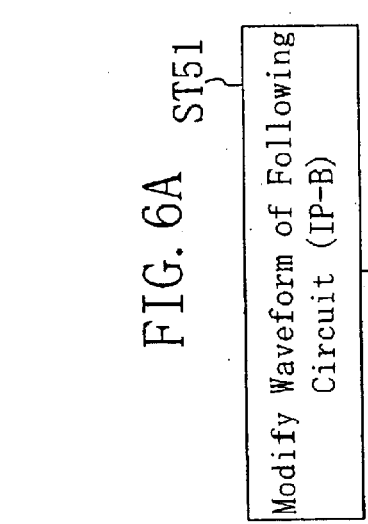

FIG. 7A

ST61: Modify Waveform of Following Circuit (IP-B)

ST62: Generate I/F Circuit

ST63: Automatically Insert I/F Circuit in Following Circuit (IP-B) with Small Area

FIG. 7B

Input Timing Chart for IP-B

CLK

Sync-in
Data-in →Valid

---Modify

Sync-in
Data-in →Valid

FIG. 7C Generation in Gate(netlist)

Generation in RTL level

```
Always@(posedge CLK) begin
  Sync-in <= Sync-in-new;
end
```

Sync-in-new → FF → Sync-in
CLK

FIG. 7D

IP-A: Sync-out, Data-out

IP-B': Sync-in-new → I/F Circuit → Sync-in
Data-in

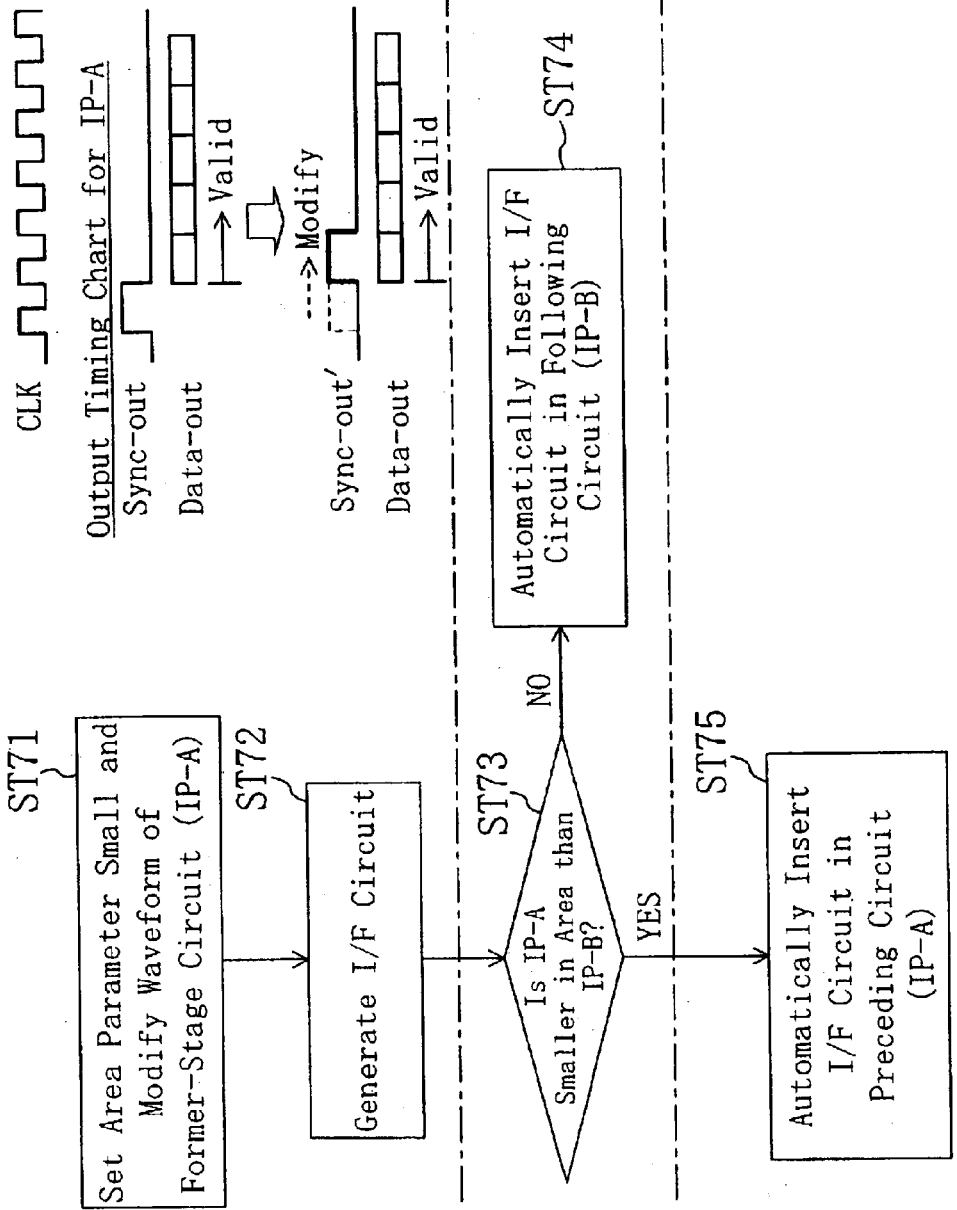

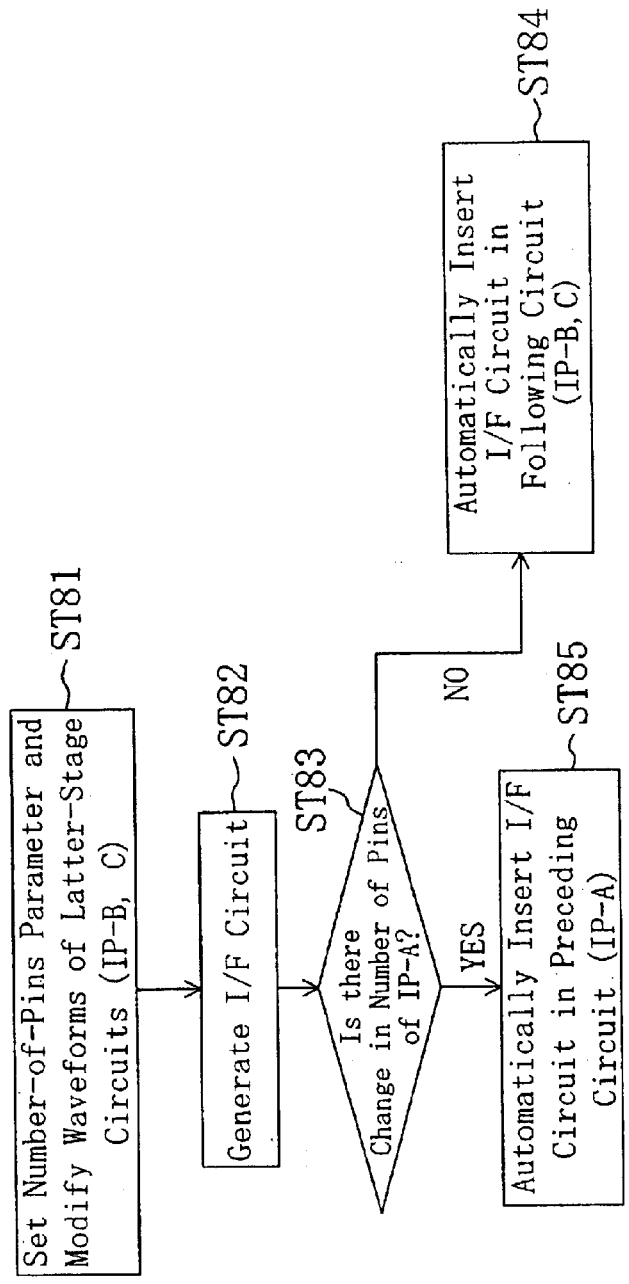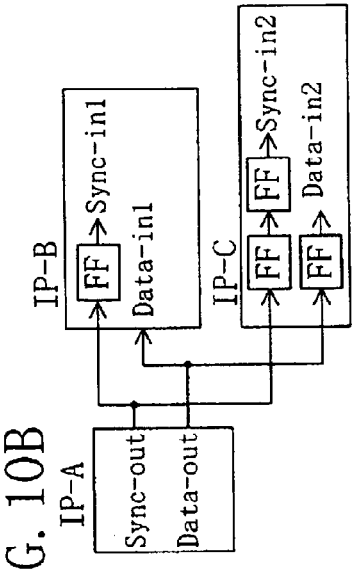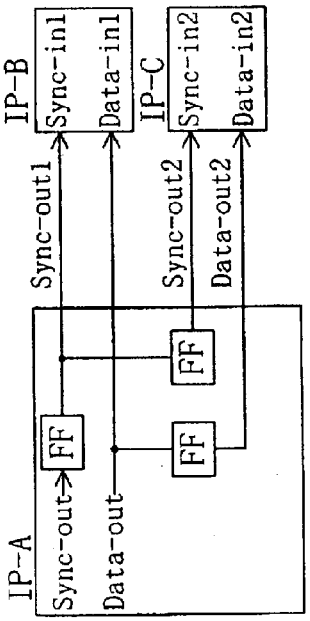

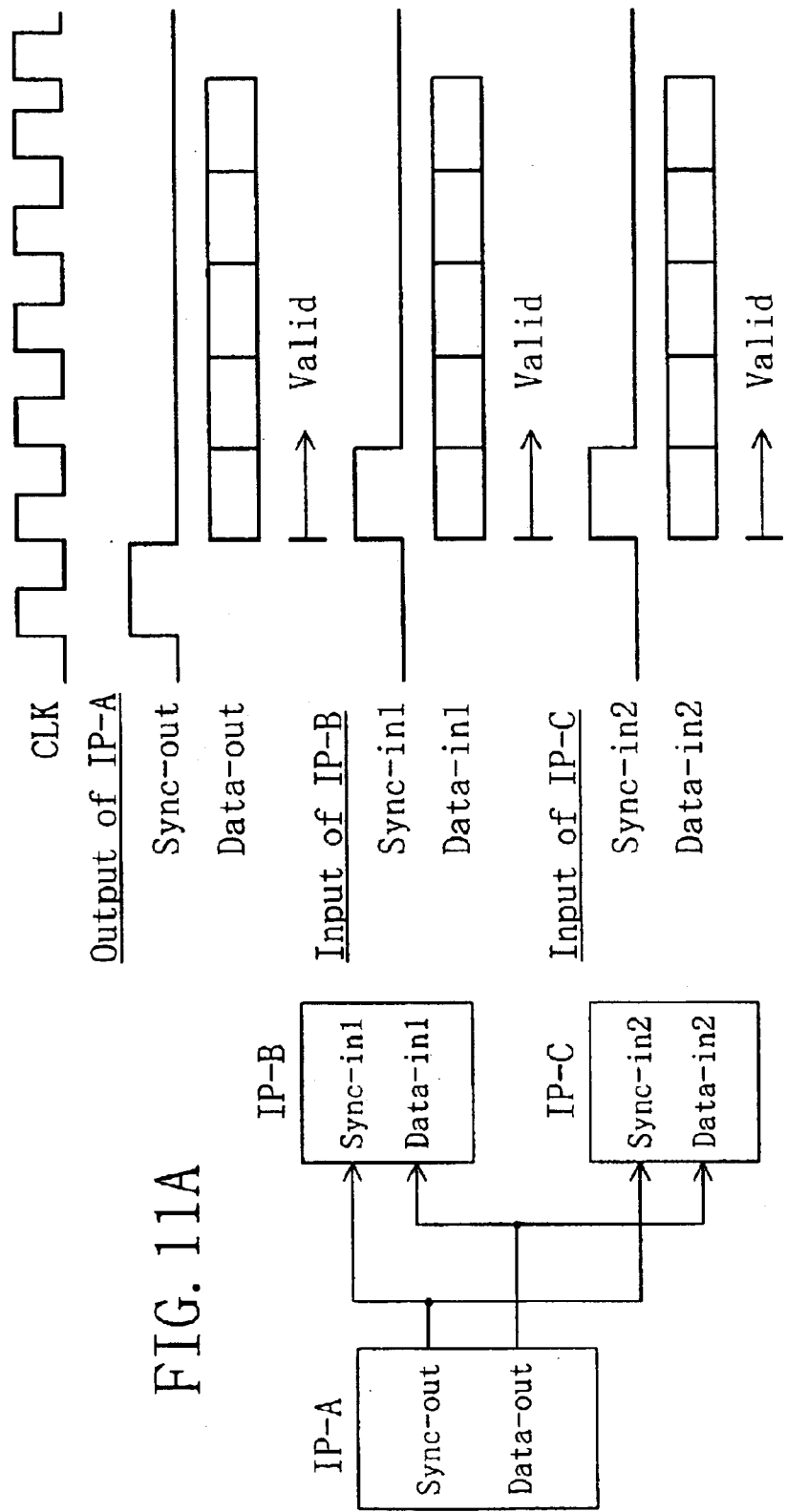

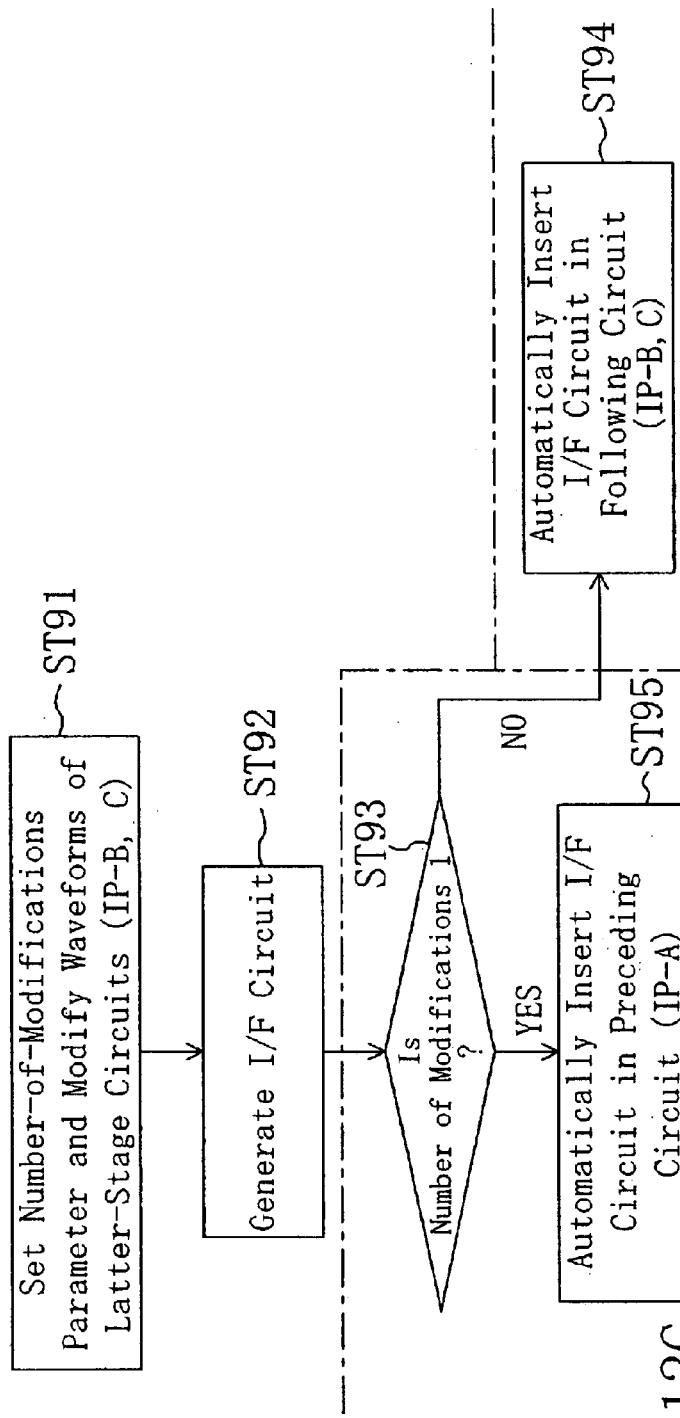

| Operation | Circuit Behavior |
|---|---|
| Drag & Slide | delay |
| Double-Click | Invert Logic of Whole Selected Signal |

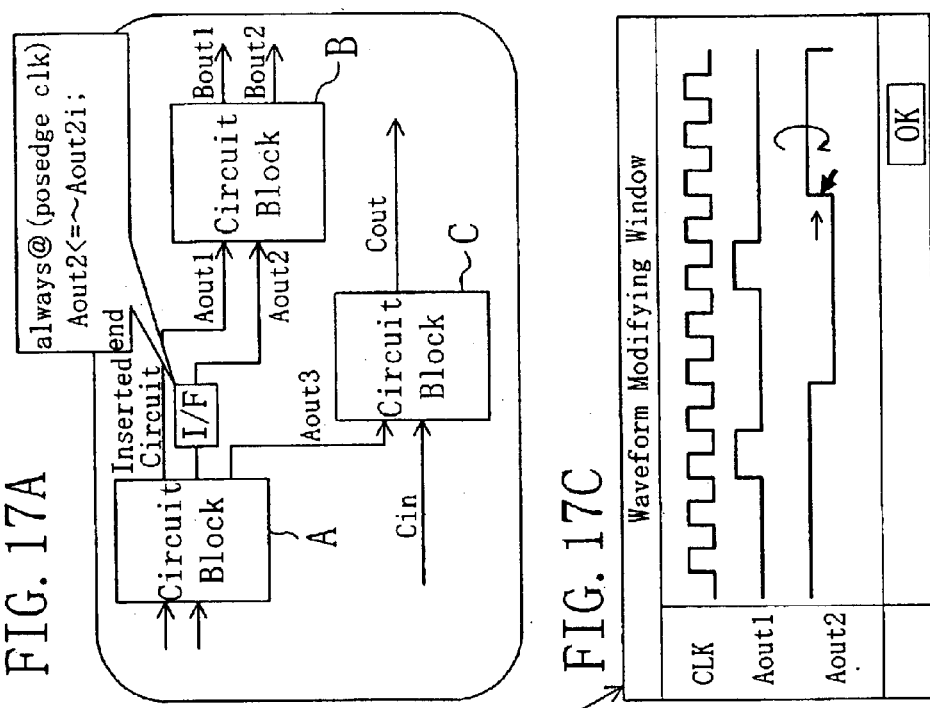
FIG. 17A
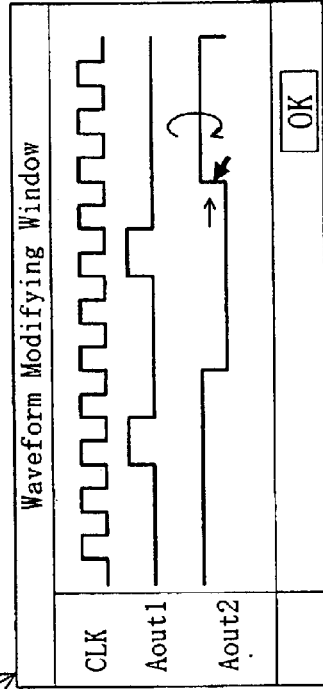
FIG. 17C
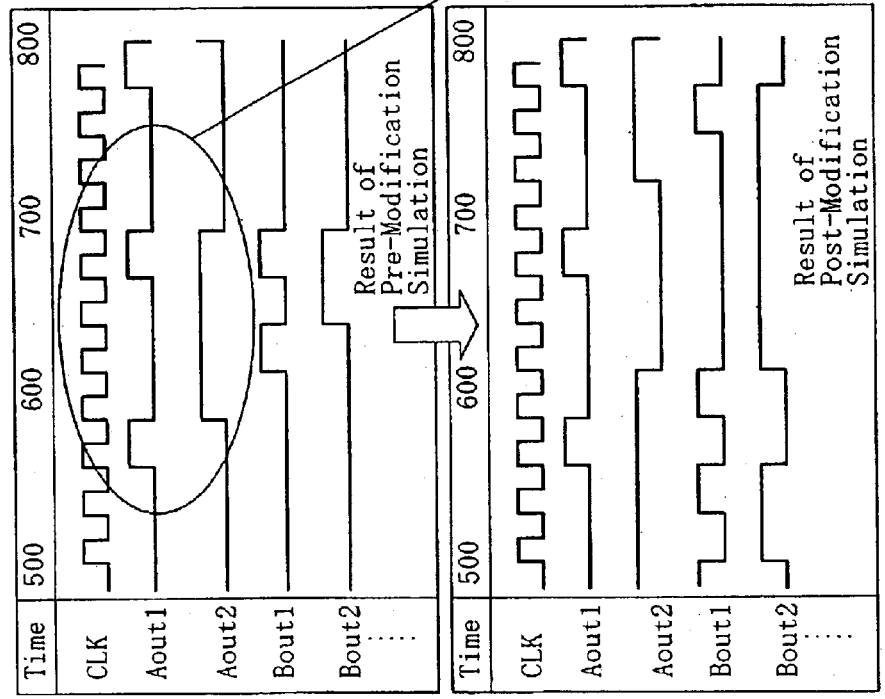
FIG. 17B
FIG. 17D

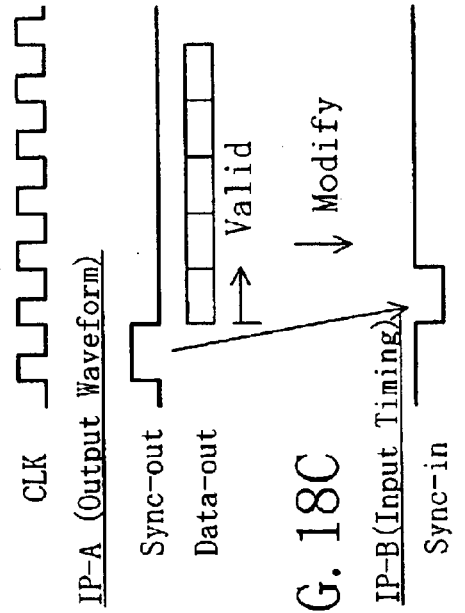
FIG. 18B
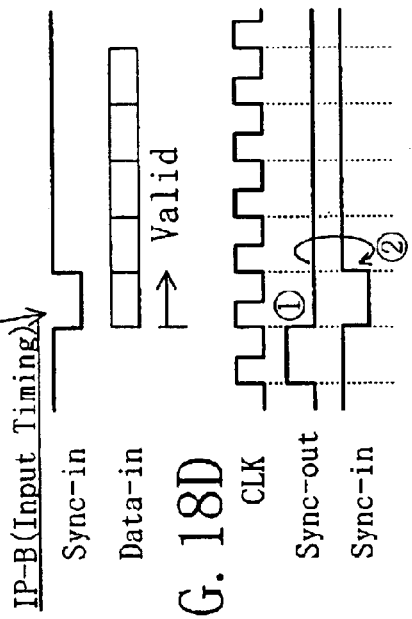
FIG. 18C
FIG. 18D
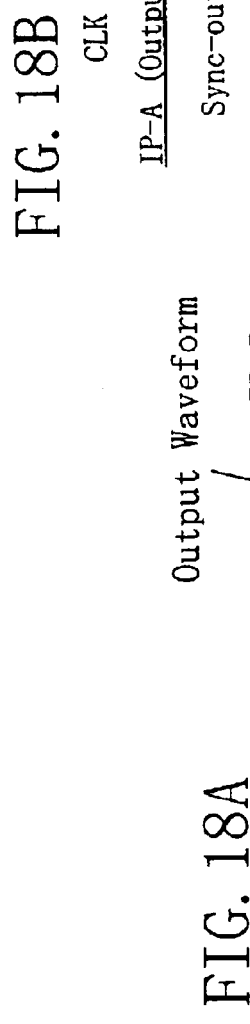
FIG. 18A
FIG. 18E
Always@ (posedge CLK) begin
Sync-in<=~Sync-out;
end
FIG. 18F

```
always@(posedge clock)begin
  if(!reset)begin
    c<=0;
  end
  else if(a==1)begin
    if(b==1)begin
      c<=1;
    end
    else begin
      c<=0;
    end
  end
  else begin
    c<=c;
  end
end
```

FIG. 25A
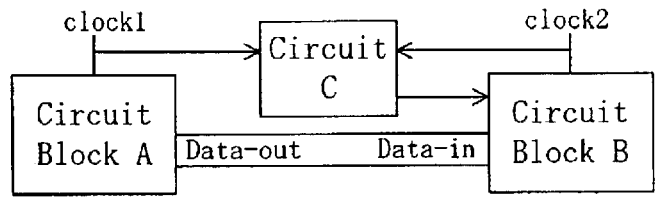
FIG. 25B
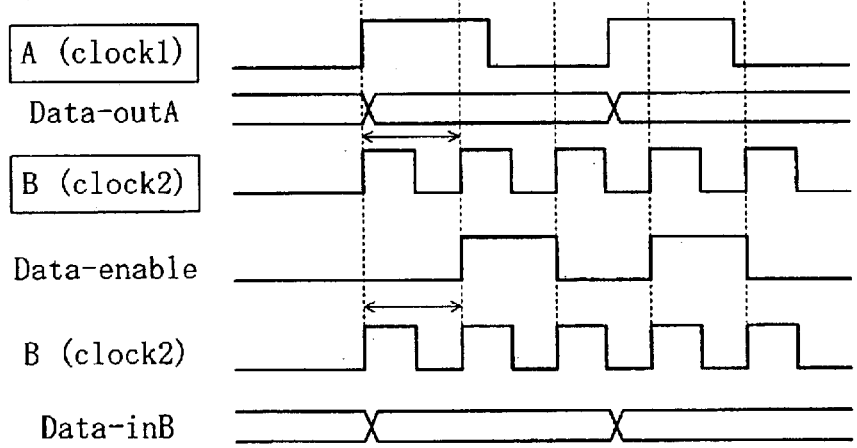
FIG. 25C
```
Circuit C (Detect Rising Edge)
 always@(posedge clk2)begin
   edge1 <=clk1;
   edge2 <=edge1;
 end
assign Data-enable=edge1 &~edge2;
```
FIG. 25D
```
Modify Circuit B
 always@(posedge clk2)begin
   dataB <=Data-inB;
 end
```
→
```
always@(posedge clk2)begin
 if(Data-enable)
   dataB <=Data-inB;
 else
   dataB <=dataB;
end
```

FIG. 26A
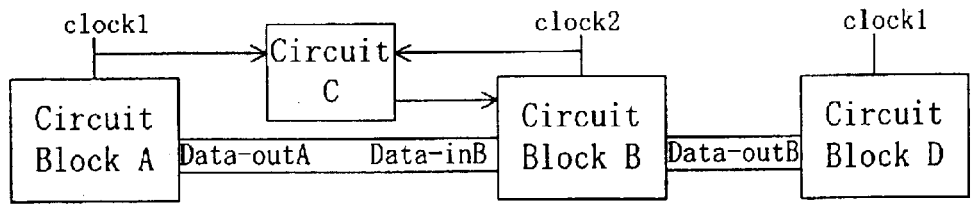
FIG. 26B
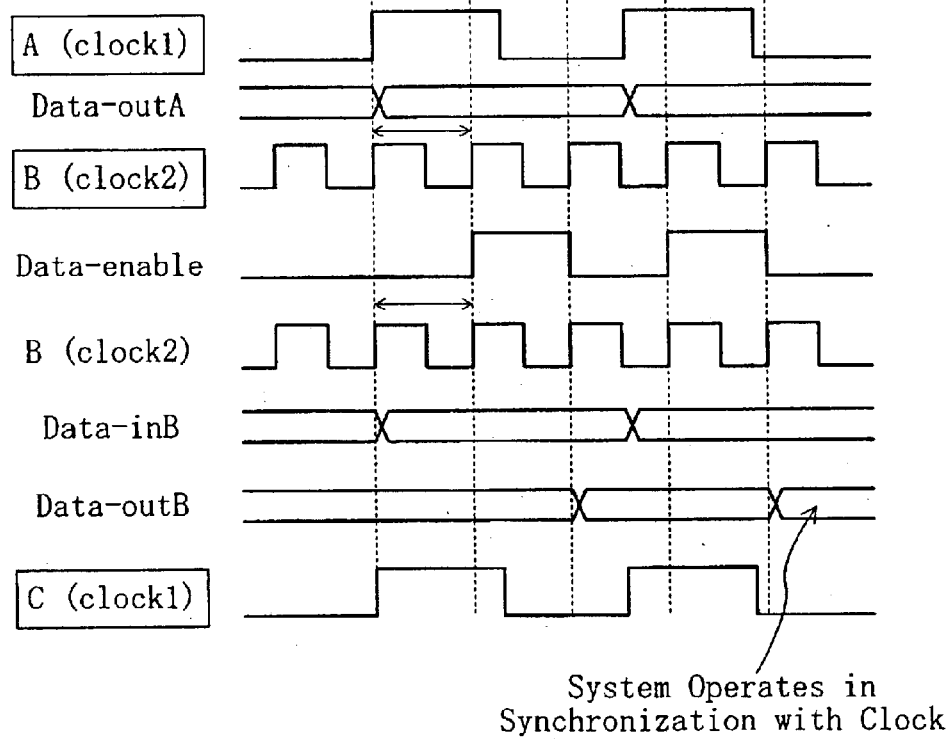
System Operates in Synchronization with Clock
FIG. 26C
```
Circuit C (Detect Rising Edge)
  always@(posedge clk2)begin
    edge1 <=clk1;
    edge2 <=edge1;
  end
assign Data-enable=edge1 &~edge2;
```
FIG. 26D
```
Modify Circuit B
  always@(posedge clk2)begin
    data-outB <=DataB;
  end
```
→
```
always@(posedge clk2)begin
  if(Data-enable)
    data-outB <=dataB;
  else
    data-outB <=data-outB;
end
```

FIG. 27A
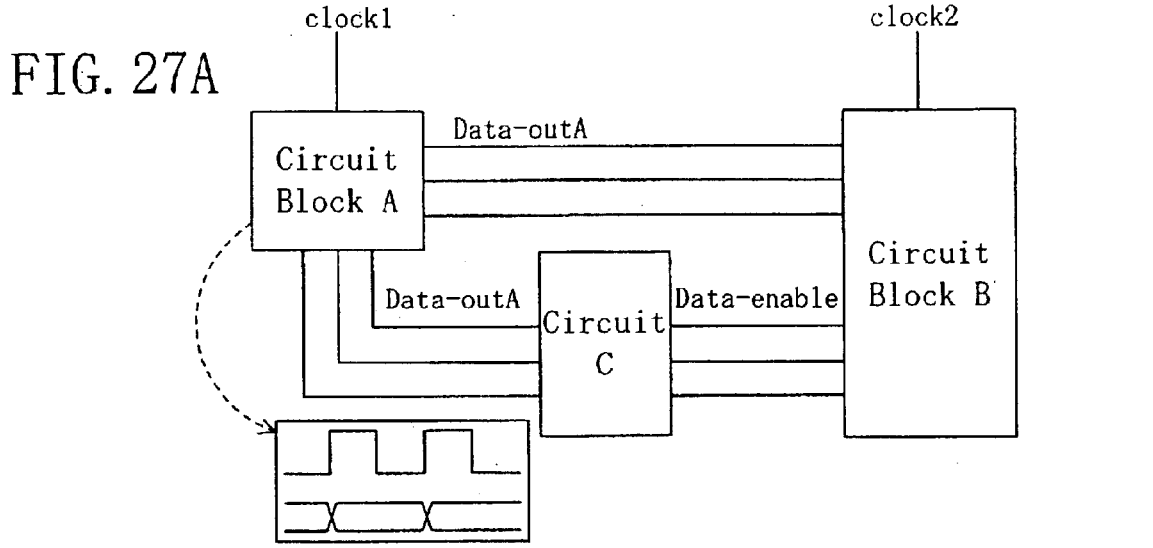
FIG. 27B  Data Skew (Data Transition Region)
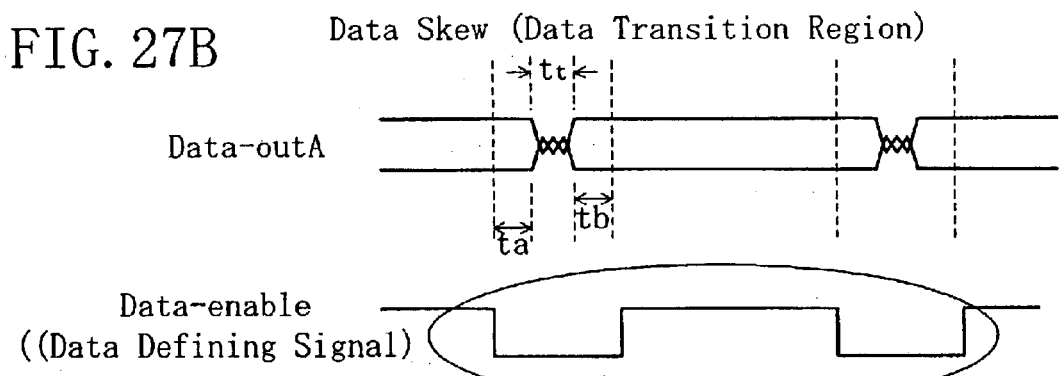
Data Defined Interval can be Judged from the Signal
FIG. 27C
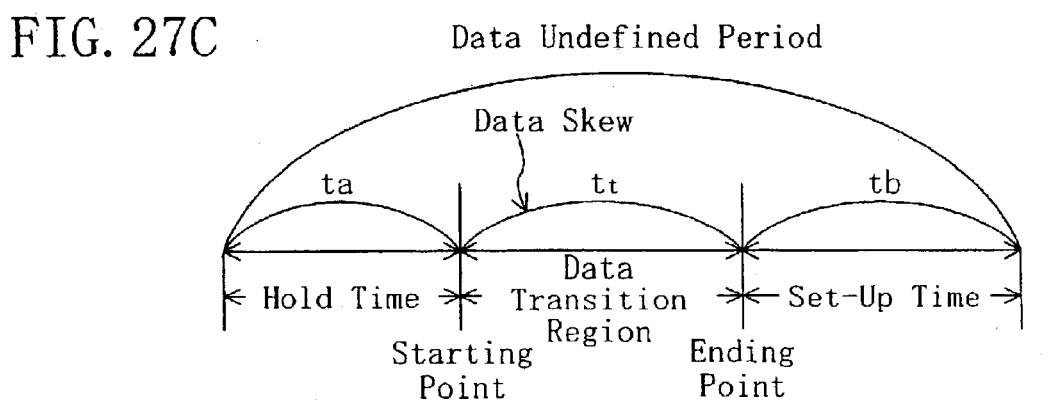

FIG. 31A  Combination of 2 Inputs Including Signal (1)

|       | (2) | (3) | (4) | (5) | (6) | ······ |
|-------|-----|-----|-----|-----|-----|--------|
| 2AND  | a1  | a2  | a3  | a4  | a5  | ······ |
| 2OR   | b1  | b2  | b3  | b4  | b5  | ······ |
| 2EXOR | c1  | c2  | c3  | c4  | c5  | ······ |
| ...   |     |     |     |     |     |        |

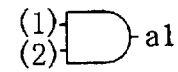

FIG. 31B  Combination of 2 Inputs Including Signal (2)

|       | (1) | (3) | (4) | (5) | (6) | ······ |
|-------|-----|-----|-----|-----|-----|--------|
| 2AND  | d1  | d2  | d3  | d4  | d5  | ······ |
| 2OR   | e   | e   | e   | e   | e   | ······ |
| 2EXOR | f1  | f2  | f3  | f4  | f5  | ······ |
| ...   |     |     |     |     |     |        |

FIG. 31C  Combination of 3 Inputs Including Signals (1), (2)

|       | (3) | (4) | (5) | (6) | (7) | ······ |
|-------|-----|-----|-----|-----|-----|--------|
| 2AND  | s1  | s2  | s3  | s4  | s5  | ······ |
| 2OR   | t1  | t2  | t3  | t4  | t5  | ······ |
| 3EXOR | u1  | u2  | u3  | u4  | u5  | ······ |
| ...   |     |     |     |     |     |        |

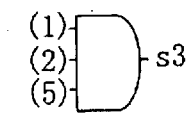

FIG. 31D  Combination of 3 Inputs Including Signals (1), (3)

|       | (2) | (4) | (5) | (6) | (7) | ······ |
|-------|-----|-----|-----|-----|-----|--------|
| 2AND  | x1  | x2  | x3  | x4  | x5  | ······ |
| 2OR   | y1  | y2  | y3  | y4  | y5  | ······ |
| 3EXOR | z1  | z2  | z3  | z4  | z5  | ······ |
| ...   |     |     |     |     |     |        |

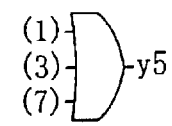

FIG. 31E  Combination of 2 Inputs Including Signal (n-1)

|       | a1  | a2  | a3  | a4  | a5  | ······ |
|-------|-----|-----|-----|-----|-----|--------|
| 2AND  | 2a1 | 2a2 | 2a3 | 2a4 | 2a5 | ······ |
| 2OR   | 2b1 | 2b2 | 2b3 | 2b4 | 2b5 | ······ |
| 2EXOR | 2c1 | 2c2 | 2c3 | 2c4 | 2c5 | ······ |
| ...   |     |     |     |     |     |        |

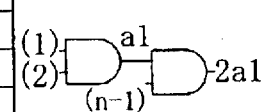

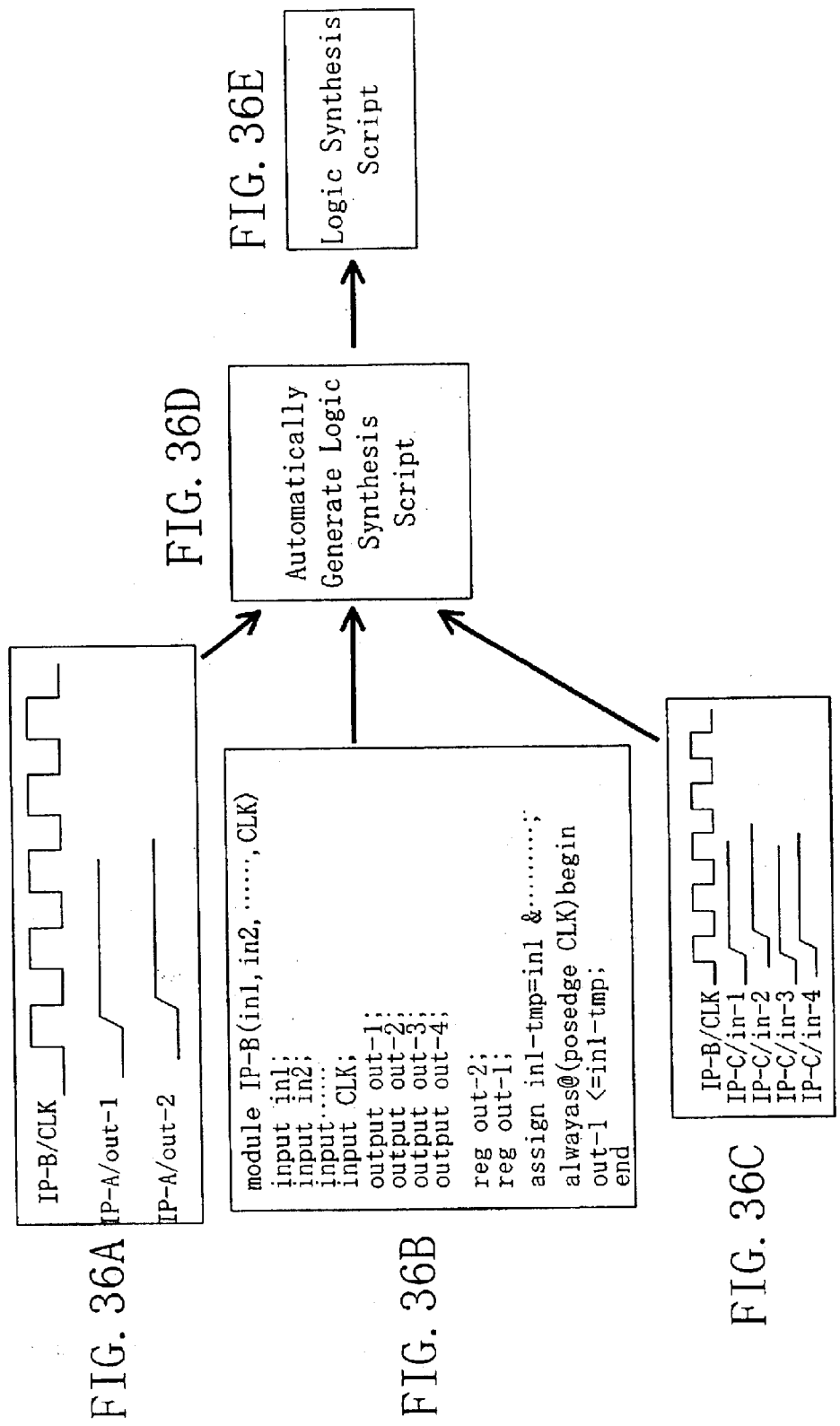

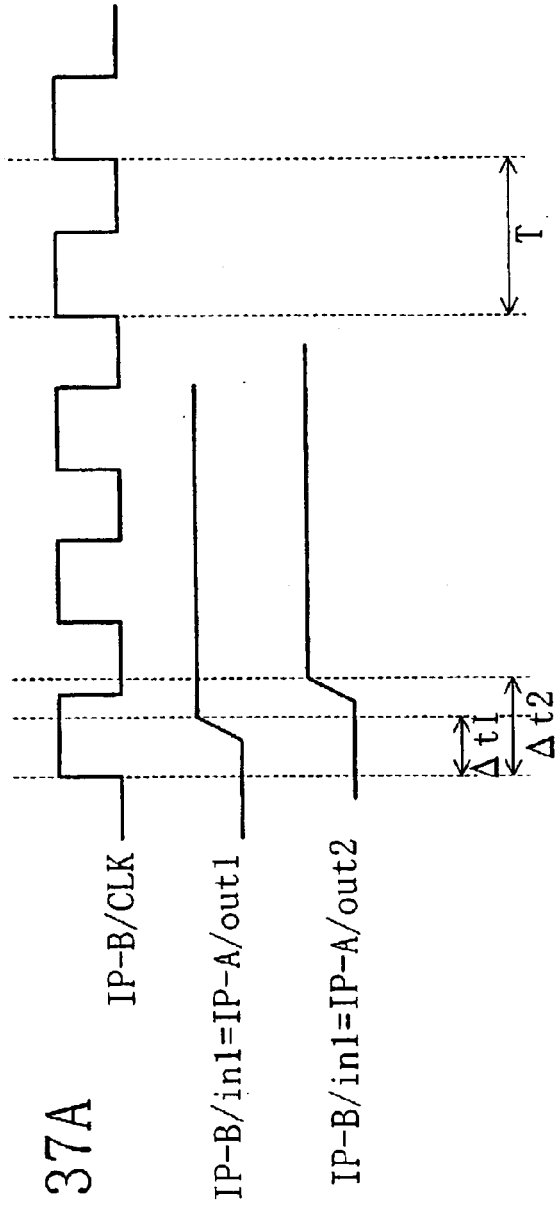

FIG. 39

| Operation | Circuit Behavior | Notes on Behavioral Description in C language | C Language Description for Co-Design/Verification | | | |
|---|---|---|---|---|---|---|
| | | | UnTimed-C Description | | Cycle-Based C Description | |
| | | | Functional Element | Generated Description | Functional Element | Generated Description |
| Drag & Slide | 2cycle delay | C Language in General has No Conception of Time | | ```
blockdef if(
  bool din,
  bool dout
)
begin
C.U.T. version
{
  int tmpinv0;
  thread
  {
    tmpinv0=~din;
  }
  thread
  {
    dout=tmpinv0;
  }
};
end;
``` | ```
thread rise(clk)
{
  tmpff0=din;
  tmpff1=tmpff0;
}
``` / ```
thread clk
{
  tmpinv0=~din;
}
``` | ```
blockdef if(
  bool din,
  bool dout
)
begin
C.BCA.version(
  din::Nohndshk,
  dout::Nohndshk
)
{
  context {
    unsigned int tmpinv0;
    unsigned int tmpff0;
    unsigned int tmpff1;
  }
  thread rise(clk)
  {
    tmpff0=tmpinv0;
    tmpff1=tmpff0;
  }
  thread tmpff1
  {
    dout_d=tmpff1;
  }
};
end;
``` |
| Double-Click | Invert Logic of Whole Selected Signal | b=~a; | ```
int tmpinv0;
thread
{
  tmpinv0=~din;
}
``` | | | |

METHOD OF DESIGNING SEMICONDUCTOR INTEGRATED CIRCUIT DEVICE

This application is a divisional of application Ser. No. 09/710,910 filed Nov. 14, 2000 and issued as U.S. Pat. No. 6,647,539 on Nov. 11, 2003, and claims priority to Japanese Application No. JP 11-323602 filed Nov. 15, 1999.

BACKGROUND OF THE INVENTION

The present invention relates to a method of generating an interface between circuit blocks in designing a large-scale semiconductor integrated circuit device by using circuit blocks, which are existing resources for designing a circuit such as IPs (Intellectual Properties).

To reduce the number of designing steps, the development of such a large-scale integrated circuit device as termed, e.g., "system LSI" using circuit blocks termed IPs (or IP cores), which are existing resources for designing a circuit, has been started recently. The circuit blocks have predetermined input/output interfaces (I/F) which are normally different from one circuit block to another. In incorporating such circuit blocks having different interfaces into one system, therefore, it is an important design issue how to adjust the I/F of the individual circuits blocks and thereby promote smooth signal transmission between the individual circuit blocks. For example, it is necessary to modify logics and timings for I/F adjustment in incorporating the circuit blocks into one system.

To meet the necessity, a designing operation has been performed conventionally by a designer who recognizes input/output logics and timings of the circuit blocks, fully understands the difference in I/F structure between the individual circuits blocks, and newly designs an interface circuit or the like required to incorporate the circuit blocks such that the difference in I/F structure between the individual circuit blocks is absorbed and the connecting states between the individual circuit blocks are retained.

As a system LSI to be designed has been scaled up increasingly in recent years, however, the number of circuit blocks to be incorporated into the system LSI has also been increased exponentially. If an adjustment between the individual circuits is performed manually, an enormous amount of designing operation should be performed. In other words, it has been becoming difficult to efficiently design a large-scale integrated circuit device such as a system LSI by a conventional designing method which depends only on the skills of the designer.

On the other hand, there has been known such technology as follows which focuses attention on circuit behaviors such as the attributes and timings of signals and generates a new circuit from the circuit behaviors.

For example, Japanese Unexamined Patent Publication No. HEI 6-32972 discloses technology for generating a new hardware description language from a timing chart and the attributes of signals.

Japanese Unexamined Patent Publication No. HEI 7-253998 discloses technology for synthesizing, by using a truth table, behavioral descriptions of two or more logic circuits newly generated and thereby producing a new, complete circuit behavioral description.

Japanese Unexamined Patent Publication No. HEI 9-91355 discloses technology for generating circuit data, expected value data, timing data, or the like based on operational data, performing simulation, and automatically generating a new logic circuit.

In view of the foregoing, there can be considered the generation of a circuit for absorbing a difference in I/F structure between the circuit blocks by using the conventional methods of automatically generating circuits mentioned above.

Although the technology disclosed in the foregoing conventional publications allows generation of a new circuit block independent of the circuit blocks, the matter of how to smoothly retain the connecting states between the individual blocks remains to be solved. With the conventional technologies, it is difficult to generate an interface circuit considering a difference in I/F structure between the individual circuit blocks in the design of an integrated circuit device using circuit blocks which are existing resources.

SUMMARY OF THE INVENTION

It is therefore an object of the present invention to improve, in the design of an integrated circuit device using circuit blocks which are existing resources, an efficiency with which a large-scale integrated circuit device is designed with the provision of means which allows easy correction or modification of an existing circuit considering an interface structure and easy generation and insertion of a new interface circuit between circuit blocks without recognizing the input/output logics, timings, and the like of the circuit blocks.

A first method of designing a semiconductor integrated circuit device of the present invention is a method of designing a semiconductor integrated circuit device by using at least two circuit blocks stored in a database, the method comprising the steps of: (a) generating an interface circuit for implementing, in response to an operation of modifying a timing chart for providing a coincidence between a timing relationship between input signals or output signals of a first circuit block and a timing relationship between input signals or output signals of a second circuit block, a content of the modification in the timing chart; and (b) automatically inserting the interface circuit generated in the step (a) between the first and second circuits.

If a semiconductor integrated circuit device is to be constructed by using a plurality of circuit blocks such as IPs having different timing characteristics, the method allows automatic insertion of an interface circuit for providing smooth transmission of data between the circuit blocks. Accordingly, the number of designing steps is reduced greatly and a designing method suitable for the construction of a large-scale semiconductor integrated circuit device, such as a system LSI, is provided.

A second method of designing a semiconductor integrated circuit device of the present invention is a method of designing a semiconductor integrated circuit device by using at least two circuit blocks stored in a database, the method comprising the steps of: (a) generating an interface circuit for implementing, in response to an operation of modifying a timing chart for providing a coincidence between a timing relationship between input signals or output signals of a first circuit block and a timing relationship between input signals or output signals of a second circuit block, a content of the modification in the timing chart; and (b) adding the interface circuit generated in the step (a) to the first or second circuit block.

If a semiconductor integrated circuit device is to be constructed by using a plurality of circuit blocks such as IPs having different timing characteristics, the method allows generation of a new circuit block by adding, to the circuit block, an interface circuit for providing smooth transmission of data between the circuit blocks. Consequently, the number of designing steps is reduced greatly, while the number of components required to design the semiconductor integrated circuit device is reduced, so that a designing method suitable for the construction of a large-scale semiconductor integrated circuit device, such as a system LSI, is provided.

The second method further comprises the step of: storing, in the database, the first or second circuit block having the interface circuit added thereto as a new circuit block. This allows the corrected circuit block to be re-used to design another semiconductor integrated circuit device.

The step (b) includes determining either of the first and second circuits as the circuit to which the interface circuit is to be added based on a preset parameter. This allows the designing of a semiconductor integrated circuit device in which the parameter to which the user attaches importance is optimized.

The step (b) includes using a layout area as a parameter. This allows design even conscious of layout.

The step (b) includes using, as a parameter, a variation in a number of pins in the first or second circuit block. This allows design conscious of the number of pins.

If at least one other circuit block in addition to the first and second circuit blocks is disposed in the integrated circuit device, the step (b) includes using, as a parameter, a number of circuit blocks to each of which the interface circuit is added. This minimizes the number of circuit blocks to be corrected.

A third method of designing a semiconductor integrated circuit device of the present invention is a method of designing a semiconductor integrated circuit device by using a database, the method comprising the steps of: (a) storing, upon receipt of an operation of modifying a waveform of a signal extracted from the database on a display screen, a waveform of the signal after the modification in storing means; (b) extracting data stored in the storing means and converting the modification in the waveform to a circuit behavior based on a difference between the waveforms before and after the modification; and (c) generating a circuit for performing the circuit behavior.

In accordance with the method, a process of transforming a signal waveform such as movement or inversion in designing a semiconductor integrated circuit device can be performed easily by using a GUI. This allows a process necessary for designing, such as the addition of an element or the correction of a circuit block, to be performed promptly.

The third method may further comprise the step of: inserting the circuit generated in the step (b) as an interface circuit between circuit blocks.

The step (c) selectively includes generating the circuit at an RT level, at a gate level, in a programming language for describing a function, the programming language having no conception of time, or in a programming language for describing a function in a cycle behavior, the programming language having a conception of time. This renders the present invention applicable to simulation performed by using a hardware simulator and a hardware-software co-design/verification tool.

A fourth method of designing a semiconductor integrated circuit device of the present invention is a method of designing a semiconductor integrated circuit device by using a database, the method comprising the steps of: (a) storing, upon receipt of an operation of modifying a waveform of a signal extracted from the database on a display screen, a waveform of the signal after the modification in storing means; (b) extracting data stored in the storing means and judging whether or not the waveform after the modification is coincident with a desired waveform; and (c) displaying, if the waveform after the modification is not coincident with the desired waveform, a statement that the desired waveform cannot be generated.

The method reduces the time required to search a portion that cannot be generated and analyze the reason that the portion cannot be generated in performing a process for obtaining the desired waveform.

A portion of the desired waveform that cannot be generated is displayed on the display screen simultaneously with or after the step (c). This allows the user to properly judge a method of generating a signal corresponding to the portion that cannot be generated and enables rapid generation of an optimum circuit.

The fourth method further comprises the steps of: (d) extracting a part of a waveform of each of a plurality of signals extracted from the database which corresponds to one cycle of a clock to generate a rising portion of the portion that cannot be generated; and (e) prior to or after the step (d), extracting a part of a waveform of each of a plurality of signals extracted from the database which corresponds to one cycle of the clock to generate a falling portion of the portion that cannot be generated. This allows easy generation of the waveform the generation of which has been once judged to be impossible.

A fifth method of designing a semiconductor integrated circuit device of the present invention is a method of designing a semiconductor integrated circuit device by using a database, the method comprising the steps of: (a) extracting a part of a waveform of each of a plurality of signals extracted from the database which corresponds to one cycle of a clock to generate a rising portion of a desired waveform or waveform portion; and (b) prior to or after the step (a), extracting a part of a waveform of each of a plurality of signals extracted from the database which corresponds to one cycle of the clock to generate a falling portion of the desired waveform or waveform portion.

The method allows the desired waveform to be generated easily by using a simple operation.

The step (b) includes a process of moving an entire waveform in an interval interposed between the rising and falling portions that have been generated. This allows more flexible generation of the waveform.

A sixth method of designing a semiconductor integrated circuit device of the present invention is a method of designing, by using a database having first and second circuit blocks designed to operate with first and second clocks with different frequencies, a semiconductor integrated circuit device in which the first and second circuit blocks are disposed in preceding and following stages, respectively, the method comprising the steps of: (a) judging whether or not the frequency of the first clock is equal to or longer than double the period of the second clock; (b) if the frequency of the first clock is equal to or longer than double the frequency of the second clock, detecting an edge of the first clock by using the second clock; (c) inserting an interface circuit for supplying, as an operation enable signal, a signal generated by detecting the edge to the second circuit block; and (d) modifying a description of the second circuit block such that the second circuit block operates in response to the operation enable signal supplied from the interface circuit.

The method smoothes transmission of data between the two circuit blocks operating with the clocks having different frequencies by a simple process. As a result, data can be passed smoothly and a restriction imposed on selection by the type of a clock for an IP core to be used is reduced so that the design is accelerated by a wider range of choices and the quality of the designed semiconductor integrated circuit device is improved.

If the period of the first clock is judged to be longer than the period of the second clock and shorter than double the period of the second clock in the step (a), the step (d) can be performed after the first clock is used as the operation enable for the second circuit block.

If the period of the first clock is judged to be shorter than the period of the second clock in the step (a), the sixth method preferably further comprises the step of: displaying a statement that the interface circuit cannot be generated.

If a third block extracted from the database and operating with the first clock is disposed in the following stage of the second circuit block, the sixth method preferably further comprises the step of: modifying a description of the second circuit block to synchronize a period of an output data signal outputted to the third circuit block with the enable signal.

A seventh method of designing a semiconductor integrated circuit device of the present invention is a method of designing, by using a database having first and second circuit blocks, a semiconductor integrated circuit device in which the first and second circuit blocks are disposed in preceding and following stages, respectively, the method comprising the steps of: (a) selecting a data signal in a timing chart for the first circuit block and detecting a data transition region; (b) receiving the data signal from the first circuit block and automatically generating a first margin nearly equal to a hold time and a second margin nearly equal to a set-up time anterior and posterior to the data transition region, respectively; and (c) inserting, between the first and second circuit blocks, an interface circuit for generating a data defining signal having, as data non-valid periods, respective periods anterior and posterior to the data transmission region to which the first and second margins have been set and having the other periods as data valid periods, wherein the data signal is transferred from the first circuit block to the second circuit block and the second circuit block fetches the data by using the data defining signal.

In designing a semiconductor integrated circuit device constructed by laying out a large number of circuit blocks in accordance with the method, the data defining signal is generated by focusing attention on the data transmission region and without using a synchronizing signal (such as clock) for the generation of the data defining signal. As a result, the data defined interval can be indicated without being affected by the relationship between the clock frequencies used by the transmitting/receiving blocks. This allows efficient use of transferred data even in a non-synchronous circuit interface. This further saves the designer the burden of designing an interface circuit including complicated timing control.

An eighth method of designing a semiconductor integrated circuit device of the present invention is a method of designing, by using a database having first and second circuit blocks, a semiconductor integrated circuit device in which the first and second circuit blocks are disposed in preceding and following stages, respectively, the method comprising the steps of: (a) generating a first delay circuit for receiving a first data signal outputted from the first circuit block and outputting a second data signal which has been delayed by a first margin nearly equal to a hold time; (b) generating a second delay circuit for receiving the second data signal and outputting a third data signal which has been delayed by a second margin nearly equal to a set-up time; and (c) inserting, between the second delay circuit and the second circuit block, a circuit for receiving the first and third data signals and generating a data defining signal which becomes invalid at a starting point of a data transition region of the first data signal and becomes valid at an ending point of a data transition region of the third data signal, wherein the second data signal is transferred to the second circuit block and the second circuit block fetches the data by using the data defining signal.

In designing a semiconductor integrated circuit device constructed by laying out a large number of circuit blocks, the method also achieves the same effects as achieved by the seventh method of designing a semiconductor integrated circuit device by generating, by focusing attention on the data transition region, a data defining signal without using a synchronizing signal for the generation of the data defining signal.

A ninth method of designing a semiconductor integrated circuit device of the present invention is a method of designing, by using a database having first and second circuit blocks, a semiconductor integrated circuit device in which the first and second circuit blocks are disposed in preceding and following stages, respectively, the method comprising the steps of: (a) extracting a timing chart for a signal having a desired waveform from the second circuit block and searching a signal having the same waveform in the first circuit block; (b) combining, if there is no signal having the desired waveform in the first circuit block, a plurality of signals in the second circuit block to generate an interface circuit for outputting a signal having the same waveform as the desired waveform; and (c) modifying a description of the second circuit block such that an output of the interface circuit is inputted as a desired signal.

In accordance with the method, even if it is difficult to obtain the desired waveform since the content of the preceding first circuit block is unknown to the following second circuit block, the desired waveform can be obtained by constructing the interface circuit by combining signals in the second circuit block.

By setting an upper limit value of a number of the plurality of combined signals, a search time is prevented from becoming indefinitely long.

The step (b) includes generating the interface circuit as a sequential circuit by adding a sequential element to at least any one of the plurality of signals. This further increases the probability of generating the desired waveform.

By setting an upper limit value of a number of stages in the sequential element, the search time is prevented from becoming indefinitely long.

The step (b) includes generating the interface circuit by extracting a signal from a node in the first circuit block and combining the signal from the node with the plurality of signals and a description of the first circuit block is modified such that a function of outputting the signal from the node is added. This further increases the probability of generating the desired waveform.

A tenth method of designing a semiconductor integrated circuit device of the present invention is a method of designing, by using a database having first, second, and third circuit blocks, a semiconductor integrated circuit device in which the first, second, and third circuit blocks are disposed successively in an upstream-to-downstream direction, the method comprising, in producing a logic synthesis script for a logic synthesis of the second circuit block, the steps of: (a)

extracting a waveform of an output signal of the first circuit block, a waveform of an input signal of the third circuit block which receives the output signal of the first circuit block, and a waveform of a clock for the second circuit block; (b) inserting, in the logic synthesis script, a description for setting a delay time for each of the output signal of the first circuit block and the input signal of the third circuit block; and (c) inserting, in the logic synthesis script, a description for setting a clock period for the second circuit block.

If the logic synthesis of a certain circuit block is to be performed, the method allows a logic synthesis script for the circuit block to be generated automatically in consideration of data on delays in the circuit block and in other circuit blocks connected anterior and posterior thereto. As a result, the number of designing steps is reduced and the quality of the designed semiconductor integrated circuit device is increased.

BRIEF DESCRIPTION OF THE DRAWINGS

FIG. 2A is a flow chart showing the procedure of generating and inserting an I/F circuit in a first specific example of the first embodiment and FIGS. 2B to 2D are views showing the contents of processes performed in individual steps in the flow;

FIG. 3A is a flow chart showing the procedure of generating and inserting an I/F circuit in a second specific example of the first embodiment and FIGS. 3B to 3D are views showing the contents of processes performed in individual steps in the flow;

FIG. 4A is a flow chart showing the procedure of generating and inserting an I/F circuit in a third specific example of the first embodiment and FIGS. 4B to 4D are views showing the contents of processes performed in individual steps in the flow;

FIG. 5A is a flow chart showing the procedure of generating and inserting an I/F circuit in a fourth specific example of the first embodiment and FIGS. 5B to 5D are views showing the contents of processes performed in individual steps in the flow;

FIG. 6A is a flow chart showing the procedure of generating and inserting an I/F circuit in a fifth specific example of the first embodiment and FIGS. 6B to 6D are views showing the contents of processes performed in individual steps in the flow;

FIG. 7A is a flow chart showing the procedure of generating and inserting an I/F circuit in a sixth specific example of the first embodiment and FIGS. 7B to 7D are views showing the contents of processes performed in individual steps in the flow;

FIG. 8A is a flow chart showing the procedure of generating and inserting an I/F circuit in a seventh specific example of the first embodiment and FIGS. 8A to 8B are views showing the contents of processes performed in individual steps in the flow;

FIG. 10A is a flow chart showing the procedure of generating and inserting an I/F circuit in the first variation of the first embodiment and FIGS. 10B and 10C are views showing the contents of processes performed in two steps in the flow;

FIG. 11A is a view illustrating a signal transmitting relation between circuit blocks used to design an integrated circuit device of a second variation of the first embodiment and FIG. 11B is a timing chart for the clocks and signals of the individual circuit blocks;

FIG. 12A is a flow chart showing the procedure of generating and inserting an I/F circuit in the second variation of the first embodiment and FIGS. 12B and 12C are views showing the contents of processes performed in two steps in the flow;

FIG. 17A is a view showing a circuit to be modified in a third specific example of the second embodiment, FIG. 17B is a view showing the waveforms of individual signals prior to modification, FIG. 17C is a view showing the waveforms of the individual signals in a waveform modifying window, and FIG. 17D is a view showing the waveforms of the individual signals after modification;

FIG. 18A is a view showing a circuit to be modified in a fourth specific example of the second embodiment, FIG. 18B is a view showing the waveforms of individual signals prior to modification, FIG. 18C is a view showing the waveforms of the individual signals in a waveform modifying window, FIG. 18D is a view showing the waveforms of the individual signals after modification, FIG. 18E illustrates an exemplary RTL description of the generated circuit, and FIG. 18F is a circuit diagram thereof;

FIG. 25A is a diagram of a circuit to be designed in the first specific example of the fifth embodiment, FIG. 25B is a timing chart showing the procedure of modifying the circuit, FIG. 25C is a view showing a HDL description of a rising edge detecting circuit C, and FIG. 25D is a view showing HDL descriptions of a circuit B before and after the modification;

FIG. 26A is a diagram of a circuit to be designed in a second specific example of the fifth embodiment, FIG. 26B is a timing chart showing the procedure of modifying the circuit, FIG. 26C is a view showing a HDL description of a rising edge detecting circuit C, and FIG. 26D is a view showing HDL descriptions of a circuit B before and after the modification;

FIG. 27A is a diagram of a circuit to be designed in a third specific example of the fifth embodiment, FIG. 27B is a waveform chart of a data output signal and a data defining signal, and FIG. 27C is a view illustrating a method of setting first and second margins;

FIGS. 31A to 31E are views showing respective examples of a circuit for a combination of two inputs including a signal (1), a circuit for a combination of two inputs including a signal (2), a circuit for a combination of three inputs including the signals (1), (2), a circuit for a combination of three inputs including the signal (1) and a signal (3), and a circuit for a combination of two inputs including a signal (n–1);

FIGS. 36A to 36E are views showing the procedure of automatically generating a logic synthesis script in the seventh embodiment;

FIGS. 37A and 37B are views partly showing a logic synthesis script including descriptions of the settings of a delay value and a clock period in the seventh embodiment;

FIG. 39 is a table showing the relationship between operation and circuit behavior using a C language in a variation of the second specific example of the second embodiment.

DETAILED DESCRIPTION OF THE INVENTION

Embodiment 1

In the present embodiment, a description will be given to a method of generating, between two circuit blocks operating with a common clock system, an interface circuit for promoting smooth data transmission therebetween.

Figure 1B:
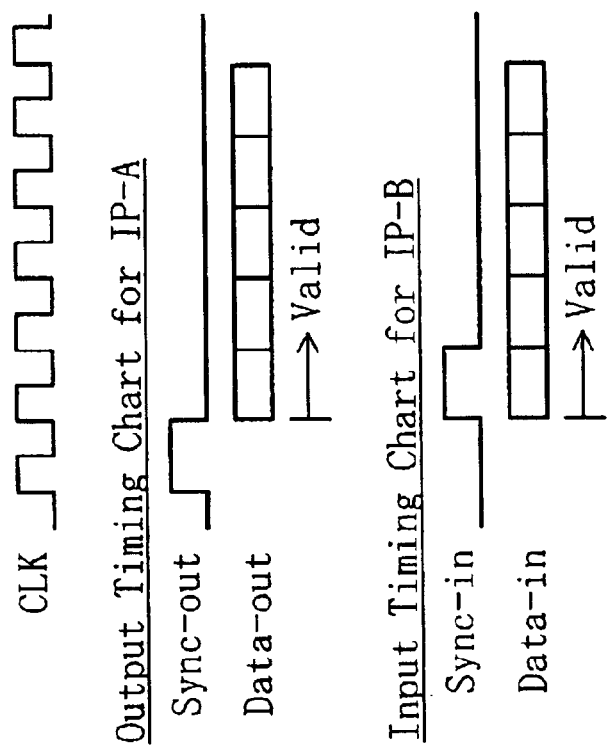
FIG. 1A is a view illustrating a signal transmitting relation between circuit blocks used to design an integrated circuit device of a first embodiment and FIG. 1B is a timing chart for the clocks and output values of the individual circuit blocks.
Figure 1A:
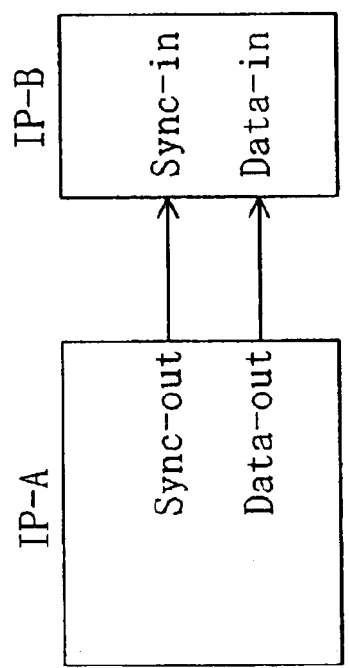

FIG. 1A is a view showing a signal transmitting relation between two existing circuit blocks as resources used to design an integrated circuit device of the present embodiment and FIG. 1B is a timing chart for the clocks and output values of the individual circuit blocks.

As shown in FIG. 1A, the preceding circuit block IP-A is designed to output a synchronizing signal Sync-out and a data signal Data-out and the following circuit block IP-B is designed to receive a synchronizing signal Sync-in and a data signal Data-in to operate. As shown in FIG. 1B, the circuit blocks IP-A and the circuit block IP-B belong to a common clock system. In the preceding circuit block IP-A, however, the output data signal Data-out is not valid when the output synchronizing signal Sync-out is HIGH and a period during which the output data signal is valid begins on the falling edge of the output synchronizing signal Sync-out. In the following circuit block IP-B, on the other hand, the input data signal Data-in is valid when the input synchronizing signal Sync-in is HIGH.

When the existing circuit blocks IP-A, IP-B are thus constructed, even if the synchronizing signal Sync-out and the data signal Data-out are inputted to the following circuit block IP-B while the timing relationship therebetween is maintained, the following circuit block IP-B cannot fetch the input data signal Data-in so that normal operation is not performed.

In the present embodiment, therefore, an interface circuit as shown in each of specific examples, which will be described later, is inserted between the circuit blocks IP-A, IP-B having the output or input characteristics shown in FIGS. 1A and 1B such that input/output operations between the circuit blocks IP-A, IP-B are performed smoothly. In the present embodiment, the detection and adjustment of a signal waveform is performed by using a graphical designer interface (GUI) and a file. The signal waveform may be data (required timing) attached to the circuit blocks IP-A, IP-B or may be an output which can be extracted by simulating the circuit blocks IP-A, IP-B by using a circuit simulation.

SPECIFIC EXAMPLE 1

FIG. 2A is a flow chart showing the procedure of generating and inserting an interface circuit (hereinafter referred to as "I/F circuit") in the first specific example. FIGS. 2B to 2D are views showing the contents of processes performed in individual steps in the flow.

First, in Step ST11, the signal waveform in the preceding circuit block IP-A is modified such that the output synchronizing signal Sync-out of the preceding circuit block IP-A shown in the middle portion of FIG. 2B is delayed by one cycle (one period of a clock) to become the corrected output synchronizing signal Sync-out' shown in the lower portion of FIG. 2B.

Next, in Step ST12, an I/F circuit IP-C is generated based on the modification of the output synchronizing signal. In this step, the I/F circuit IP-C (flip-flop FF) for receiving the output synchronizing signal Sync-out and outputting the input synchronizing signal Sync-in having the same waveform as the corrected output synchronizing signal Sync-out' is generated at an RT level (hardware language) and at a Gate (netlist) level, as shown in FIG. 2C.

Next, in Step ST13, the I/F circuit IP-C is inserted automatically between the preceding circuit block IP-A and the following circuit block IP-B. Specifically, in an integrated circuit device to be designed, the I/F circuit IP-C is inserted automatically between the circuit blocks IP-A and IP-B and the output synchronizing signal Sync-out is delayed by one cycle by the I/F circuit IP-C to be inputted as the input synchronizing signal Sync-in to the following circuit block IP-B, as shown in FIG. 2D. As the input data signal Data-in to the following circuit block IP-B, the output data signal Data-out from the preceding circuit block IP-A is inputted as it is.

As a result, in the following circuit block IP-B, the output synchronizing signal Sync-out that has been delayed by one cycle is replaced with the input synchronizing signal Sync-in shown in FIG. 1B. This allows the input data signal Data-in to be fetched and ensures proper operation in the following circuit block IP-B. Since the modification of the timing chart does not require so high skills and the I/F circuit is inserted automatically, the number of designing steps can be reduced in designing a large-scale integrated circuit device.

SPECIFIC EXAMPLE 2

FIG. 3A is a flow chart showing the procedure of generating and inserting an I/F circuit in the second specific example. FIGS. 3B to 3D are views showing the contents of processes performed in individual steps in the flow.

First, in Step ST21, the signal waveform in the preceding circuit block IP-A is modified such that the output synchronizing signal Sync-out of the preceding circuit block IP-A shown in the middle portion of FIG. 3B is delayed by one cycle to become the corrected output synchronizing signal Sync-out' shown in the lower portion of FIG. 3B.

Next, in Step ST22, an I/F circuit is generated based on the modification of the output synchronizing signal. In this step, the I/F circuit IP-C (flip-flop FF) for receiving the output synchronizing signal Sync-out and outputting a new output synchronizing signal Sync-out-new having the same waveform as the corrected output synchronizing signal Sync-out' is generated at an RT level (hardware language) and at a Gate (netlist) level, as shown in FIG. 3C.

Next, in Step ST23, the I/F circuit IP-C is inserted automatically in the preceding circuit block IP-A. Specifically, as shown in FIG. 3D, the I/F circuit IP-C is inserted automatically in the circuit block IP-A and the new output synchronizing signal Sync-out-new, which is the output synchronizing signal Sync-out delayed by one cycle by the I/F circuit, is generated in a new circuit block IP-A'. Then, the new output synchronizing signal Sync-out-new is inputted as the input signal Sync-in to the following circuit block IP-B.

As a result, in the following circuit block IP-B, the new output synchronizing signal Sync-out-new having the same waveform as the corrected output synchronizing signal Sync-out' shown in the lower portion of FIG. 3B is replaced with the input synchronizing signal Sync-in shown in FIG. 1B. This allows the input data signal Data-in to be fetched and ensures proper operation in the following circuit block IP-B. Since the generation of the I/F circuit does not require so high skills and the I/F circuit is inserted automatically, the number of designing steps can be reduced in designing a large-scale integrated circuit device. Compared with the first specific example, the I/F circuit is incorporated in the circuit block IP-A' so that a smaller number of circuits are sufficient. By further storing the new circuit block IP-A' having the I/F circuit added thereto in a database, a property (resource) which can be reused as an IP (circuit block) is obtained.

SPECIFIC EXAMPLE 3

FIG. 4A is a flow chart showing the procedure of generating and inserting an I/F circuit in the third specific example. FIGS. 4B to 4D are views showing the contents of processes performed in individual steps in the flow.

First, in Step ST31, the signal waveform in the preceding circuit block IP-A is modified such that the output synchronizing signal Sync-out of the preceding circuit block IP-A shown in the middle portion of FIG. 4B is delayed by one cycle to become the corrected output synchronizing signal Sync-out' shown in the lower portion of FIG. 4B.

Next, in Step ST32, an I/F circuit is generated based on the modification of the output synchronizing signal Sync-out. In Step ST32, the I/F circuit IP-C (flip-flop FF) for delaying a new input synchronizing signal Sync-in-new having the same waveform as the corrected output signal Sync-out' and outputting the delayed new input synchronizing signal as the input synchronizing signal Sync-in is generated at an RT level (hardware language) and at a Gate (netlist) level, as shown in FIG. 4C.

Next, in Step ST33, the I/F circuit is inserted automatically in the following circuit block IP-B having a smaller circuit area. Specifically, in the integrated circuit device to be designed, the I/F circuit IP-C is inserted automatically in the circuit block IP-B and the output synchronizing signal Sync-out from the circuit block IP-A is inputted as the new input synchronizing signal Sync-in-new into a new following circuit block IP-B' and then delayed by one period of a clock by the I/F circuit, as shown in FIG. 4D. The new input synchronizing signal Sync-in-new that has been delayed becomes the input signal Sync-in.

As a result, the following circuit block IP-B operates with the corrected input synchronizing signal Sync-in having the same waveform as the corrected output synchronizing signal Sync-out' shown in the lower portion of FIG. 4B. This allows the data input signal Data-in to be fetched by the following circuit block IP-B and ensures proper operation in the following circuit block IP-B. Since the generation of the I/F circuit does not require so high skills and the I/F circuit is inserted automatically, the number of designing steps can be reduced in designing a large-scale integrated circuit device. Compared with the first specific example, the I/F circuit is incorporated in the circuit block IP-B' so that a smaller number of circuits are sufficient. By further storing the new circuit block IP-B' having the I/F circuit added thereto in a database, a property (resource) which can be reused as an IP (circuit block) is obtained.

SPECIFIC EXAMPLE 4

FIG. 5A is a flow chart showing the procedure of generating and inserting an I/F circuit in the fourth specific example. FIGS. 5B to 5D are views showing the contents of processes performed in individual steps in the flow.

First, in Step ST41, the signal waveform in the following circuit block IP-B is modified such that the input synchronizing signal Sync-in of the following circuit block IP-B shown in the middle portion of FIG. 5B is advanced by one cycle to become the corrected input synchronizing signal Sync-in' shown in the lower portion of FIG. 5B.

Next, in Step ST42, an I/F circuit IP-C is generated based on the modification of the input synchronizing signal. In Step ST42, the I/F circuit IP-C (flip-flop FF) for receiving the output synchronizing signal Sync-out having the same waveform as the corrected input synchronizing signal Sync-in' and outputting a desired input synchronizing signal Sync-in is generated at an RT level (hardware language) and at a Gate (netlist) level, as shown in FIG. 5C.

Next, in Step ST43, the I/F circuit IP-C is inserted automatically between the preceding circuit block IP-A and the following circuit block IP-B. Specifically, in the integrated circuit device to be designed, the I/F circuit is inserted automatically in the circuit block IP-B and the output synchronizing signal Sync-out from the circuit block IP-B is delayed by one cycle in the following circuit block IP-B, as shown in FIG. 5D. The delayed output synchronizing signal Sync-out becomes the input signal Sync-in.

As a result, the output synchronizing signal Sync-out that has been delayed by one period of a clock is replaced with the input synchronizing signal Sync-in shown in FIG. 1B in the following circuit block IP-B, so that the input data signal Data-in is activated during the period t2–t3 shown in FIG. 1C. Accordingly, the same effects as achieved in the first specific example described above are achievable.

SPECIFIC EXAMPLE 5

FIG. 6A is a flow chart showing the procedure of generating and inserting an I/F circuit in the fifth specific example. FIGS. 6B to 6D are views showing the contents of processes performed in individual steps in the flow.

First, in Step ST51, the signal waveform in the following circuit block IP-B is modified such that the input synchronizing signal Sync-in of the following circuit block IP-B shown in the middle portion of FIG. 6B is advanced by one cycle to become the corrected input synchronizing signal Sync-in' shown in the lower portion of FIG. 6B.

Next, in Step ST52, an I/F circuit IP-C is generated based on the modification of the input synchronizing signal. In Step ST52, the I/F circuit IP-C (flip-flop FF) for receiving the output synchronizing signal Sync-out having the same waveform as the corrected input synchronizing signal Sync-in' and outputting a new output synchronizing signal Syn-out-new having the same waveform as a desired input synchronizing signal Sync-in is generated at an RT level (hardware language) and at a Gate (netlist) level, as shown in FIG. 6C.

Next, in Step ST53, the I/F circuit IP-C is inserted automatically in the preceding circuit block IP-A. Specifically, as shown in FIG. 6D, the I/F circuit is inserted automatically in the circuit block IP-A and the new output synchronizing signal Sync-out-new, which is the output synchronizing signal Sync-out been delayed by one cycle by the I/F circuit, is generated in a new circuit block IP-A'. Then, the new output synchronizing signal Sync-out-new is inputted as the input signal Sync-in to the following circuit block IP-B.

As a result, the new output synchronizing signal Sync-out-new having the same waveform as a signal obtained by delaying by one cycle the corrected input synchronizing signal Sync-in' shown in the lower portion of FIG. 6B is replaced with the input synchronizing signal Sync-in shown in FIG. 1B in the following circuit block IP-B, so that the input data signal Data-in is activated during the period t2–t3 shown in FIG. 1C. Accordingly, the same effects as achieved in the second specific example described above are achievable.

SPECIFIC EXAMPLE 6

FIG. 7A is a flow chart showing the procedure of generating and inserting an I/F circuit in the sixth specific example. FIGS. 7B to 7D are views showing the contents of processes performed in individual steps in the flow.

First, in Step ST61, the signal waveform in the following circuit block IP-B is modified such that the input synchronizing signal Sync-in of the following circuit block IP-B shown in the middle portion of FIG. 7B is advanced by one cycle to become the corrected input synchronizing signal Sync-in' shown in the lower portion of FIG. 7B.

Next, in Step ST62, an I/F circuit IP-C is generated based on the modification of the input synchronizing signal. In Step ST62, the I/F circuit IP-C (flip-flop FF) for receiving a new input synchronizing signal Sync-in-new having the same waveform as the corrected input synchronizing signal Sync-in and outputting a desired input synchronizing signal Syn-in is generated at an RT level (hardware language) and on a Gate (netlist) level, as shown in FIG. 7C.

Next, in Step ST63, the I/F circuit IP-C is inserted automatically in the following circuit block IP-B having a smaller circuit area. Specifically, in the integrated circuit device to be designed, the I/F circuit is inserted automatically in the circuit block IP-B and the output synchronizing signal Sync-out from the circuit block IP-A is inputted as the new input synchronizing signal Sync-in-new into the following circuit block IP-B and then delayed by one cycle by the I/F circuit, as shown in FIG. 6D. The new input synchronizing signal Sync-in-new that has been delayed becomes the input signal Sync-in.

By thus generating the flip-flop FF and automatically inserting the flip-flop FF as the I/F circuit in the preceding circuit block IP-A, the following circuit block IP-B operates with the input synchronizing signal Sync-in having the same waveform as a signal obtained by delaying by one cycle the corrected input synchronizing signal Sinc-in' shown in the lower portion of FIG. 7B. Accordingly, the same effects as achieved in the third specific example are achievable.

SPECIFIC EXAMPLE 7

FIG. 8A is a flow chart showing the procedure of generating and inserting an I/F circuit in the seventh specific example. FIG. 8B is a view showing the content of a process performed in Step ST71 in the flow.

First, in Step ST71, an area parameter is set to "small" and the signal waveform in the preceding circuit block IP-A is modified such that the output synchronizing signal Sync-out of the preceding circuit block IP-A shown in the middle portion of FIG. 8B is delayed by one cycle to become the corrected output synchronizing signal Sync-out' shown in the lower portion of FIG. 8B.

Next, in Step ST72, an I/F circuit is generated based on the modification of the output synchronizing signal Sync-out. In Step ST72, an I/F circuit IP-C (flip-flop FF) as shown in, e.g., FIG. 4C of the fourth specific example described above is generated at an RT level (hardware language) and at a Gate (netlist) level.

Next, in Step ST73, it is judged whether or not the area of the preceding circuit block IP-A is smaller than the area of the following circuit block IP-B. If the area of the following circuit block IP-B is smaller (if the answer is "NO"), the whole process advances to Step ST74 where the I/F circuit is inserted automatically in the following circuit block IP-B. As a result, a circuit as shown in, e.g., FIG. 4D is designed. If the area of the preceding circuit block IP-A is smaller (if the answer is "YES"), on the other hand, the whole process advances to Step ST75 where the I/F circuit is inserted automatically in the preceding circuit block IP-A. As a result, a circuit as shown in, e.g., FIG. 3D is designed.

Thus, in the present specific example, the area parameter is preset as a parameter to be considered so that a circuit for signal adjustment is inserted automatically in the circuit block which is more advantageous in terms of area. Accordingly, the same effects as achieved in the second or third specific example are achievable.

Variation 1 of Embodiment 1

In EMBODIMENT 1, the description has been given to an exemplary case where two circuit blocks operating with a common clock system are present. In the present variation, a description will be given to an example for selecting among a plurality of circuit blocks which are connected in parallel to one circuit block without changing the number of pins.

Figure 9B:
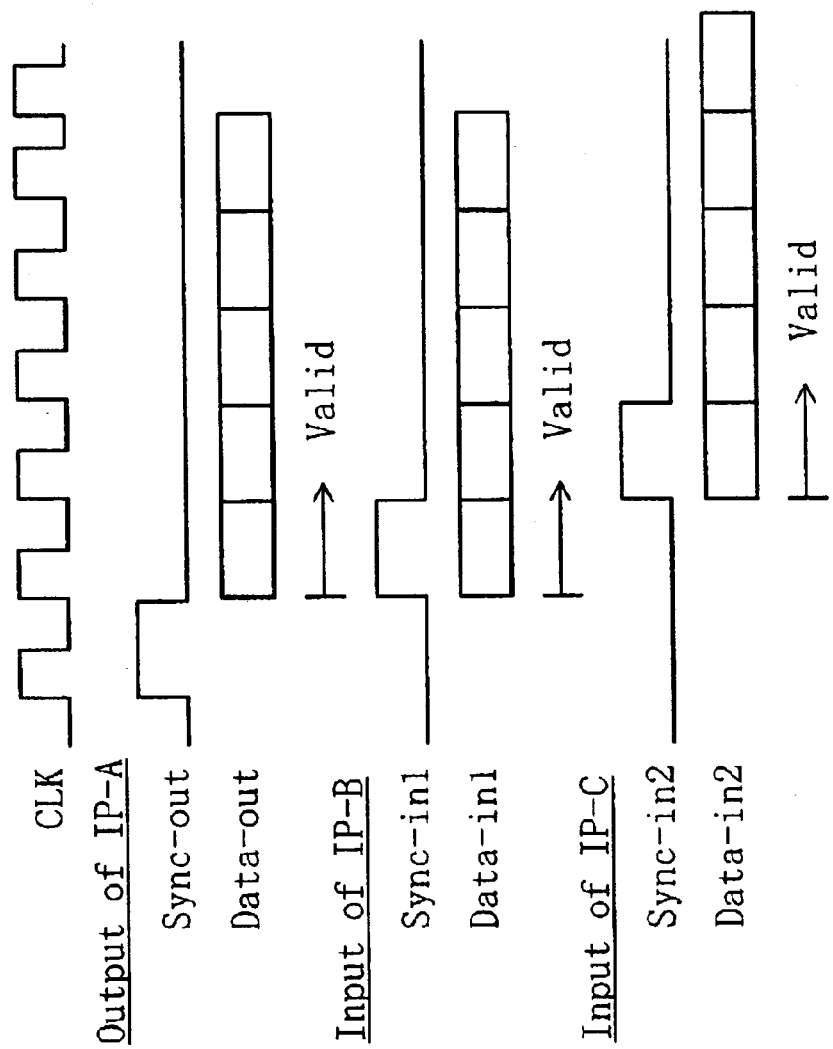
FIG. 9A is a view illustrating signal transmitting relations among circuit blocks used to design an integrated circuit device of a first variation of the first embodiment and FIG. 9B is a timing chart for the clocks and signals of the individual circuit blocks.
Figure 9A:
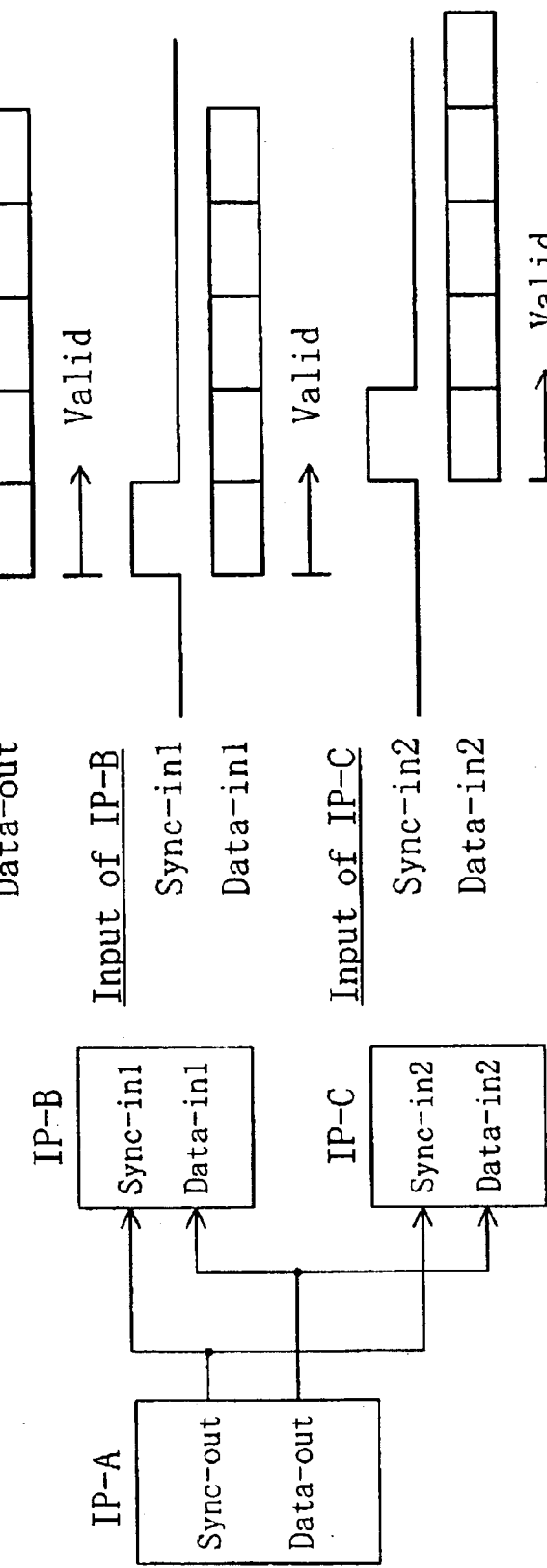

FIG. 9A is a view showing signal transmitting relations among three existing circuit blocks which are resources to be used to design an integrated circuit device of the present variation and FIG. 9B is a timing chart for the clocks and signals of the individual circuit blocks.

As shown in FIG. 9A, the preceding circuit block IP-A is designed to output a synchronizing signal Sync-out and a data signal Data-out and the following two circuit blocks are constructed to receive respective synchronizing signals Sync-in1, Sync-in2 and respective data signals Data-in1, Data-in2 to operate. As shown in FIG. 9B, the circuit blocks IP-A, IP-B, and IP-C operate with a common clock. However, the timings with which input synchronizing signals Sync-in1, Sync-in2 of the following circuit blocks IP-B, IP-C become HIGH are delayed by one cycle and by two cycles from the timing with which the output synchronizing signal Sync-out of the preceding circuit block IP-A becomes HIGH, respectively. On the other hand, the output data signal Data-out of the preceding circuit block IP-A and the input data signal Data-in1 of the following circuit block IP-B become valid with the same timing, while the input data signal Data-in2 of the following circuit block IP-C becomes valid one cycle after the output data Data-out of the preceding circuit block IP-A becomes valid.

In the case where the existing circuit blocks IP-A, IP-B, and IP-C are thus constructed also, the input data signals Data-in1, Data-in2 cannot be fetched by the following circuit blocks IP-B, IP-C, similarly to the first embodiment.

In the present first variation, therefore, a flip-flop FF is generated and inserted in either of the circuit blocks, similarly to the first embodiment. Here, the place in which the flip-flop (I/F circuit) is inserted is determined by using the number of pins as a parameter.

FIG. 10A is a flow chart showing the procedure of generating and inserting an I/F circuit in the present variation. FIGS. 10B and 10C are views showing the contents of processes performed in Steps ST84 and ST85 in the flow.

First, in Step ST81, a number-of-pins parameter for determining whether or not importance should be attached to the changing of the number of pins is set and the waveforms of the synchronizing signals Sync-in1, Sync-in2 and data signals Data-in1, Data-in2 of the following circuit blocks IP-B, IP-C are modified to correspond to those of the synchronizing signal Sync-out and data signal Data-out of the circuit block IP-A, respectively. In other words, the signal waveforms are modified such that the input synchronizing signal Sync-in1 of the following circuit block IP-B is advanced by one cycle, the input synchronizing signal Sync-in2 of the following circuit block IP-C is advanced by two cycles, and the input data signal Data-in2 of the following circuit block IP-C is advanced by one cycle.

Next, in Step ST82, I/F circuit (flip-flop FF) is generated at an RT level (hardware language) and at a Gate level (netlist) based on the modification of the signal waveforms, similarly to the individual specific examples of the first embodiment. In short, the flip-flop FF is generated such that a signal necessary for the operation in the following circuit is obtainable from the signal having the modified waveform.

Next, in Step ST83, it is judged whether or not the number of pins in the preceding circuit block IP-A may be changed and, if minimum changes in the number of pins in the circuit block IP-A are desired (if the answer is NO), the whole process advances to Step ST84 where the I/F circuit (flip-flop FF) is inserted automatically in the following circuit blocks IP-B, IP-C. Specifically, one flip-flop FF is inserted in the input side of the following circuit block IP-B such that the output synchronizing signal Sync-out of the preceding circuit block IP-A is delayed by one cycle to become the input synchronizing signal Sync-in1, as shown in FIG. 10B. On the other hand, two flip-flops FF for delaying by two cycles the output synchronizing signal Sync-out of the circuit block IP-A and one flip-flop FF for delaying by one cycle the output data signal Data-out are inserted in the following circuit block IP-C.

If it is judged in Step ST83 that the number if pins in the circuit block IP-A may be changed, i.e., if it is selected that importance is not attached to the changing of the number of pins, the whole process advances to Step ST85 where the I/F circuit (flip-flop FF) is inserted automatically in the preceding circuit block IP-A. Specifically, the three flip-flops FF are inserted in the preceding circuit block IP-A, as shown in FIG. 10C, such that the input synchronizing signal Sync-in1 which is the output synchronizing signal Sync-out delayed by one cycle, the input synchronizing signal Sync-in2 which is the output synchronizing signal Sync-out delayed by two cycles, and the input data signal Data-in2 which is the output data signal Data-out delayed by one cycle are generated and transmitted to the following circuit blocks IP-B, IP-C. In this case, the number of output pins of the circuit block IP-A is larger by 2 than that of the circuit shown in FIG. 10B but the total number of flip-flops FF in the circuit block IP-A is smaller by 1 than the total number of flip-flops FF in the circuit shown in FIG. 10B.

In the present variation, if the designer adds the function of setting the number-of-pins parameter, the I/F circuits can be inserted automatically to such an extent that the number of pins is not increased if the designer does not desire an increase in the number of pins.

Variation 2 of Embodiment 1

In the present variation, a description will be given to an exemplary case where a plurality of circuit blocks are connected in parallel to one circuit block.

FIG. 11A is a view showing signal transmitting relations among three existing circuit blocks as resources to be used to design an integrated circuit device of the present variation and FIG. 11B is a timing chart for the clocks and signals of the individual circuit blocks.

As shown in FIG. 10A, the preceding circuit block IP-A is designed to output a synchronizing signal Sync-out and a data signal Data-out and the following two circuit blocks are constructed to receive respective synchronizing signals Sync-in1, Sync-in2 and respective data signals Data-in1, Data-in2 to operate. As shown in FIG. 10B, the circuit blocks IP-A, IP-B, and IP-C operate with a common clock. However, the timings with which the input synchronizing signals Sync-in1, Sync-in2 of the following circuit blocks IP-B, IP-C become HIGH are delayed by one cycle and by two cycles from the timing with which the output synchronizing signal Sync-out of the preceding circuit block IP-A becomes HIGH, respectively. On the other hand, the output data signal Data-out from the preceding circuit block IP-A and the input data signals Data-in1, Data-in2 of the following circuit blocks IP-B, IP-C become valid with the same timing.

In the case where the existing circuit blocks IP-A, IP-B, and IP-C are thus constructed also, the input data signals Data-in1, Data-in2 cannot be fetched by the following circuit blocks IP-B, IP-C, similarly to the first embodiment.

In the present second variation 2, therefore, a flip-flop FF is generated and inserted in either of the circuit blocks, similarly to the first embodiment. Here, the place in which the flip-flop (I/F circuit) is inserted is determined by using, as a parameter, the number of circuit blocks having configurations to be modified (number of modifications).

FIG. 12A is a flow chart showing the procedure of generating and inserting an I/F circuit in the present variation. FIGS. 12B and 12C are views showing the contents of processes performed in Steps ST94 and ST95 in the flow.

First, in Step ST91, a number-of-blocks parameter for determining whether or not the number of blocks having configurations to be modified (number of modifications) is limited to 1 and the waveforms of the synchronizing signals Sync-in1, Sync-in2 and data signals Data-in1, Data-in2 of the following circuit blocks IP-B, IP-C are modified to correspond to those of the synchronizing signal Sync-out and data signal Data-out of the circuit block IP-A, respectively. In other words, the signal waveforms are modified such that the input synchronizing signals Sync-in1, Sync-in2 of the following circuit blocks IP-B, IP-C are advanced by one cycle.

Next, in Step ST92, I/F circuit (flip-flop FF) is generated at an RT level (hardware language) and at a Gate level (netlist) in response to the modification of the signal waveforms, similarly to the individual specific examples of the first embodiment. In short, the flip-flop FF is generated such that a signal necessary for the operations in the following circuit is obtainable from the signal having the modified waveform.

Next, in Step ST93, it is judged whether or not the number of circuits having configurations to be modified is limited to 1 and, if the number of circuit blocks having configurations to be modified need not be limited to 1 (if the answer is NO), the whole process advances to Step ST94 where one I/F circuit (flip-flop FF) is inserted automatically in each of the following circuit blocks IP-B, IP-C, as shown in FIG. 12B.

If it is selected in the judgment of Step ST93 that the number of circuit blocks having configurations to be modified is to be limited to 1, the whole process advances to Step ST95 where one I/F circuit (flip-flop FF) is inserted automatically in the preceding circuit block IP-A, as shown in FIG. 12C. In this case, the number of blocks to be modified is only 1 and the number of necessary flip-flops FF is reduced advantageously by one, compared with the circuit shown in FIG. 12B.

If a plurality of circuit blocks are connected in parallel to one circuit block, the present variation allows design such that, judging from the input/output relations thereamong, the number of modifications is minimized.

When a plurality of circuit blocks connected in parallel to one circuit block have the same signal waveform, as shown in FIG. 12B, a reduced number of I/F circuits are inserted advantageously in one circuit block, so that the setting of such a number-of-modifications parameter achieves a significant effect. In the case where it is desired to limit the circuit blocks to be modified to a reduced number, even if the total number of I/F circuits when the I/F circuits are inserted in only one circuit block is equal to the total number of I/F circuits when the I/F circuits are inserted a plurality of circuit blocks on a one-by-one basis, an effect is achievable by changing the configuration of only one circuit block.

Although the present variation has described an exemplary case where the plurality of following circuit blocks are disposed in parallel, the present variation is also applicable to the case where a plurality of circuit blocks are connected in parallel to one circuit block. In that case, an I/F circuit (flip-flop FF) is inserted properly in the following circuit block such that the number of modifications is minimized. In the case where numerous circuit blocks are connected in series, the judgment can be made such that the number of circuit blocks to be corrected is minimized.

Although the flip-flop (delay circuit) has been provided as the I/F circuit in each of the first embodiment and the variations thereof, the present invention is not limited thereto. Another element such as an inverter may also be inserted as the I/F circuit.

Embodiment 2

In the present embodiment, a description will be given to a method of generating an interface circuit by manually modifying a waveform by using a GUI (graphic user interface).

SPECIFIC EXAMPLE 1

Figures 13A, 13B:
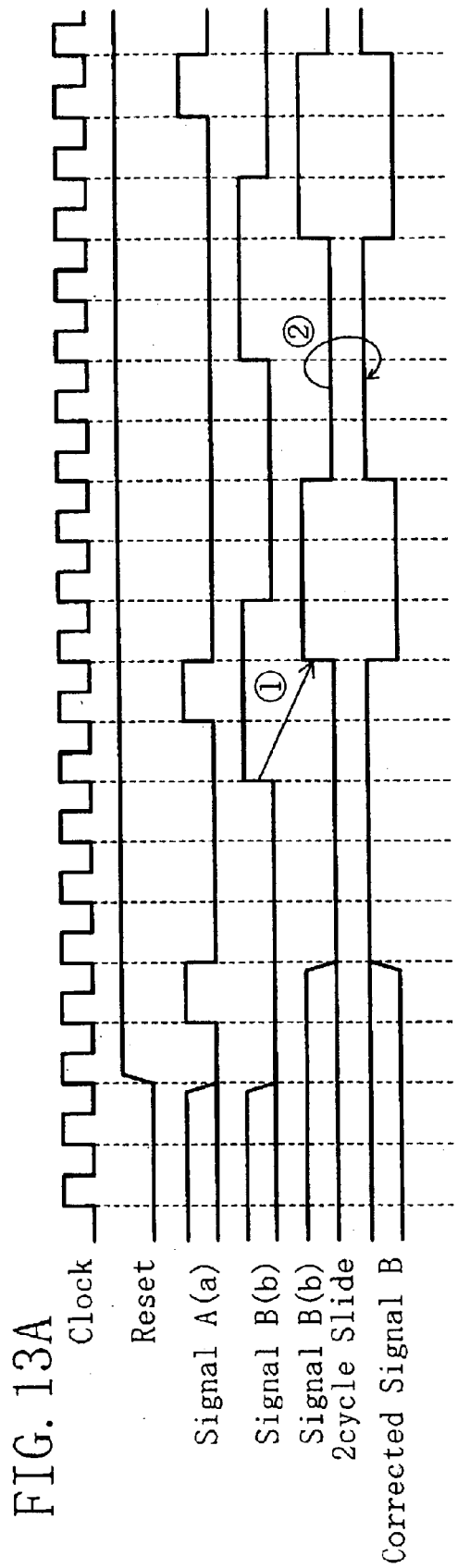
FIG. 13A is a timing chart illustrating a method of modifying a signal waveform in a first specific example of a second embodiment and FIG. 13B is a table showing the relationship between operation and circuit behavior.
Figure 14:
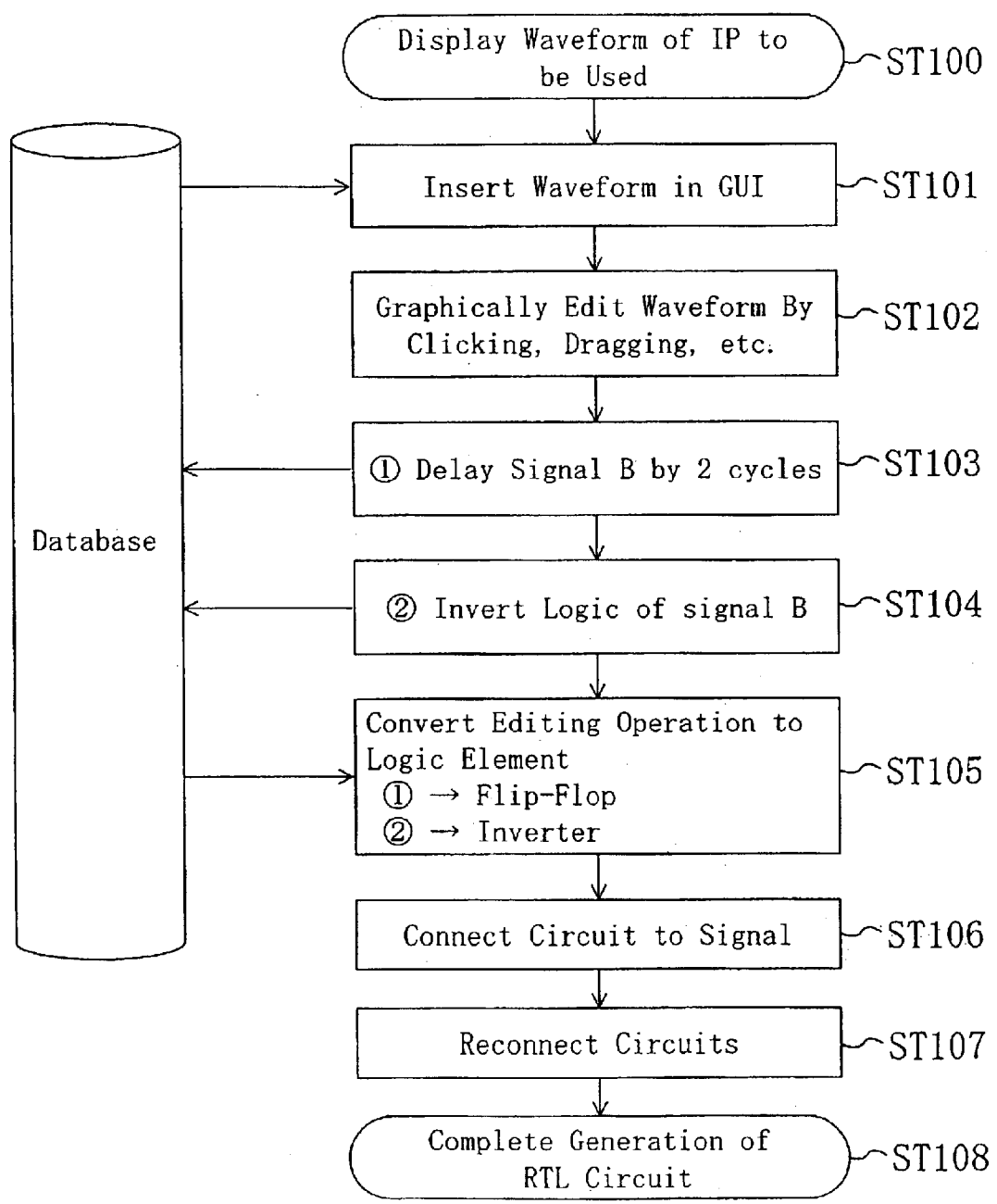
FIG. 14 is a flow chart illustrating a method of modifying a signal waveform in the first specific example of the second embodiment.

FIG. 13A is a timing chart illustrating a method of modifying a signal waveform in a first specific example of the second embodiment and FIG. 13B is a table showing the relationship between operation and circuit behavior. FIG. 14 is a flow chart illustrating a method of modifying a signal waveform in the present specific example. Referring to FIGS. 13A, 13B, the procedure of modifying the signal waveform will be described in accordance with the flow shown in FIG. 14.

First, in Step ST100, the signal waveform of an IP to be used is set to be displayed on the GUI. When the signal waveform is then imported from a database into the GUI in Step ST101, the waveforms of the clock, reset, signal A, and signal B shown in FIG. 13A are displayed and the signal waveforms can be edited graphically in Step ST102.

Next, in Step ST103, the signal B is delayed by two cycles (process ①). Specifically, the process ① is performed in such a manner that the designer drags the signal B shown in FIG. 13A by using a mouse, as in the operation shown on the upper level of FIG. 13B, and then slides it rearwardly. The process ① is stored as the circuit behavior "delay" in the database.

Next, in Step ST104, the logic of the signal B is inverted (process ②). Specifically, the process ② is performed by double-clicking the waveform of the signal B, as in the operation show non the lower level of FIG. 13B. By the process ②, the waveform of the signal B becomes the waveform of a corrected signal shown on the lowermost level of FIG. 13A. The process ② is stored as the circuit behavior "logic inversion of whole signal" in the database.

Next, in Step ST105, the circuit behaviors of the processes ①, ② are extracted from the database and converted to functional element descriptions. As a result, the "delay" operation of the process ① is converted to a flip-flop and the "logic inversion" operation of the process ② is converted to an inverter. The modifying operations described here are exemplary of the modifying operations of the present invention so that the modifying operations of the present invention are not limited to the ones described herein.

Next, in Step ST106, the flip-flop and the inverter are disposed in series at appropriate portions in a path along which the signal B flows. Then, in Step ST107, the circuits are reconnected and the generation of the RTL circuit is completed in Step ST108.

If such a method of modifying a signal waveform is used to correct, e.g., each of the circuit blocks in the first embodiment, the insertion of, e.g., the flip-flop can be performed easily in an extremely short period of time.

The present specific example allows I/F circuits for absorbing the difference between the signal waveforms in the circuit blocks to be generated and automatically inserted in some of the circuit blocks or between the circuit blocks with great ease.

As a method of generating a circuit by using a signal waveform, there has conventionally been known one in which the signal waveform is temporarily converted to a truth table or to a state transition. However, since the conversion process in accordance with the method includes a plurality of steps, the converting means is complicated. There is also another method in which a functional element description is specified on a signal waveform. However, the method requires the designer to perform an excessively large number of steps. Moreover, the extra procedure of conversion and generation is required even if a circuit with a simple structure is to be generated. If the conventional methods are used to design a large-scale integrated circuit device such as a system LSI, therefore, designing efficiency may be lowered significantly.

In the present specific example, by contrast, the operation of modifying the signal waveform is performed by the designer so that the waveform is modified easily. By storing a modification in waveform in association with the circuit behavior to be added to modified, a circuit element corresponding to the waveform modifying operation is generated automatically afterwards by using the stored circuit behavior. Accordingly, the process of circuit generation for adding the element is simplified and the process of circuit generation at a designing stage can be performed promptly. The process of modifying the waveform by using the GUI is also simplified.

Moreover, since the insertion of the interface circuit and the modification of an existing integrated circuit can be performed by modifying the waveform with the use of the GUI which is readily used by the circuit designer, the designing of a large-scale integrated circuit device such as a system LSI proceeds efficiently.

SPECIFIC EXAMPLE 2

Figure 15:
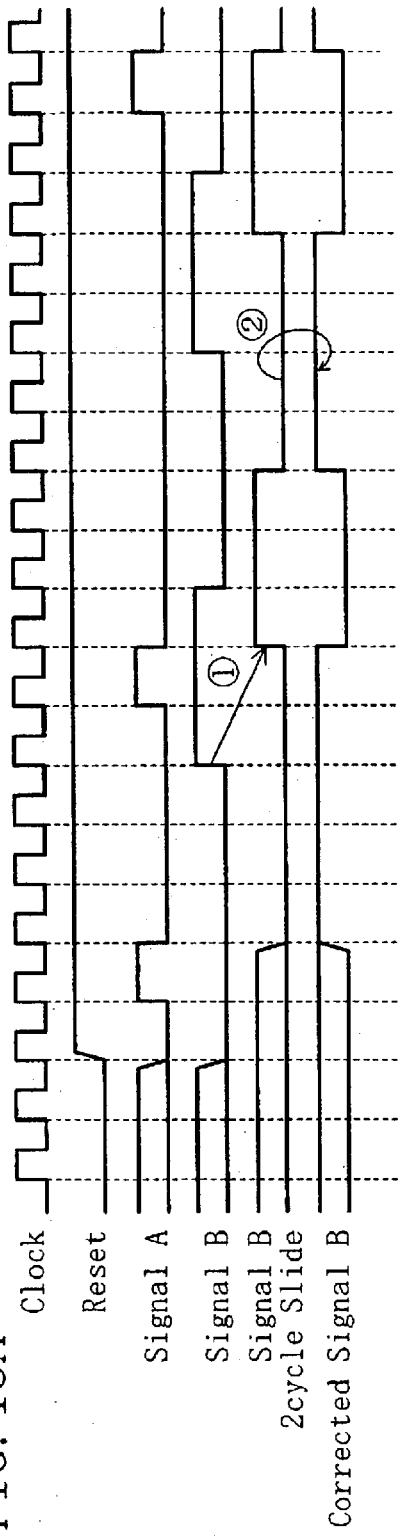
FIG. 15A is a timing chart illustrating a method of modifying a signal waveform in a second specific example of the second embodiment.
FIG. 15B is a table showing the relationship between operation and circuit behavior at an RT level.
FIG. 15C is a table showing the relationship between operation and circuit behavior at a gate level.
Figure 16:
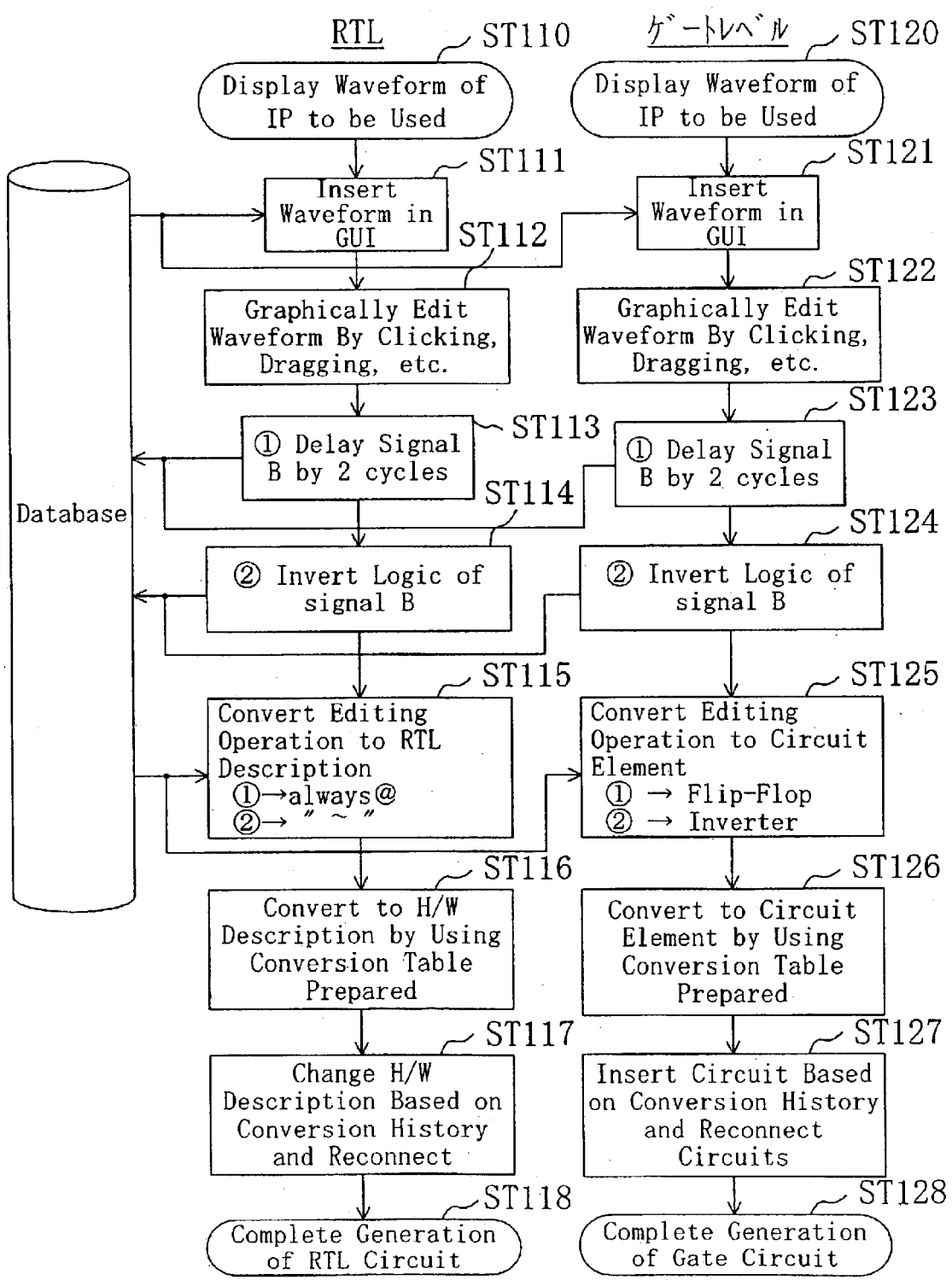
FIG. 16 is a flow chart showing a method of modifying a signal waveform at an RT level and at a gate level.

FIG. 15A is a timing chart illustrating a method of modifying a signal waveform in a second specific example of the second embodiment, FIG. 15B is a table showing the relationship between operation and circuit behavior at an RT level, and FIG. 15C is a table showing the relationship between operation and circuit behavior at a gate level. FIG. 16 is a flow chart illustrating the method of modifying a signal waveform at the RT level and at the gate level in the present specific example. Referring to FIGS. 15A and 15B, the procedure of modifying a signal waveform will be described in accordance with the flow shown in FIG. 16.

The gate level used in the present specific example is defined herein as a circuit level composed of logic elements such as an AND, an OR, an inverter, and a flip-flop and RTL indicates a hardware description language HDL for inputting data for logic synthesis.

First, in Steps ST110, ST120, the signal waveform of an IP to be used is set to be displayed on a GUI. When the signal waveform is then imported from a database to the GUI in Steps ST111, ST121, the waveforms of the clock, reset, signal A, and signal B shown in FIG. 15A are displayed and the signal waveforms can be edited graphically in Steps ST112, ST122.

Next, in Steps ST113, ST123, the signal B is delayed by two cycles (process ①). Specifically, the process ① is performed in such a manner that the designer drags the signal B shown in FIG. 15A by using a mouse, as in the operation shown on the upper level of FIG. 15B, and then slides it rearwardly. The process ① is stored as the circuit behavior "delay" in the database and the operation thereof is associated with the RTL (hardware description).

Next, in Steps ST114, ST124, the logic of the signal B is inverted (process ②). Specifically, the process ② is performed by double-clicking the waveform of the signal B, as in the operation shown on the lower level of FIG. 15B. By the process ② the waveform of the signal B becomes the waveform of a corrected signal shown on the lowermost level of FIG. 15A. The process ② is stored as the circuit behavior "logic inversion of whole signal" in the database and the operation thereof is associated with the RTL (hardware description).

Next, in Steps ST115, ST125, the circuit behaviors of the process ①, ② are extracted from the database and converted to functional element descriptions, as shown in FIG. 15C. As a result, the "delay" operation of the process ① is converted to flip-flops and the "logic inversion" operation of the process ① is converted to inverters.

Next, in Steps ST116, ST126, two flip-flops and an inverter are disposed in series at appropriate portions in a path along which the signal B flows. Then, in Steps St117, ST127, the circuits are reconnected and the generation of the RTL circuit and gate-level circuit is completed in Steps ST118, ST128.

Since the present specific example has generated not only the RTL circuit in a hardware description but also the gate-level circuit according to a modification in signal waveform, the detailed modification and addition of the circuits can be performed at a level lower than the level achieved by the effects of the first specific example. In addition, the circuits can also be added easily to an RTL and gate-level mixed circuit.

VARIATION OF SPECIFIC EXAMPLE 2

In the present variation, a description will be given to a method of generating a circuit in a high-level programming language, such as a C language, in addition to the process of the second specific example.

When hardware-software co-design is to be performed, there are cases where a software IP described in a high-level programming language, such as a C language, is used. The present variation performs automatic generation of a C language description as the generation of an interface circuit necessary for the hardware-software co-design. Although a high-level programming language such as a C language includes a Un-Timed-C (UT-C) description having no conception of time and a cycle-based behavioral description (BCA, RT-C, or the like) having a certain degree of conception of time), either one may be used as the C language description of the present variation. An example of the programming language for describing a function having no conception of time is described in, e.g., a language such as ANSI-C and inputs/outputs are represented as ports representing only data. An example of the programming language used to describe a cycle behavior having the conception of time is such as the generated description shown in FIG. 39, which has adopted the conception of clock behavior. Inputs/outputs are represented as signal lines including data enable, address, and the like in addition to data.

FIG. 39 is a table showing a description in a C language which corresponds to the relationship between operation and circuit behavior corresponding to the timing chart for the method of modifying a signal waveform shown in FIG. 15A. In the drawing, the UT-C description having no conception of time and the cycle-based behavioral description having a certain degree of conception of time are shown as examples. A description will be given herein below by using, as an example, the case of using a BCA description as the cycle-based behavioral description.

Figure 40:
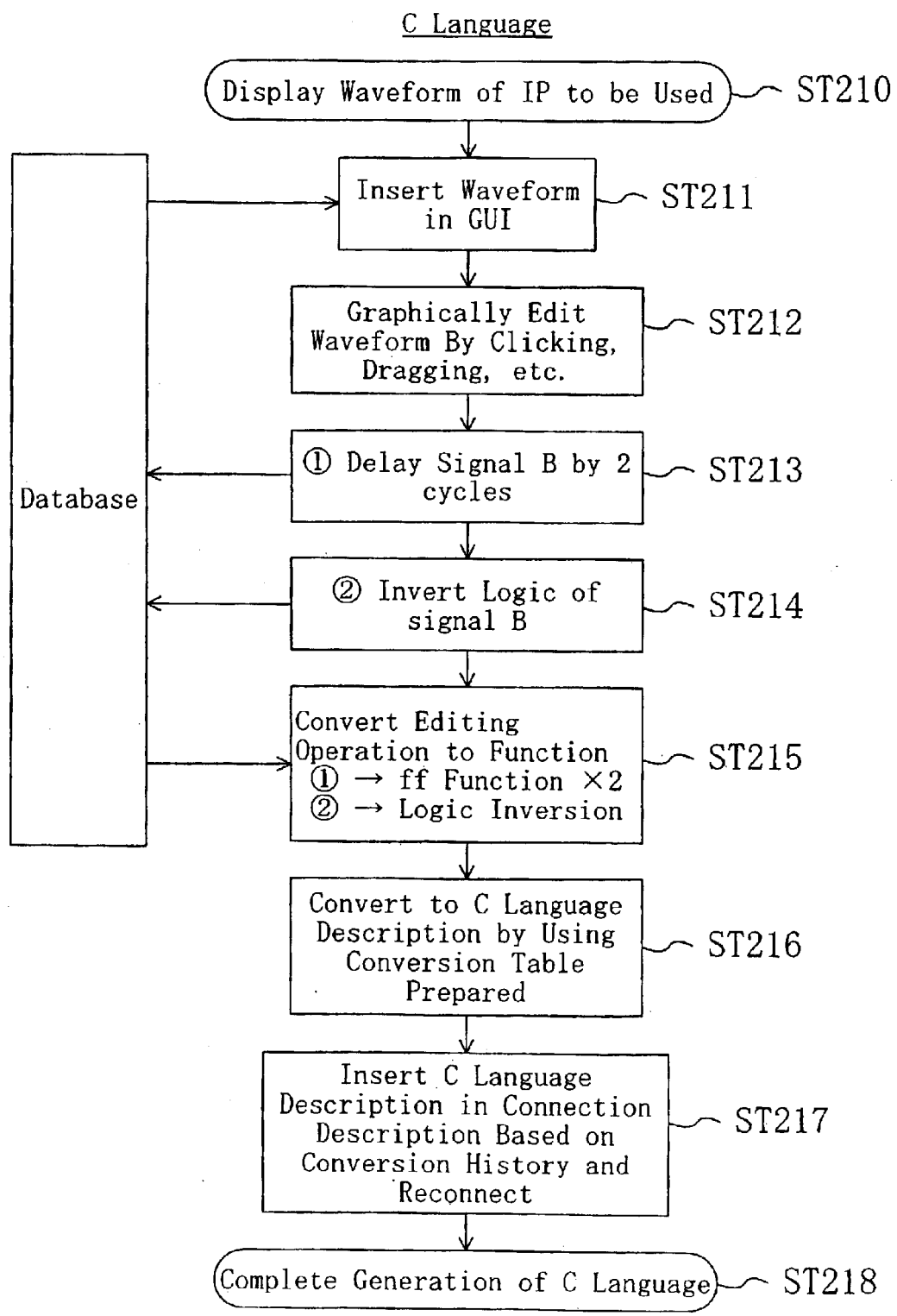
FIG. 40 is a flow chart illustrating a method of modifying a signal waveform by using a C language in the variation of the second specific example of the second embodiment.

FIG. 40 is a flow chart showing the procedure of generating a circuit at a C language level (BCA) in accordance with the flow chart shown in FIG. 16. The procedure of the variation may be performed independently of the second specific example or in parallel with the second specific example. Referring to FIG. 39, the procedure of modifying a signal waveform will be described in accordance with the flow shown in FIG. 40.

First, in Step ST210, the signal waveform of an IP to be used is set to be displayed on a GUI. Then, the signal waveform is imported from a database to the GUI in Step ST211. At this time, the waveforms of the clock, reset, signal A, and signal B shown in FIG. 15A are displayed.

Next, in Step ST213, the signal B is delayed by two cycles in accordance with the process (process ①) for delaying the signal B by two cycles shown in FIG. 15A. The process ① is stored as the circuit behavior "2 cycle delay" in the database and the operation thereof is associated with a C language description.

Next, in Step ST214, the logic of the signal B is inverted in accordance with the process (process ②) for inverting the logic of the signal B shown in FIG. 15A. The process ② is stored as the circuit behavior "logic inversion of whole selected signal" in the database and the operation thereof is associated with the C language description.

Next, in Step ST215, the operational functions of the process ①, ② are extracted from the database and converted to functional element descriptions at a C language level.

Next, in Step ST216, the contents of the process ①, ② are converted to the C language descriptions shown in the column of the functional element of FIG. 39.

Since a UT-C description has no conception of time, a chart having only "values" in the absence of a clock is displayed in the UT-C description. By changing the values (e.g., "0004" (hexadecimal notation) is changed to "000" (hexadecimal notation)), an IF description in UT-C subjected to a logic operation is generated. As shown in FIG. 39, a functional element corresponding to the process ① is not appearing in the UTC description. That is, a flip-flop which is a sequential circuit is not generated. In a cycle-based C description, on the other hand, a description corresponding to a flip-flop is generated as a functional element corresponding to the process ① (see the obliquely hatched portion). As a functional element corresponding to the process ②, a description of logic inversion (the vertically hatched portion in the cycle-based C description) is generated in each of the UT-C description and the cycle-based C description. In the UT-C description, only the description of logic inversion corresponding to the process ② corresponds to an interface circuit. In the cycle-based C description, on the other hand, the description corresponding to the flip-flop (obliquely hatched portion) and the description of logic inversion (vertically hatched portion) become a description of the cycle-based behavior, as shown in the column of generated description of FIG. 39, so that the two descriptions correspond to the interface circuit.

Then, in Step ST217, the C language description is inserted in a description of the connecting relations between the circuits based on a conversion history up to Step ST216, whereby the overall description is reconnected as shown in the column of generated description of FIG. 39. As a result, the C language description for effecting a circuit behavior required for the hardware-software co-design is generated.

Since the present variation has generated the C language description in accordance with a modification in signal waveform, the insertion of an interface circuit, the modification of an existing integrated circuit, and the like, each performed by modifying the waveform by using the GUI, can be applied to simulation using a hardware-software co-design/verification tool. This widens the scope of application of the present invention and increases the application flexibility of the present invention, while reducing the time period of simulation using a C language description.

In the case of using the UT-C description, in particular, the simulation can be performed at a high speed in the absence of a clock, so that the description is simple. If the C compiler of a processor is used, a processor code which can be executed on a processor is obtained advantageously.

In the case of using the cycle-based C description, on the other hand, cycle-based simulation which is more detailed than in the case of using the UT-C description and similar to RTL simulation can be executed. In short, simulation considering detailed timings can be executed. Although the RT-C description is generated by slightly modifying the BCA in the cycle-based description, the RT-C description can be converted automatically to an RTL description by using a commercially available synthesis tool (e.g., N2C commercially available from CoWare, Inc.).

It will be appreciated that the description style shown in FIG. 39 is exemplary and another description style may also be adopted in the present variation.

The circuit generation described in the second specific example and the variation thereof may be performed at each of the RT level, gate level, and C language level or may be performed by selecting any one or two of the foregoing levels. Although the C language used in the present variation of the specific example is a type of high-level programming language, the present variation of the specific example may also use, instead of the C language, another high-level programming language such as Fortran, Java, SystemC, SpecC, or the like in a description for circuit generation or in an element description for circuit generation.

SPECIFIC EXAMPLE 3

In the present specific example, a description will be given to an example of the process of modifying an existing circuit by using a GUI. FIG. 17A is a view showing a circuit to be modified in the present specific example, FIG. 17B is a view showing the waveforms of individual signals prior to modification that have been obtained as a result of simulation, FIG. 17C is a view showing the waveforms of the individual signals in a waveform modifying window, and FIG. 17D is a view showing the waveforms of the individual signals after modification.

As shown in FIG. 17A, there are circuit blocks A, B, and C in a circuit. Upon receipt of output signals Aout1, Aout2 from the circuit block A, the circuit block B outputs output signals Bout1, Bout2. Upon receipt of an output signal Aout3 from the circuit block A, the circuit block C outputs an output signal Cout.

It is assumed that the waveform shown in FIG. 17B is obtained as a result of simulating the circuit. However, only the waveforms of the output signals from the circuit blocks A, B to be modified are shown in FIG. 17B and the waveforms of the other signals are not shown therein.

There are cases where the output signals Bout1, Bout2 are to be modified by modifying the output signals Aout1, Aout2. In these cases, the modifying window is invoked on the GUI so that the waveform of the output signal Aout2 is modified. In this example, the output signal Aout2 is delayed by one cycle by dragging and sliding operations and then the logic of the output signal Aout2 is inverted by a double-click. When the process is completed, "OK" is pressed.

As a result, an I/F circuit represented in an RTL description is inserted in FIG. 17A. Specifically, the I/F circuit is composed of a flip-flop and an inverter.

As a result of performing the simulation of a circuit with the I/F circuit being inserted therein, a signal waveform as shown in FIG. 17D is obtained. If the waveform is not as desired by the designer, the modifying process can be performed again.

According to the present specific example, a modifying process such as the process of inserting the I/F circuit between the blocks can be performed simultaneously with simulation by using the GUI not only when design using an IP is performed but also when an existing integrated circuit is to be corrected, so that the modifying process is performed with great ease.

SPECIFIC EXAMPLE 4

In the present specific example, a description will be given to the application of the technique using the GUI according to the second embodiment to the generation of the interface circuit performed in the first embodiment. FIG. 18A is a view showing a circuit to be modified in the present specific example, FIG. 18B is a view showing the waveform of an output signal from a preceding circuit block IP-A and the waveform of an output signal from a following circuit block IP-B, FIG. 18C is a view showing the waveforms of individual signals in a waveform modifying window, FIG. 18D is a view showing an RTL description of a modifying process, and FIG. 18F is a view showing an I/F circuit generated automatically by the modifying process.

As shown in FIG. 18A, there are the circuit blocks IP-A, IP-B in a circuit. The waveforms shown in FIG. 18B are those of an output synchronizing signal Sync-out and an output data signal Data-out of the circuit block IP-A. The waveforms shown in FIG. 18C are those of an input synchronizing signal Sync-in and an input data signal Data-in of the circuit block IP-B. At this time, the input synchronizing signal Sync-in is delayed by one cycle from the output synchronizing signal Sync-out and the logic value of the input synchronizing signal Sync-in is inverse to that of the output synchronizing signal Sync-out.

Therefore, the modifying window is invoked on the GUI and the waveform of the output synchronizing signal Sync-out is modified, as shown in FIG. 18D. In this example, the logic of the output synchronizing signal Sync-out is inverted by a double-click and then the output synchronizing signal Sync-out is delayed by one cycle by dragging and sliding operations.

As a result, the I/F circuit represented by the RTL description of FIG. 18E is generated automatically. As shown in FIG. 18F, the I/F circuit is composed of the inverter INV and the flip-flop FF connected in series.

The present specific example is advantageous in that the process of automatically generating and inserting the I/F circuit is performed easily by using the GUI.

It will be understood that a circuit block can also be corrected by incorporating, in the circuit blocks, the circuit elements generated in the present embodiment.

Embodiment 3

Figure 19:
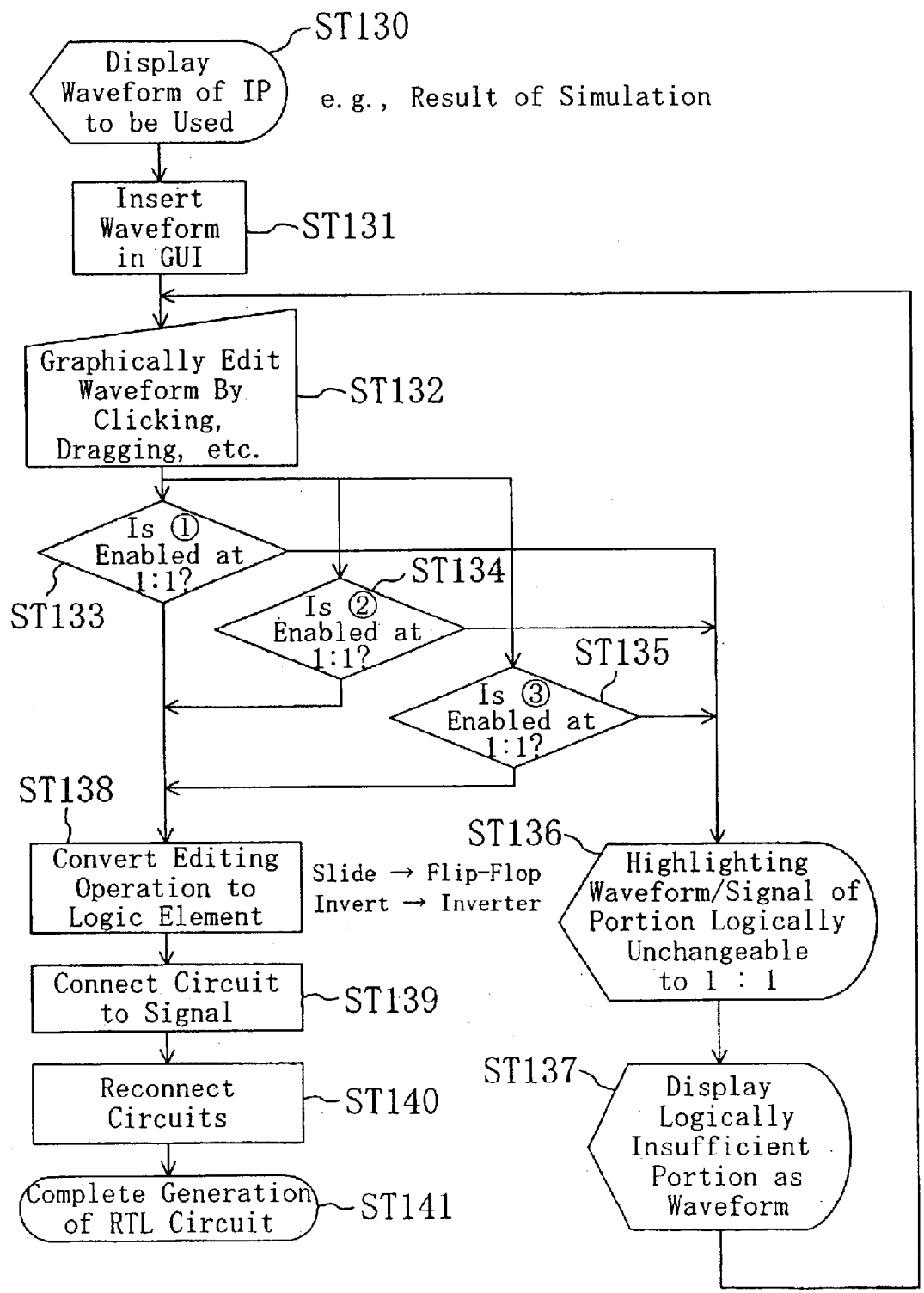
FIG. 19 is a flow chart showing a basic process flow in a third embodiment.
Figure 20:
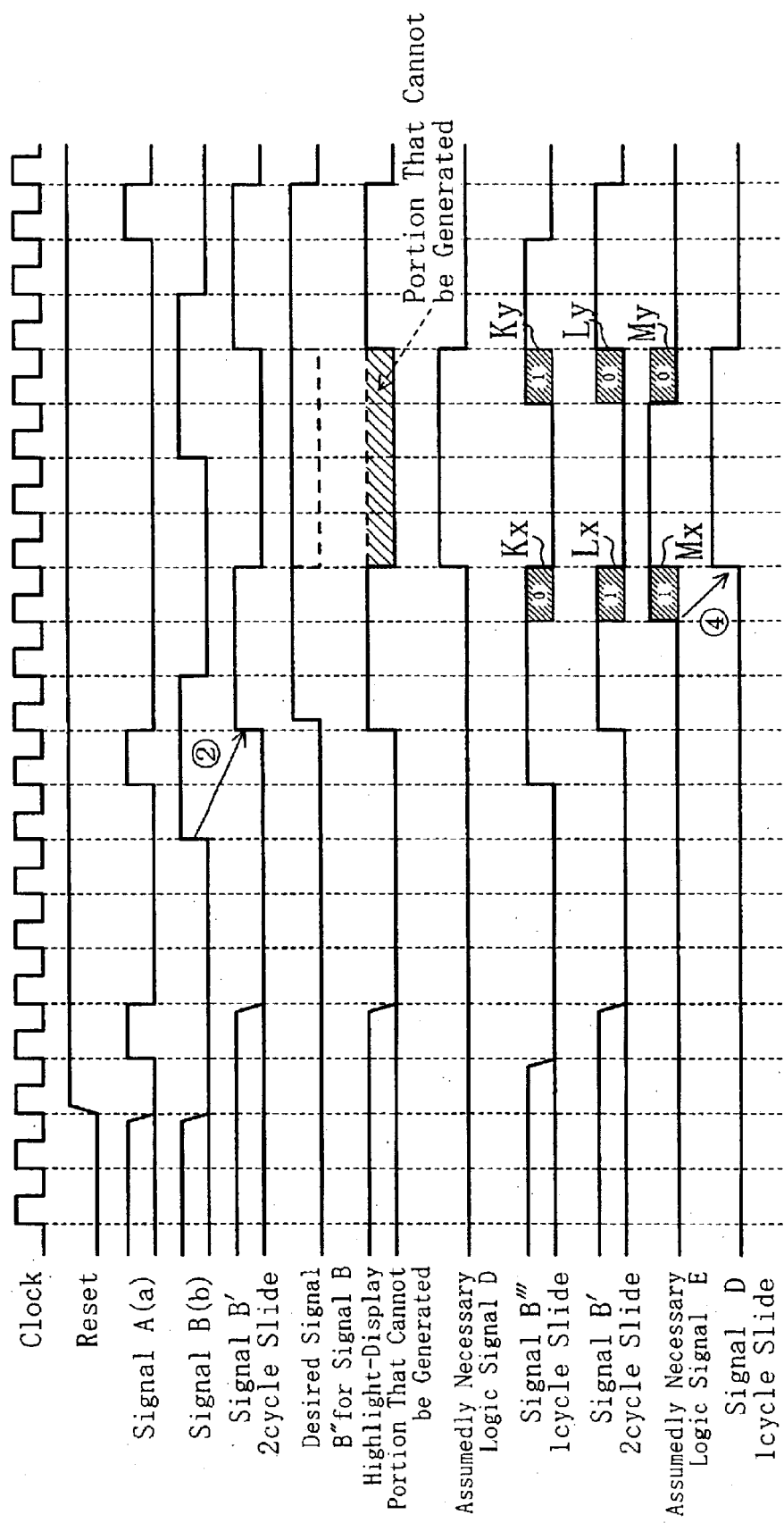
FIG. 20 is a view showing waveforms in a circuit to be edited in the third embodiment.

In the present embodiment, a description will be given to a process when there is a signal which cannot be generated by merely modifying the waveform of a signal. FIG. 19 is a flowchart showing the basic flow of the process in the present embodiment. FIG. 20 is a view showing the waveform of a circuit edited in the present embodiment. Referring to FIG. 20, the content of the process in the present embodiment will be described in accordance with the flow shown in FIG. 19.

First, in Step ST130, the signal waveform of an IP to be used is set to be displayed on a GUI by performing, e.g., simulation. Then, the signal waveform is imported from a database into the GUI in Step ST131. As a result, the waveforms of the clock, reset, signal A, and signal B shown in FIG. 20 appear on a display screen and then edited graphically by clicking, dragging, or like operations in Step ST132. The signal A is transformed to a signal B' shown in FIG. 20 by, e.g., a process ① (not shown) for inverting the logic of the signal A and by a process ② for sliding the signal B by two cycles. Further, a process ③ (not shown) for inverting only the logic of a section of the signal B' is performed. The waveforms that have been modified by these processes are stored in a database.

Next, in Steps ST133, ST134, and ST135, the waveforms that have been modified by the processes ①, ②, and ③ are extracted from the database and it is judged whether or not each of the processes ①, ②, and ③ is enabled at 1:1, i.e., whether or not a signal B" having a waveform desired of the signal B has been generated. In this example, the desired signal B" is not generated by the process ③.

If the answer is NO, i.e., if it is judged that each of the processes ①, ②, and ③ is not enabled at 1:1 in Steps ST133, ST134, and ST135, the whole process moves to Step ST136 where the waveform of a portion that cannot be changed logically is highlighted (the hatched portion in FIG. 20). The process is achievable by, e.g., calculating the difference between the signal B and the signal B' generated by sliding the signal B by two cycles and the desired signal B".

Next, the whole process advances to Step ST137 where the portion considered to be logically insufficient is displayed as a waveform as shown on the lowermost level of FIG. 20. Then, the whole process returns to Steps ST132 and the processes in Steps ST133, ST134, and ST135 are repeatedly performed. If the answer is YES in any of Steps, the desired waveform is obtainable so that the whole process advances to Step ST138 where the editing operation is converted to a functional element description, similarly to each of the foregoing embodiments.

Then, in Step ST139, a circuit to be designed which uses the signal A and the desired signal B" obtained is connected. In Step ST140, the circuits are reconnected and the generation of an RTL circuit is completed in Step ST141.

If "the signal considered to be necessary (i.e., the portion that cannot be generated)" shown in FIG. 20 cannot be generated by merely performing the fore going graphically editing processes, it is generated as follows. First, the signal B in FIG. 20 is slid by one cycle to be transformed to a signal B''', while the signal B is slid by two cycles to be transformed to the signal B'. The rising portion Mx of the signal is generated by calculating the logical AND between the one cycle portion Kx of the signal B''' and the one cycle portion Lx of the signal B'. On the other hand, the falling portion My of the signal is generated by calculating the logical AND between the one cycle portion Ky of the signal B''' and the one cycle portion Ly of the signal B'. A pulse is generated from the rising and falling portions that have been generated by using an RS flip-flop and a set signal and a reset signal are generated. The set and reset signals are delayed by one cycle by using a D flip-flip to be modified to a logic signal D, whereby a logic selecting signal E having a partial waveform with the same pulse width (corresponding to four cycles) as the portion of the logic signal D considered to be necessary that cannot be generated is generated. Further, the logic signal D considered to be necessary is generated by a process ④ for sliding the logic selecting signal by one cycle. At this time, a sliding process and an inverting process may also be added. If the rising and falling portions are generated during the process, a method described in the following fourth embodiment can be used.

Thus, in the case where it is desired to modify the waveform of a signal in an IP component to be used and use the modified waveform, if a desired waveform cannot be generated from the current waveform, it is judged that the generation is impossible, the statement that the generation is impossible is graphically displayed as a result of the judgment, and a logic portion lacking for signal generation is displayed graphically as a necessary signal, whereby the following effects are achieved.

First, since the portion that cannot be generated can be announced to the user promptly and visually during the design on the GUI, a time required conventionally to search the portion that cannot be generated and analyze the reason that the generation is impossible can be reduced.

Second, with the portion displayed on the GUI, the user is allowed to take an action for generating the portion that cannot be generated. By thus allowing the user to make a proper judgment on a method of generating a signal for the portion that cannot be generated, an optimum circuit can be generated promptly.

If there is a signal that cannot be generated merely by graphical editing, the rising and falling portions of a signal having the same pulse width as the signal that cannot be generated are generated by performing a logical operation between the corresponding portions of a plurality of signals. By extending the logic values of the rising and falling portions as they are, a signal having a partial waveform with the same pulse width as the portion that cannot be generated can be generated. By adding graphical sliding/inverting operations thereafter as required, the signal having the portion that cannot be generated (signal considered to be necessary) can be generated easily.

Embodiment 4

Figure 21:
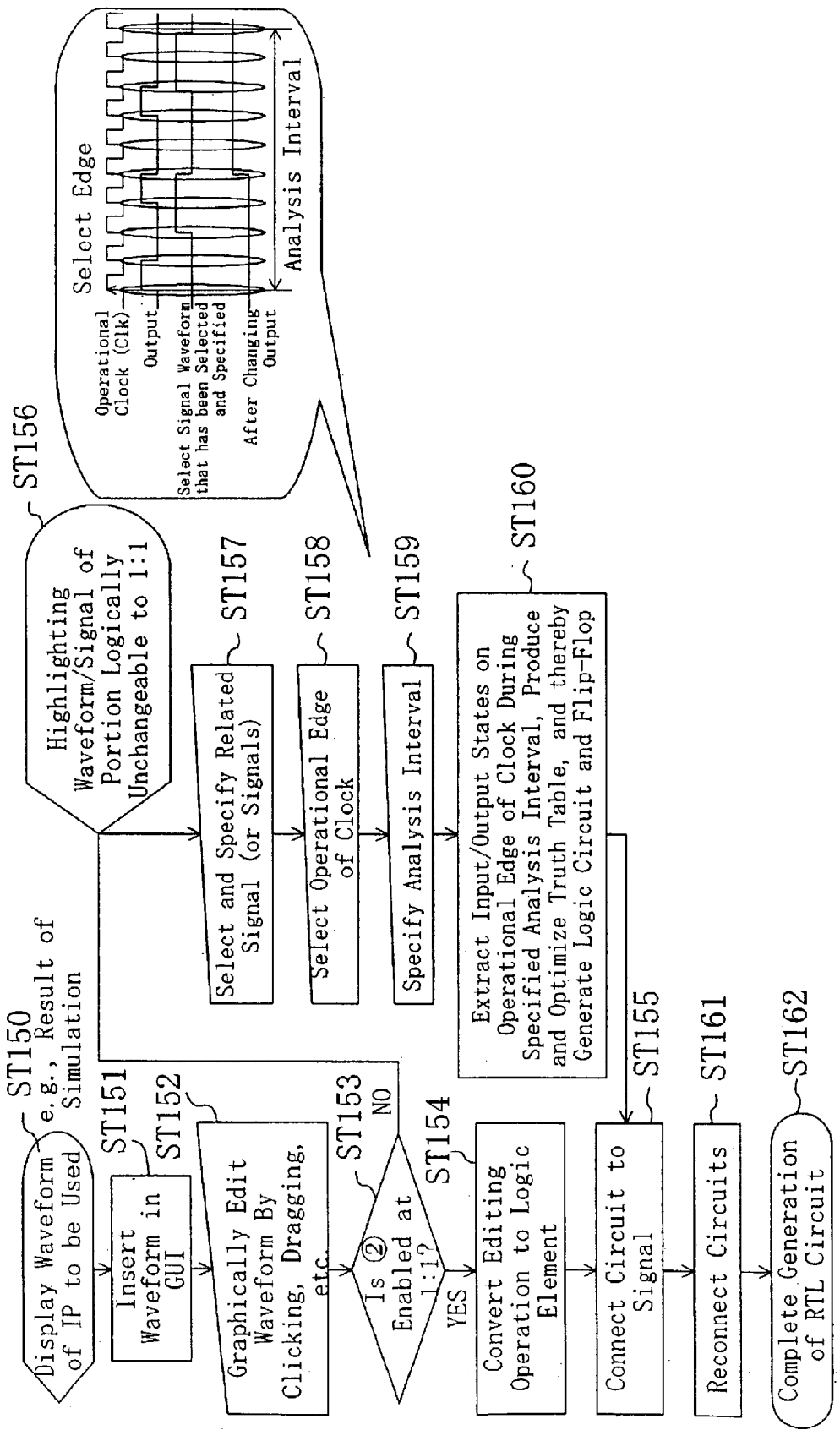
FIG. 21 is a flow chart showing a basic process flow in a fourth embodiment.
Figures 22A, 22B:
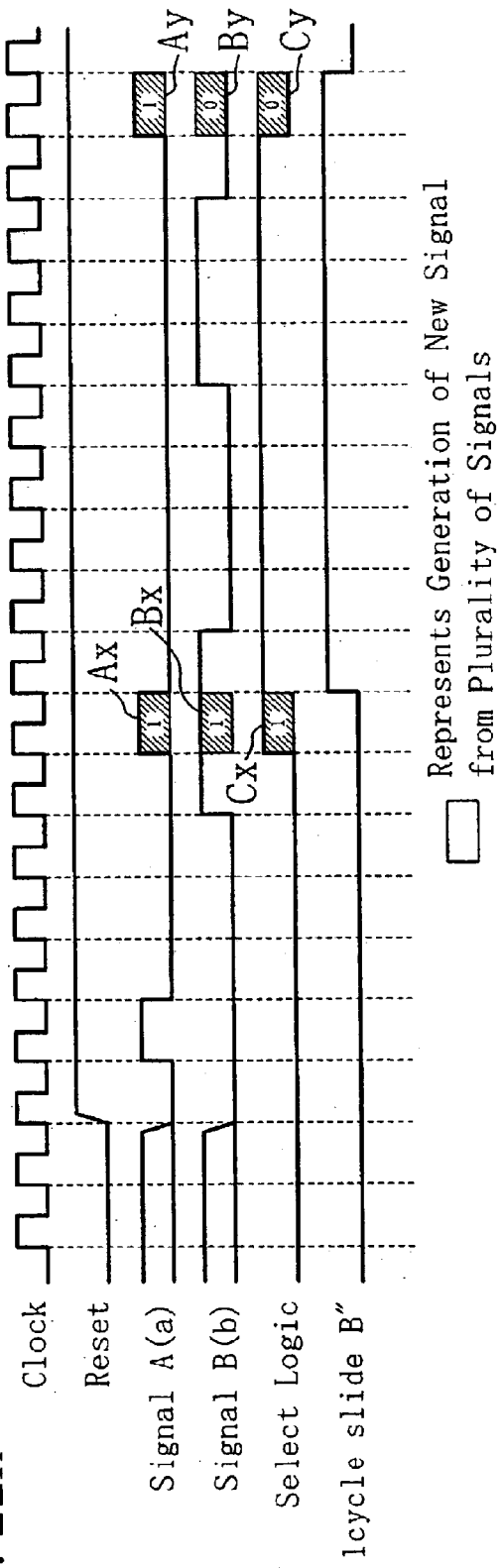
FIG. 22A is a waveform chart showing the procedure of generating a signal in the fourth embodiment and FIG. 22B is a basic logic conversion table.

In the present embodiment, a description will be given to a method of assuming and generating a circuit from a plurality of waveforms in the foregoing third embodiment. FIG. 21 is a flow chart showing the basic process flow in the present embodiment. FIG. 22A is a waveform chart showing the procedure of generating a signal in the present embodiment and FIG. 22B is a basic logic conversion table. FIG. 23 is a view showing an example of a circuit to be generated in accordance with the method of the present embodiment. Referring to FIGS. 22A, 22B, and 23, the content of the process in the present embodiment will be described in accordance with the flow shown in FIG. 21.

First, in Step ST150, the signal waveform of an IP to be used is set to be displayed on a GUI by performing, e.g., simulation. Then, the signal waveform is imported from a database to the GUI in Step ST151. As a result, the waveforms of a clock, a reset, a signal A, and a signal B shown in FIG. 22A appear on a display screen and then edited graphically by clicking, dragging, or like operations in Step ST152. For example, a process ② for sliding the signal B by two cycles (e.g., the signal B is modified to the signal B' shown in FIG. 20 of the third embodiment) is performed.

Next, in Step ST153, it is judged whether or not the process ② is enabled at 1:1, i.e., whether or not the signal B" having a waveform desired of the signal B shown in, e.g., FIG. 20 of the third embodiment has been generated.

If the answer is YES as a result of the judgment in Step ST153, the desired waveform is obtainable so that the whole process advances to Step ST154 where the editing operation is converted to a functional element description, similarly to each of the foregoing embodiments. Further, in Step ST155, a circuit to be designed which uses the signal A and the desired signal B" obtained is connected.

If the answer is NO, i.e., if the process ② is not enabled at 1:1 as a result of the judgment in Step ST153, the whole process moves to Step ST156 where the waveform of a portion that cannot be changed logically is highlighted (see the hatched portion in FIG. 20). Next, in Step S157, the user selects and specifies a related signal, whereby the signals A, B shown in, e.g., FIG. 22A are selected. Next, in Step S158, the user selects an operational edge for a clock. At this time, an edge selection as shown in the upper right-hand portion of FIG. 21 is performed.

Next, the whole process advances to Step ST159 where an analysis interval as shown in the upper right-hand portion of the drawing is specified.

Next, in Step ST160, input/output states on the operational edge of the clock in the specified analysis interval are extracted and a truth table is produced such that a logic circuit and a flip-flop are generated by optimizing the truth table or the like. For example, a rise signal Cx and a fall signal Cy are obtained by performing an AND operation between Ax, Bx, Ay, By, and the like shown in FIG. 22A. That is, signals used to compose a logic signal for creating a signal to be generated are selected. If the rise and fall signals are to be delayed, a unit logic signal is slid, whereby the desired signal B" shown in FIG. 20 is generated. Instead of the sliding operation, an inverting operation may also be performed.

Figures 23A, 23B:
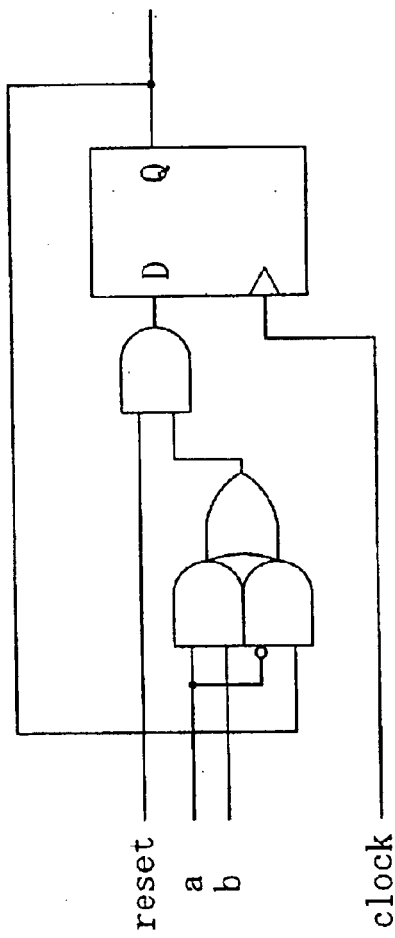
FIG. 23A is an RTL description of a logic circuit and a flip-flop generated in the process of the fourth embodiment and FIG. 23B is a circuit diagram thereof.

FIG. 22B a view showing elements and RTL descriptions thereof when a basic logic for generating the foregoing desired signal B" is converted to the circuit elements. FIG. 23A is a view showing RTL descriptions of a logic circuit and a flip-flip generated by the process and FIG. 23B is a circuit diagram thereof.

Further, in Step ST161, the circuits are reconnected and the generation of the RTL circuit is completed in Step ST162.

Thus, if a desired waveform cannot be generated from the current waveform, a circuit for outputting the desired waveform is generated by allowing the user to select a plurality of other existing signals and synthesizing the selected signals.

Alternatively, the waveforms indicated by the hatched portions in FIG. 20 of the third embodiment, e.g., may also be generated by using the method.

Embodiment 5

In the present embodiment, a description will be given to a method of automatically generating a circuit for adjusting the timing of transferring data between two circuit blocks operating in response to clocks with different frequencies.

Figure 28A:
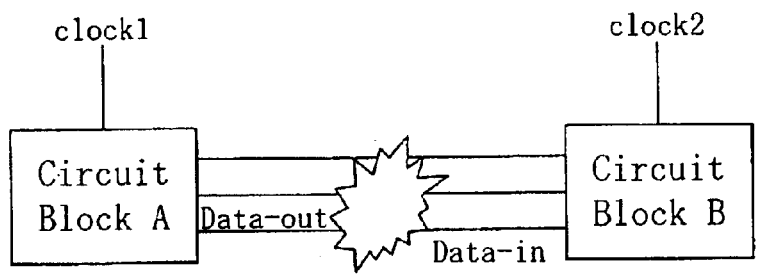
FIG. 28 is a circuit diagram showing trouble encountered during data transmission between conventional circuit blocks operating at different frequencies.
Figure 28B:
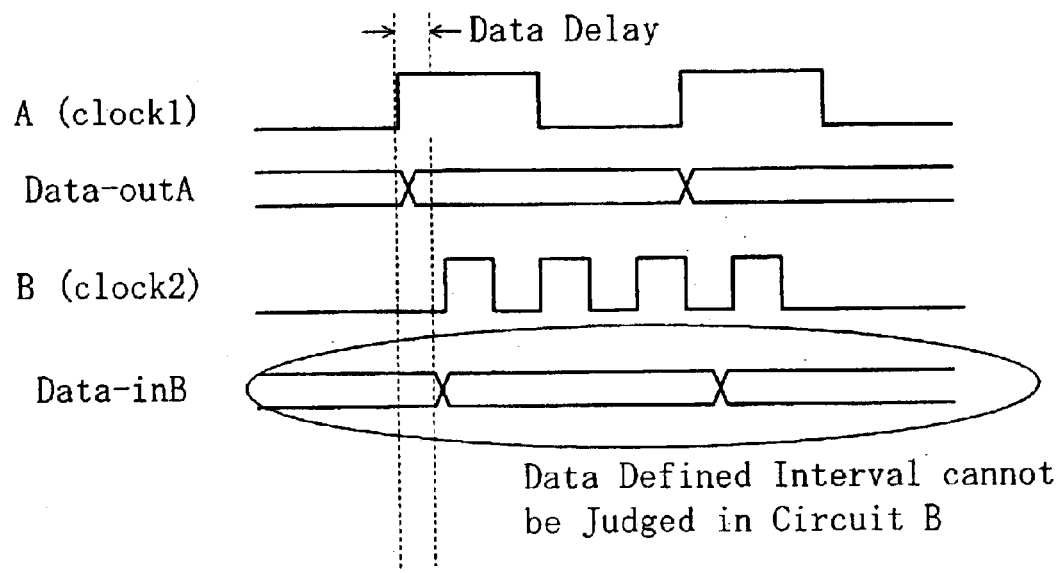

As shown in FIGS. 28A, 28B, if a circuit in which a preceding circuit block A and a following circuit block B are disposed is to be designed, it is assumed that an IP used as the circuit block A is designed to operate with a clock 1 and an IP used as the circuit block B is designed to operate with a clock 2. If the clocks 1 and 2 are assumed to have different frequencies and different phases, it is impossible to judge a period during which data received from the circuit block A is valid (defined interval) depending on a description of the circuit block B. Accordingly, the operation of the following circuit block B is ensured by manually performing analysis and the designing and addition of a delay generating circuit. Thus, since the prior art technology has manually adjusted the timing of transferring data between IP components in the development using a plurality of IPs, the problem that numerous process steps are required is encountered.

Therefore, the present invention will describe specific examples for automatically analyzing the timing of transferring data between IPs and generating a timing adjusting circuit by using various cases.

SPECIFIC EXAMPLE 1

Figure 24:
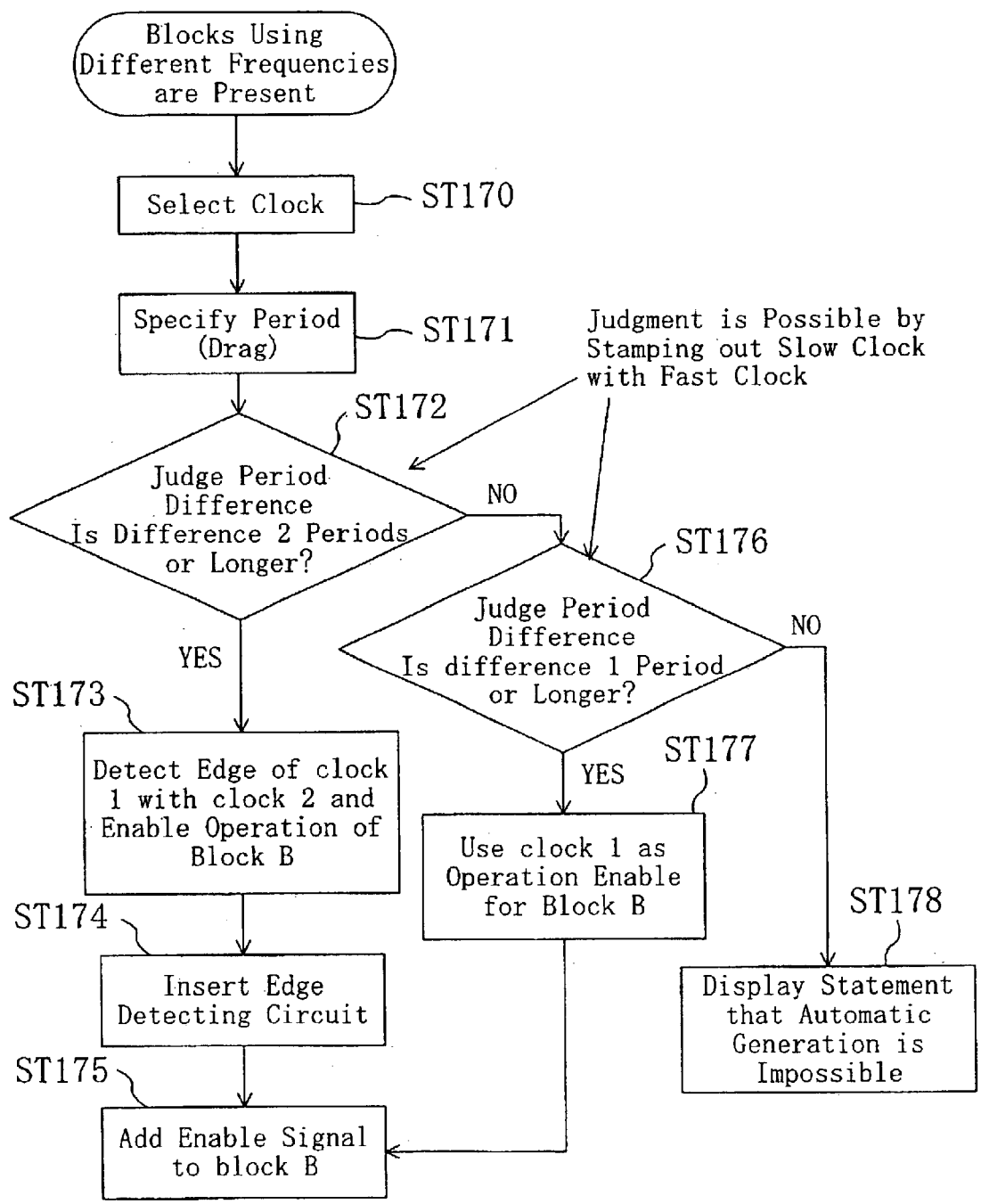
FIG. 24 is a flow chart showing a basic process flow in a first specific example of a fifth embodiment.

FIG. 24 is a flow chart showing the basic process flow in a first specific example. FIG. 25A is a diagram of a circuit to be designed in the first specific example, FIG. 25B is a timing chart showing the procedure of modifying the circuit, FIG. 25C is a view showing a HDL description of a rising edge detecting circuit C, and FIG. 25D is a view showing HDL descriptions of a circuit B before and after the modification thereof.

In the present specific example, a description will be given to the case where the circuit blocks A, B which are two IPs operating in response to clocks with different frequencies are disposed in the preceding and following stages, as shown in FIG. 25A.

Referring to FIGS. 25A to 25D, the convent of the process in the present embodiment will be described in accordance with the flow of FIG. 24.

First, in Step ST170, a clock is selected and the period of the clock is specified in Step ST171. As shown in, e.g., FIG. 25B, the process is for announcing that the circuit block A operates with the clock 1, the circuit block B operates with the clock 2, and the periods of the clocks 1, 2. The difference between the periods of the clocks is recognizable if the waveforms are compared by, e.g., using a fast clock in place of a slow clock, so that it is not necessarily required to specify the periods of the clocks. However, the periods of the clocks are preferably specified for a rapid process.

Next, in Step ST172, it is judged whether or not the period of the clock 1 is equal to or longer than double the period of the clock 2. As stated previously, the judgment can be performed easily by using the fast clock in place of the slow clock. If the answer is YES and the period of the clock 1 is the double the period of the clock 2 or longer, the whole process advances to Step ST173 where the edge of the clock 1 is detected based on the clock 2 and the operation of the circuit block B is enabled. The rise detecting circuit C is represented in a behavioral description as shown in FIG. 25C. In Step ST174, the detected edge circuit C is inserted between the circuit blocks A and B, as shown in FIG. 25A. Then, an enable signal Data-enable is added to the circuit block B such that an output of the circuit C is used as Data-enable. As shown in FIG. 25D, the circuit block B prior to modification, i.e., the circuit block B extracted as an IP from the database is capable of merely performing the operation of fetching an output data signal Data-outA from the circuit block A as an input data signal Data-inB. By inserting the edge circuit C and thereby modifying the circuit block B, Data-Bin is fetched in response to Data-enable. That is, in spite of a frequency difference, Data-enable can be constantly held HIGH during the period during which data is active in the preceding circuit block if the frequency of the clock for the preceding circuit block is double the frequency of the clock for the following circuit block or longer, so that data is surely fetched. This prevents useless operation of the circuit during the period during which it is not required, so that the present specific example is effective if there is a circuit which should be operated only for one cycle for each item of data, such as an accumulating circuit.

If the answer is NO and it is judged that the period of the clock 1 is not double the period (two periods) of the clock 2 or longer in Step ST172, the whole process advances to Step ST176 where it is further judged whether or not the clock 1 is equal to or longer than the period of the clock 2. If the result of the judgment is YES, the clock 1 is set as it is as the operation enable for the circuit block B in Step ST177 and then the process of Step S175 is performed. In this case, it is unnecessary to insert an edge circuit.

If the result of the judgment is NO in Step ST176, on the other hand, the whole process moves to Step ST178 where the statement that automatic generation is impossible is displayed.

If the period of the clock 1 is a multiple of the period of the clock 2, data can surely be fetched by the clock 2 so that it is unnecessary to perform a process of modifying a circuit or inserting an edge circuit.

Thus, the method of the present specific example ensures the fetching of received data by detecting the rising edge without considering the frequency difference between the clocks 1 and 2, though it is impossible to judge the period during which received data is valid or the period of the clock on the side of the following circuit block B which receives data from the preceding circuit block. In designing a semiconductor integrated circuit device which is constructed by laying out a large number of circuit blocks, a restriction imposed on selection by the type of a clock for an IP core to be used is reduced so that the design is accelerated by a wider range of choices and the quality of the designed semiconductor integrated circuit device is improved.

SPECIFIC EXAMPLE 2

FIG. 26A is a circuit diagram of a circuit to be designed in a second specific example, FIG. 26B is a timing chart showing the procedure of modifying the circuit, FIG. 26C is a view showing a HDL description of the rising edge detecting circuit C, and FIG. 26D is a view showing HDL descriptions of the circuit B prior to and after the modification.

In the present specific example, a circuit block D operating with the clock 1 is disposed in the following stage of the circuit block B in addition to the circuit configuration of the foregoing first specific example. In short, the present specific example shows the case where data on the circuit block A is transferred again to the circuit block D having the same frequency as the circuit block A via an IP (circuit block B) having a different frequency on a system.

In the present specific example, the process is performed in accordance with the flow shown in FIG. 24, similarly to the foregoing first specific example. If the relationship shown in the timing chart of FIG. 26B is established, the circuit block B is modified such that the data is fetched by the clock 1 by synchronizing the output period of the output data signal Data-out from the circuit block B with Data-enable (a signal outputted from the circuit C) in the circuit block B, as shown in FIG. 26D. Consequently, the system operates in synchronization with the clock 1.

In the present specific example, the operating frequencies of the circuit blocks, which are unchangeable in terms of performance, are not changed and a data interface between the circuit block B and another circuit block is artificially operated with the operating period (period of the clock 1) of the circuit block A with the view to circumventing a contradiction in on-system operation, whereby the operation of the entire system is normalized.

The present specific example is applicable to general non-synchronous circuits in which a circuit block in the following stage is operated with an enable signal generated by edge detection.

SPECIFIC EXAMPLE 3

As in the foregoing first and second specific examples, the period during which data is valid is surely provided by giving a fixed rule to synchronizing signals (clock, data enable, and the like) for the individual transmitting/receiving circuits in order to retain the synchronousness of transmitted/received data in data transfer between the circuit blocks operating with the clocks having different frequencies and different phases.

By giving such a rule, however, a undesirable restriction may be imposed on the relationship between the transmitting/receiving blocks, particularly on the relationship between the respective frequencies of the transmitting/receiving blocks.

In the present specific example, therefore, a description will be given to the technique for automatically generating a signal indicating a defined interval for transferred data in the preceding block without depending on a synchronizing signal between the blocks operating with clocks having different frequencies and different phases and receiving a data signal in the following block by using a signal indicating the data defined interval.

FIG. 27A is a diagram of a circuit to be designed in the present specific example, FIG. 27B is a waveform chart of a data output signal and a data defining signal, and FIG. 27C is a view illustrating a method of setting first and second margins.

In the present specific example, it is assumed that a data output signal (such as Data-outA) is outputted from a circuit block A operating in synchronization with a clock 1 and the data output signal is transferred to a circuit block B operating in synchronization with a clock 2 having a frequency and a phase different from those of the clock 1, as shown in FIG. 27A.

At this stage, the present specific example automatically inserts the circuit C, which is the interface circuit for generating the data defining signal, between the circuit blocks A, B, as shown in FIG. 27A. The circuit C is inserted not only for the data output signal Data-outA shown as a representative but also for another data output signal. In the circuit C, the data defining signal Data-enable is generated by providing first and second margins ta, tb anterior and posterior to a data transition region (period tt) for the data output signal Data-outA from the circuit block A. The data defining signal Data-enable generated in the circuit C is transferred to the circuit block B. On the other hand, the data output signal Data-outA is transferred directly from the circuit block A to the circuit block B. The circuit block B can receive valid data by judging a period during which the data defining signal Data-enable is active as a data defined interval. The data defining signal Data-enable is generated by the following procedure by using a timing chart during simulation.

First, as shown in FIG. 27A, the timing chart for the circuit block A is fetched. Although the clock signal and the data signal in the circuit block A are shown as examples in the lower left-hand frame of FIG. 27A, the clock signal is unnecessary and only the data signal is fetched appropriately. In this specific example, if the user selects the data output signal Data-outA to be transferred, the data defining signal Data-enable for controlling the timing of fetching data is generated automatically from the data transition region (period tt) of the data output signal Data-outA and from the margins (ta, tb) for the data transition region, as shown in FIG. 27B and displayed on the GUI. The margins ta, tb are calculated automatically as follows.

In general, a set-up time, a hold time, and the like and provisional wiring data have been stored preliminarily as library delay data in a database. The present specific example detects automatically a data skew by detecting a displacement between respective defined intervals for a plurality of bits in one item of data by using data in the library and in the database and based on the delay data and the provisional wiring data. As a result, the period tt of the data transition region (starting and ending points of the data transition region), the first margin ta nearly equal to the hold time, and the second margin tb nearly equal to the set-up time are calculated automatically, as shown in FIG. 27C. At this time, a period between the timing leading the starting point of the data transition region by the first margin ta and the timing lagging behind the ending point of the data transition region by the second margin tb is designated as a data undefined period (ta+tt+tb). That is, during the data undefined period (ta+tt+tb), there is the possibility that any one of all the bits in one item of data is undefined. By contrast, it can be considered that all the bits in one item of data have been defined during the period except for the data undefined period (ta+tt+tb).

Then, as shown in the lower portion of FIG. 27B, the timing chart for the data output signal Data-outA for the circuit block A is fetched and the data defining signal Data-enable which falls (becomes invalid) with the timing leading the data transition region of the data output signal data-outA by the first margin ta and rises (becomes valid) with the timing lagging behind the data transition region by the second margin is generated. In this manner, the data defining signal Data-enable which is determined uniquely is obtained. When the data defining signal Data-enable is inputted to the circuit block B, it becomes possible to precisely judge the data defined interval in the circuit block B as described above, so that the data is surely received.

If it is simulated whether or not the data can be received correctly by the circuit B by using the data defining signal Data-enable and it is found that the data has not been received properly, the data defined interval may also be adjusted. In this case, the margins ta, tb are adjusted by key entry on the GUI, modifying the timing chart with the use of an input device such as a mouse, or the like.

Thus, in the present specific example, it has become possible to specify the data defined interval without being affected by the relationship between the clock frequencies used by the transmitting/receiving blocks by generating the data defining signal data-enable by focusing attention on the data transition region without using a synchronizing signal (such as a clock) for the generation of the data defining signal data-enable in designing a semiconductor integrated circuit device constructed by laying out a large number of circuit blocks. This allows only valid data in the data defined interval to be fetched without fetching invalid data in the data undefined interval in a non-synchronous circuit interface and thereby effects efficient data transfer. This further saves the designer the burden of designing an interface circuit including complicated timing control.

SPECIFIC EXAMPLE 4

In the present specific example also, a description will be given to the technique for automatically generating a signal indicating a defined interval for transferred data in the preceding block without depending on a synchronizing signal between the blocks operating with clocks having different frequencies and different phases and receiving a data signal in the following block by using the signal indicating the data defined interval, similarly to the third specific example.

In the present specific example also, it is assumed that a data output signal (such as data-outA) is outputted from a circuit block A operating in synchronization with a clock 1 and the data output signal is transferred to a circuit block B operating in synchronization with a clock 2 having a frequency and a phase different from those of the clock 1 as shown in FIG. 27A, similarly to the third specific example.

At this stage, the present specific example also automatically inserts, between the circuit blocks A and B, a circuit C which is an interface circuit for generating a data defining signal. In the present specific example, however, the data output signal is transferred not directly from the circuit block A to the circuit block B but from a node intervening the circuit C.

Figure 38A:
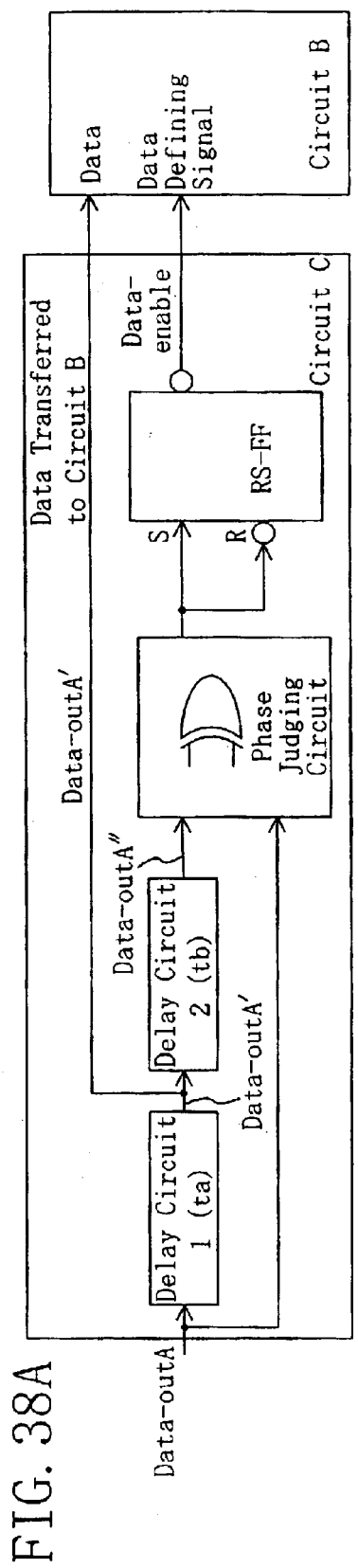
FIG. 38A is a circuit diagram showing the content of an interface circuit in the fourth specific example of the fifth embodiment.
Figure 38C:
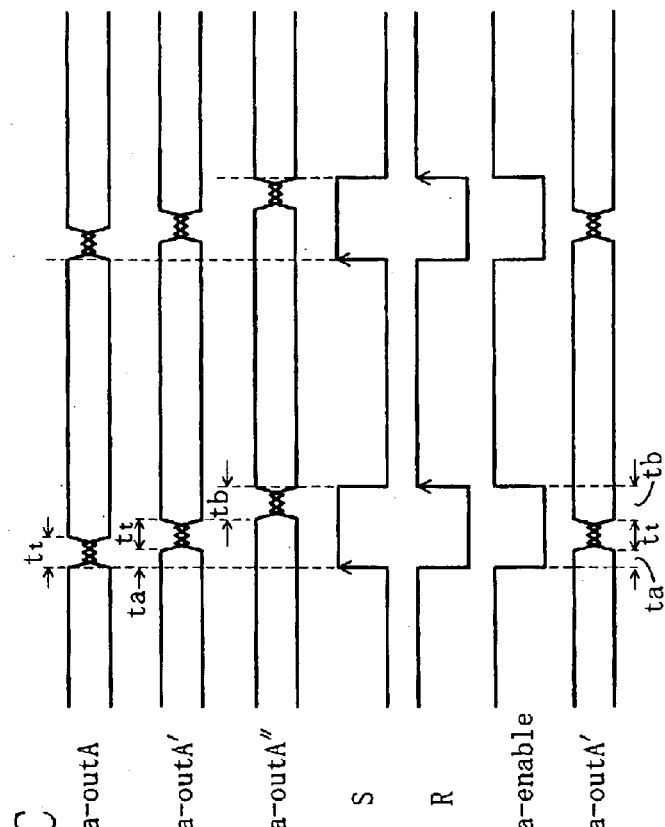
FIG. 38C is a timing chart showing the procedure of the modifying a signal.
Figure 38B:
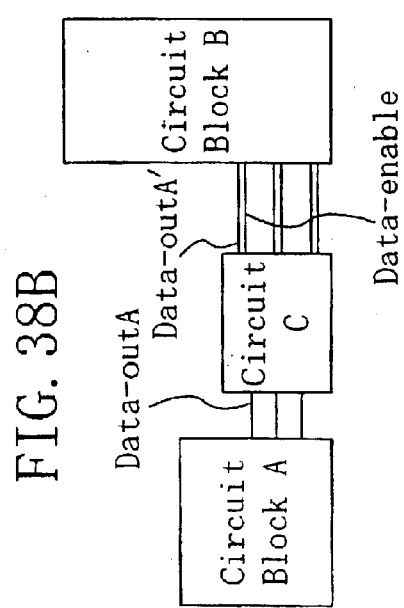
FIG. 38B is a diagram of a circuit to be designed.

FIG. 38A is a diagram of an interface circuit for generating the data defining signal formed in the present specific example, FIG. 38B is a diagram of a circuit to be designed, and FIG. 38C is a timing chart showing the procedure of signal generation. In this case, the period tt of the data transition region and the first and second margins ta, tb are calculated automatically by a method described in the third specific example.

Then, as shown in FIG. 38A, a delay circuit 1 (ta) for providing a delay nearly equal to the first margin ta and a delay circuit 2 (ta) for providing a delay nearly equal to the second margin tb are generated and the delay circuits 1 (ta) and 2 (tb) are interposed in series in a signal line for transmitting the data output signal Data-outA. The delay circuits 1 (ta) and 2 (tb) are typically composed of a buffer chain. Accordingly, a data output signal Data-outA' from the delay circuit 1 (ta) is delayed from the data output signal Data-outA from the circuit block A by the first margin ta, as shown in FIG. 38C. On the other hand, a data output signal Data-out" from the delay circuit 2 (tb) is delayed from the data output signal Data-outA' from the delay circuit 2 (tb) by the second margin tb and delayed from the output signal data-outA from the circuit block A by the sum (ta+tb) of the first and second margins ta, tb.

Then, as shown in FIG. 38A, a phase judging circuit for receiving the data output signal Data-outA from the circuit block A and the output signal Data-outA" from the delay circuit 2 (tb) and outputting a judging signal S for judging a phase including the period tt of the data transition region is generated automatically. As shown in FIG. 38C, the phase judging signal S is a signal having a waveform which rises at the starting point of the data transition region of the data output signal Data-outA from the circuit block A and falls at the ending point of the data transition region of the output signal Data-outA" from the delay circuit 2 (tb). When an RS flip-flop (RS-FF) for receiving the judging signal S and an inverted signal R thereof is generated automatically, the data defining signal Data-enable having a waveform obtained by inverting the waveform of the judging signal S is outputted. The data defining signal Data-enable is then transferred to the circuit block B. On the other hand, the data output signal Data-outA' is transferred from the node between the delay circuits 1 (ta) and 2 (tb) to the circuit block B.

As a result, the data output signal Data-outA' delayed from the data output signal A from the circuit block A by the first margin ta and the data defining signal Data-enable from the circuit C are transferred to the circuit block B, as shown in FIG. 38B. The data defining signal data-enable is a signal having, as the data defined period, an interval composed of the data transition region (period tt) of the data output signal Data-outA' with the fixed margins ta, tb provided anterior and posterior thereto. The timing relationship between the data defining signal data-enable and the data output signal Data-outA' is the same as the timing relationship between the data defining signal Data-enable and the data output signal Data-outA in the third specific example. Therefore, the circuit block B can receive valid data by judging the period during which the data defining signal Data-enable is active to be the data defined interval, as described in the third specific example.

Thus, the present specific example can also achieve the same effects as achieved by the third specific example.

Although the delay circuits 1, 2 are necessary as the circuits for generating the data defining signal Data-enable, it will be appreciated that a configuration other than the combination of the phase judging circuit and RS-FF may also be adopted.

Embodiment 6

In the present embodiment, a description will be given to a method of assuming and generating a circuit from a plurality of timing charts.

Figure 29:
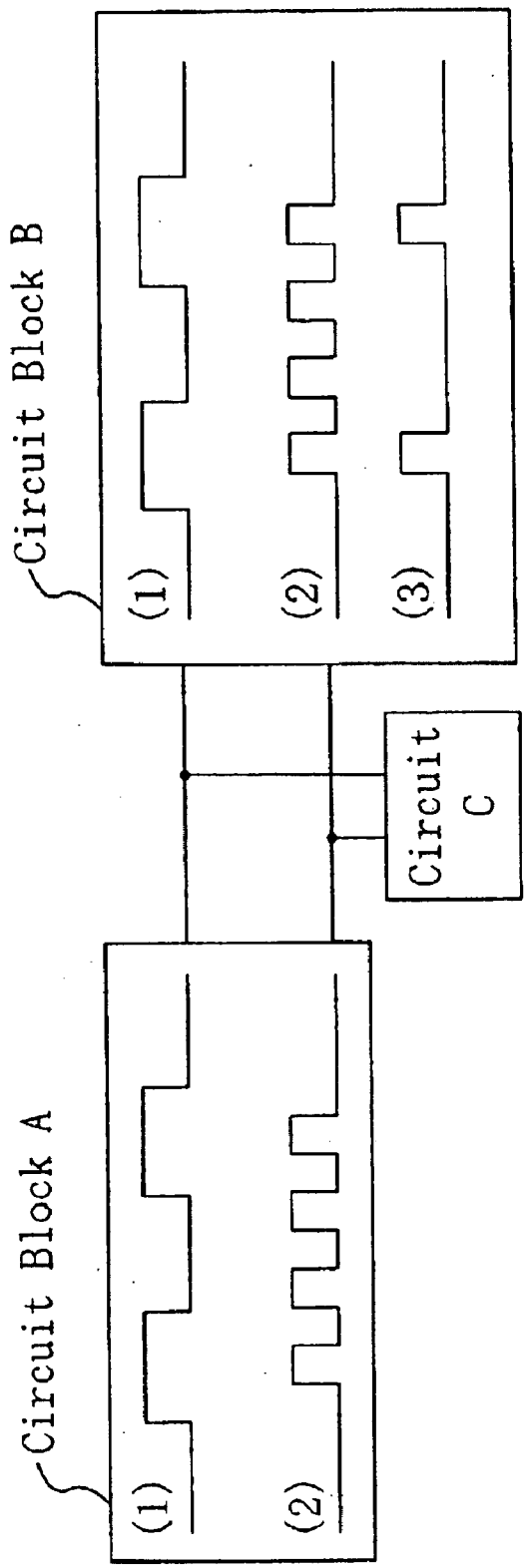
FIG. 29 is a circuit diagram showing a concept common to individual specific examples of a sixth embodiment.

FIG. 29 is a circuit diagram showing a concept common to each of the specific examples of the present embodiment. As shown in the drawing, there are circuit blocks A and B and a timing chart therefor is provided. It is assumed here that the circuit block A has signals corresponding to signals (1), (2) in the circuit block B but does not have a signal corresponding to a signal (3) in the circuit block B. In other words, it is assumed that there is no input for the signal (3), though the signal (3) is wanted obviously.

In this case, if a circuit C is generated for the user to newly obtain a desired signal, the circuit scale and the number of designing steps may be increased disadvantageously.

Therefore, the present embodiment automatically generates and adds the circuit C by the process of combining signals in the circuit block B or the like. The specific examples for obtaining the desired signal will be described herein below.

SPECIFIC EXAMPLE 1

Figure 30A:
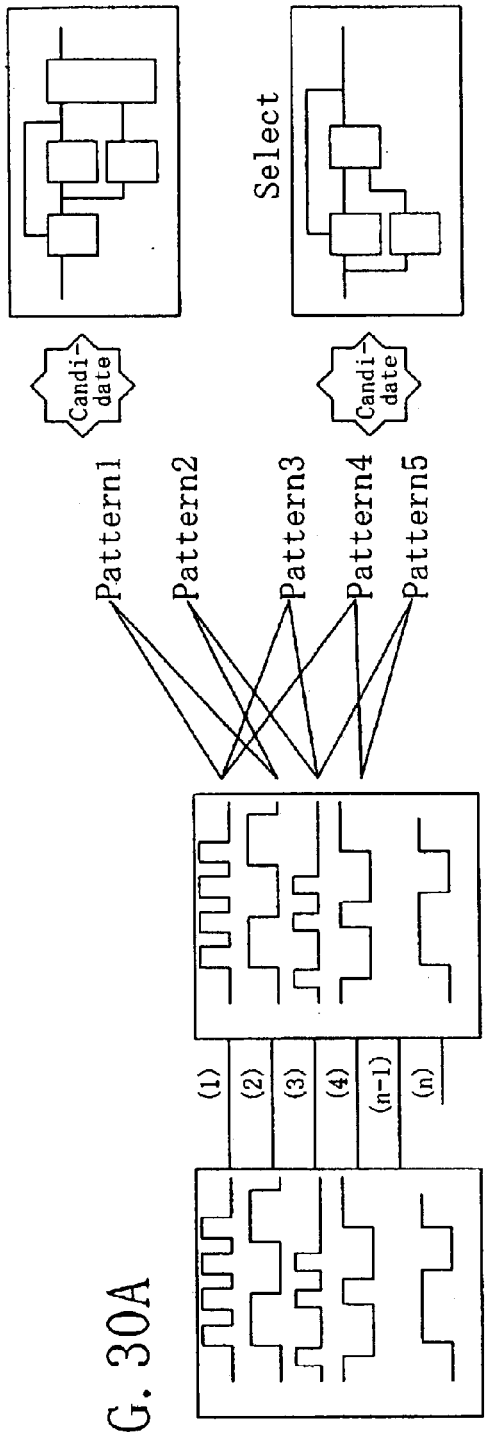
FIGS. 30A and 30B are views each illustrating a method of automatically generating a circuit for outputting a desired signal in the first specific example of the sixth embodiment.
Figure 30B:
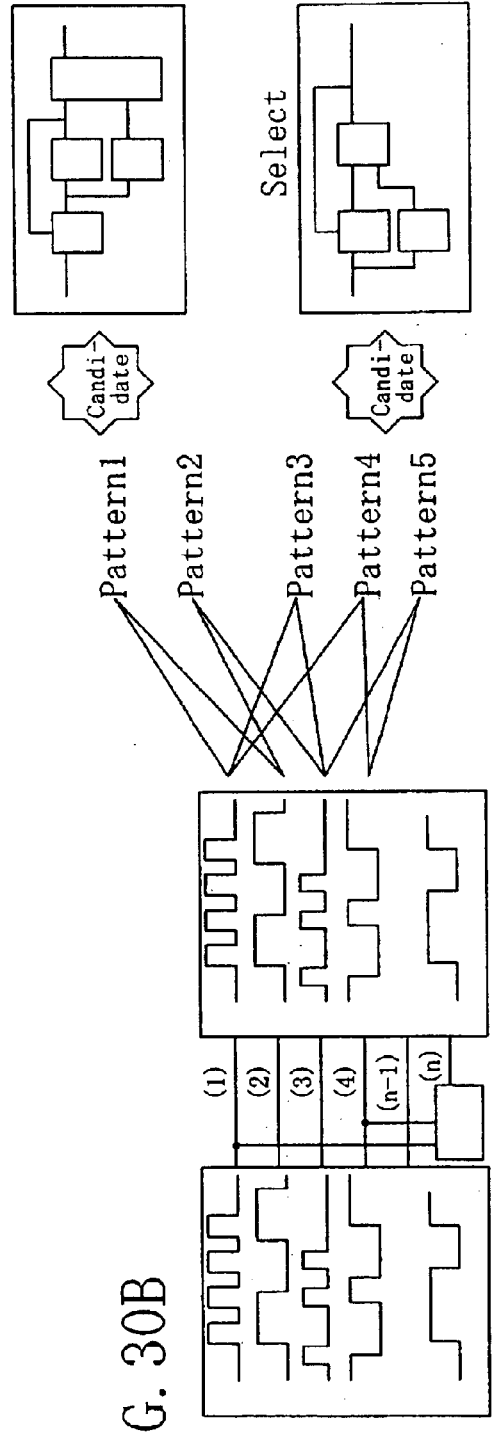

FIGS. 30A, 30B are views illustrating a method of automatically generating a circuit for outputting the desired signal in the first specific example. In this example, the circuit for outputting the desired signal is generated automatically by focusing attention on a combinational circuit.

It is assumed first that there are circuit blocks A, B as shown in FIG. 30A and, of signals (1) to (4), . . . , (n–1), and (n) in the circuit block B, only the signal (n) is lacking. In this case, the description will be limited to the signal (1) and synthesized signals composed of combinations of the signals (1) and (2), the signals (1) and (3), the signals (1) and (4), . . . are compared with the desired signal (n). Then, synthesized signals composed of the combinations of the signals (2) and (3), the signals (2) and (4), . . . are compared with the desired signal (n).

FIGS. 31A to 31E are views showing examples of combinational circuits for forming a combination of two inputs including the signal (1), forming a combination of two inputs including the signal (2), forming a combination of three inputs including the signals (1) and (2), forming a combination of three inputs including the signals (1) and (3), and forming a combination of two inputs including the signal (n–1).

During the process, if a signal coincident with the desired signal (n) is obtained, the signal is selected and the circuit C for outputting the signal is generated, as shown in FIG. 30B.

In the example shown in FIG. 30B, the circuit C for outputting the signal (n) is assumedly obtained with the combination of the signals (1) and (4). Then, the I/F circuit is modified with the generation of the circuit C.

That is, the circuit C for generating signals composed of the combinations of all the signals is generated automatically when the signals (1) to (4), . . . and (n−1) which are required in the circuit block B and present in the circuit block A and the signal (n) which is absent in the circuit block A and required in the circuit block B are determined. In this case, the user may also give an upper limit value to the number of signal inputs, the number of gate stages, or the like.

Even when a circuit which outputs a signal completely coincident with the desired signal (n) has not been obtained in the process of extracting the combinational circuit, a circuit which outputs a signal close to the desired signal (n) is reserved as a candidate for the circuit C. If there are a plurality of circuits which output a signal coincident with the desired signal (n) at the final stage, one of them is selected. If a signal completely coincident with the desired signal (n) has not been obtained, the user selects a circuit which generates a signal close to the desired signal (n) as the circuit C to be inserted as the second best solution. An optimum circuit C can be selected in consideration of parameters such as circuit area and power consumption. However, an upper limit of the number of combinations is set preferably for prevention of an indefinite searching time.

SPECIFIC EXAMPLE 2

Figure 32:
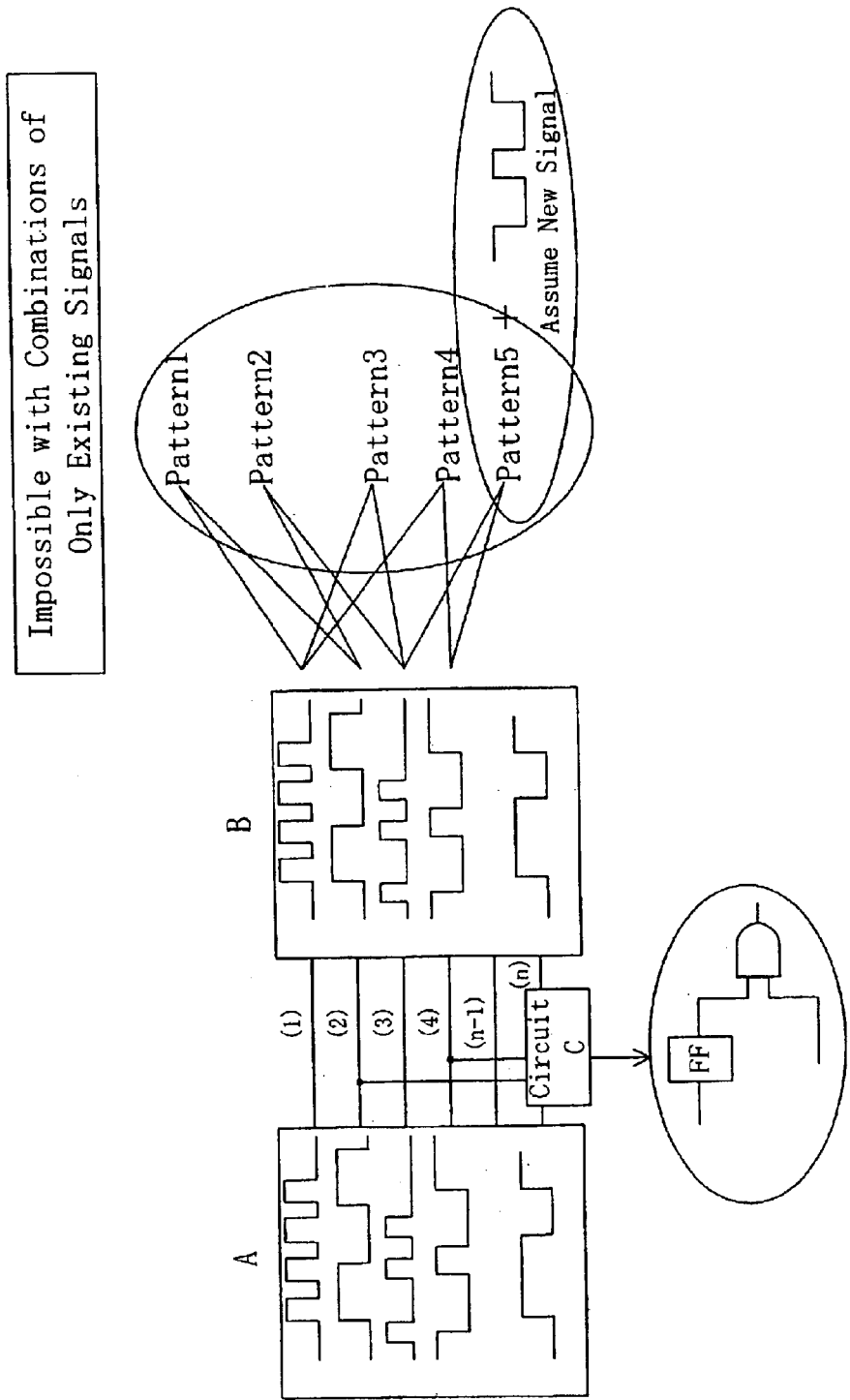
FIG. 32 is a circuit diagram illustrating a method of generating a circuit for outputting a designed signal in the second specific example of the sixth embodiment.

FIG. 32 is a circuit diagram showing a method of generating a circuit for outputting a desired signal in a second specific example. The description will be given herein below to the case where the circuit for generating the desired signal cannot be generated with a combination of existing signals.

As shown in FIG. 32, if the desired signal or a signal close to the desired signal has not been obtained as a result of scanning combinations of signals, a timing chart for a new complementary signal is assumed or generated. In other words, not only of a combinational circuit but also a sequential circuit is inserted. For example, the process of delaying the signal (1) by inserting a flip-flop FF and then combining the signal (1) with the signal (2) or the like is performed in a scanning manner with respect to each of the combinations. For example, the same procedure as performed in the first specific example is repeated for (1) +FF and (2) +FF. When the circuit for outputting the desired signal is obtained, the I/F circuit is modified with the generation of the circuit C.

In accordance with the method, the desired signal can be generated automatically by combining the signals in the circuit block B and introducing the idea of a sequential circuit even in the case where the desired signal is to be obtained from the signals in the preceding circuit block A but it is difficult to generate the circuit C by combining the signals in the circuit A since the specifications of the circuit block A are unknown to the circuit block B. However, an upper limit of the number of stages in the sequential circuit is set preferably for prevention of an indefinite searching time.

SPECIFIC EXAMPLE 3

Figure 33:
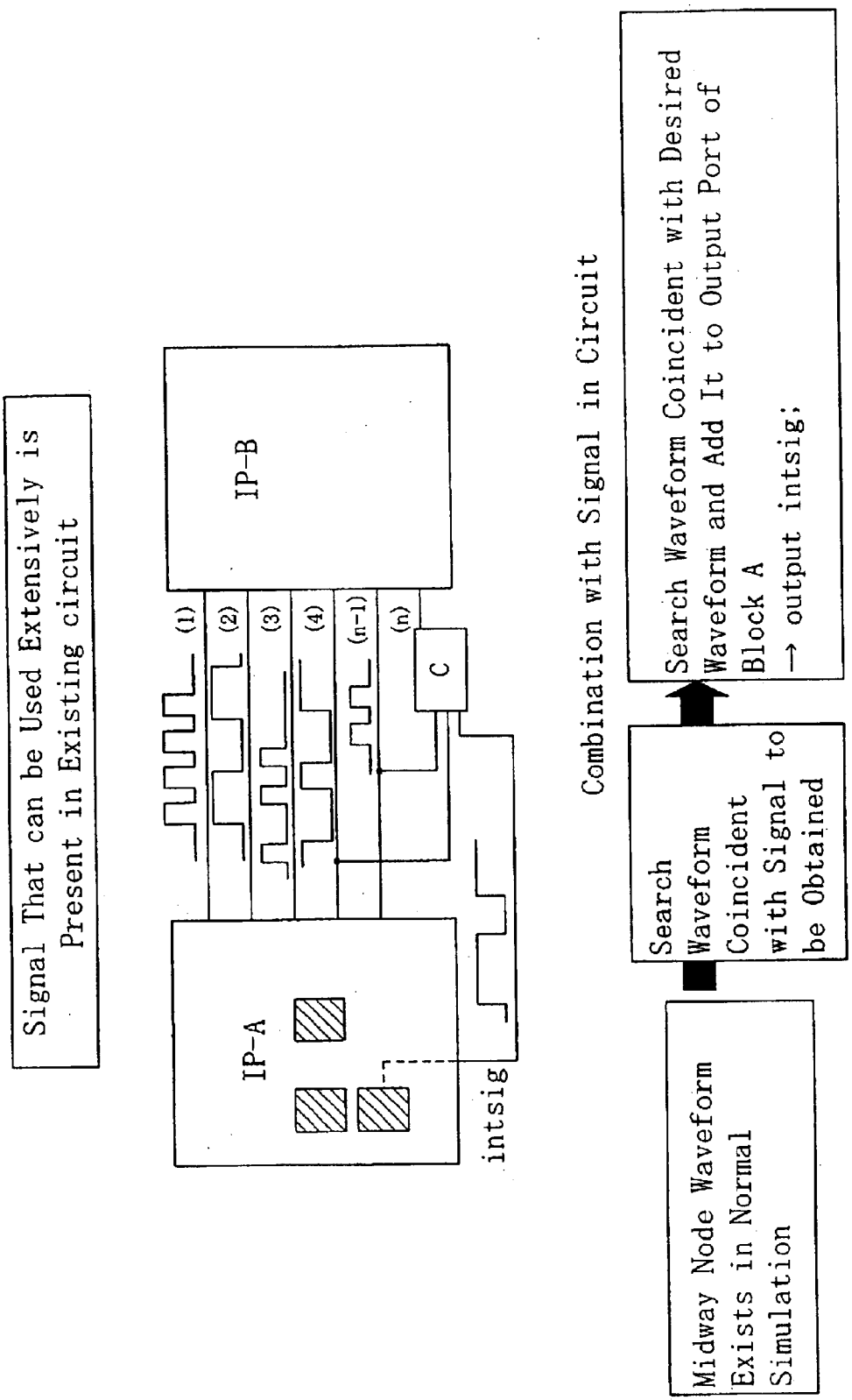
FIG. 33 is a circuit diagram illustrating a method of generating a circuit for outputting a designed signal in the third specific example of the sixth embodiment.

Even if the desired signal cannot be obtained by generating a combinational circuit or generating a combinational circuit and a sequential circuit as in the first or second specific example, there are cases where a midway node waveform usable for the generation of the desired signal is present at a node in an existing circuit block A, as shown in FIG. 33. This can be found by simulation. In the present specific example, a description will be given to the case where the circuit for generating the desired signal cannot be generated by combining existing signals but a signal waveform in an exiting circuit block can be used.

Figure 34:
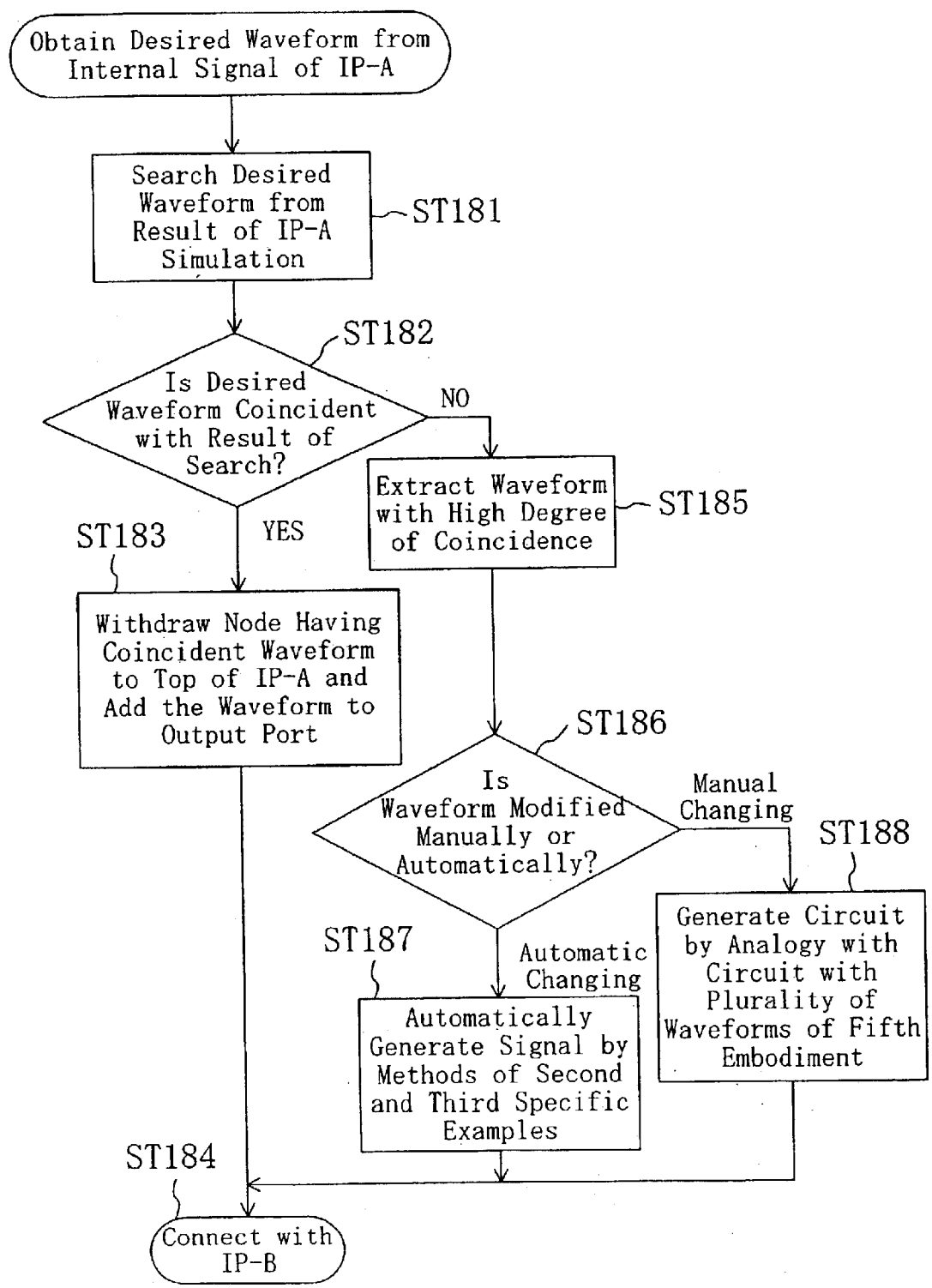
FIG. 34 is a flow chart illustrating the procedure of generating a designed signal in the third specific example of the sixth embodiment.

FIG. 33 is a circuit diagram illustrating a method of generating a circuit for outputting the desired signal in the third specific example. FIG. 34 is a flow chart showing the procedure of generating the desired signal in the third specific example. It is to be noted that, in FIG. 33, the signals (1) to (4), . . . , and (n−1) are present in the circuit blocks A and B, as shown in FIGS. 30A, 30B, and 32. Referring to FIG. 33, the method of generating the circuit for outputting the desired signal will be described in accordance with the flow in FIG. 34.

First, in Step ST181, simulation of IP-A is performed to examine whether or not a midway node waveform coincident with a waveform (desired waveform) required to generate the desired signal is present at a node in IP-A. Then, in Step ST182, it is judged whether or not the midway node waveform coincides with the desired waveform. If there is a coincidence (YES), the whole process advances to Step ST183 where a node having the coincident waveform is extracted to the top of IP-A and added to an Output port. That is, as shown in FIG. 33, an output terminal for extracting a signal from the node having the midway node waveform is added to the circuit block A and the circuit C for outputting the desired signal is generated as a combinational circuit (or a combinational circuit and a sequential circuit) to which a signal from the output terminal has also been added.

If the result of the judgment in Step ST182 is NO, the whole process advances to Step ST185 where a midway node waveform having a high degree of coincidence with the desired waveform is extracted and switching is performed between manual modification of the waveform and automatic modification of the waveform according to the user's choice in Step ST186. In the case of automatic modification, the circuit C for outputting the desired signal is generated automatically in Step ST187 in accordance with the procedure of the second and third specific examples described above. In the case of manual modification, the circuit C is generated in accordance with the method described in the fifth embodiment (see FIGS. 21 to 23), i.e., by assumption from the circuit with the plurality of waveforms.

At that time, an output terminal which is a new I/F portion is added to IP-A and the I/F structure is also modified with the generation of the circuit C.

Embodiment 7

A description will be given to a seventh embodiment pertaining to the generation of a conditional script for logic synthesis for synthesizing a circuit.

When the logic synthesis of a circuit block IP-B is performed in accordance with the conventional method of designing an integrated circuit device, even if the circuit blocks IP-A and IP-B have delay data, an output delay value of the circuit bock IP-A is set manually as an input delay of the circuit block IP-B in a logic synthesis script file. However, such a process may increase the number of steps in the design of an integrated circuit device and lower the quality of a designed circuit due to mis-setting.

In the present embodiment, therefore, a description will be given to a method of automatically generating a logic synthesis script by using data on the respective waveforms of output and input signals of each circuit block IP.

Figure 35:
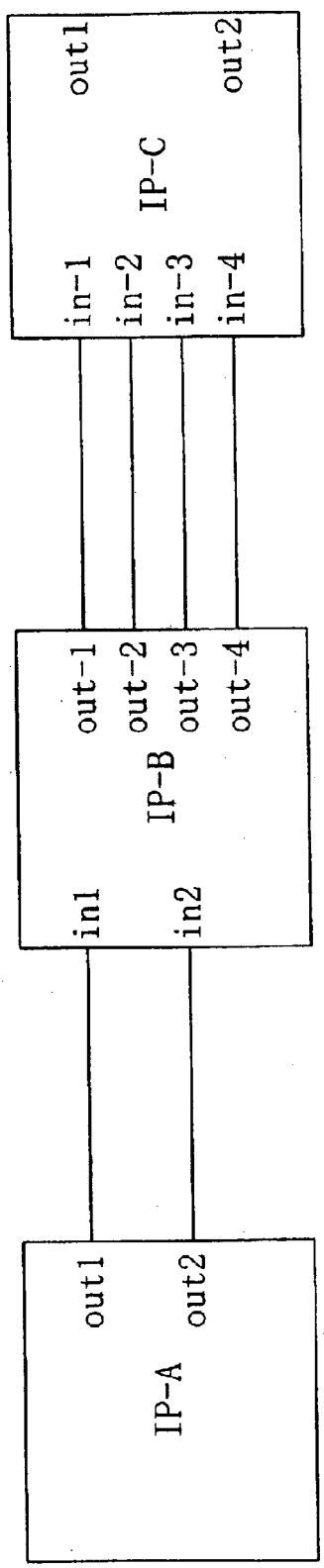
FIG. 35 is a circuit diagram diagrammatically showing a structure of an integrated circuit device to be designed in a seventh embodiment.

FIG. 35 is a circuit diagram schematically showing a configuration of an integrated circuit device to be designed in the present embodiment. A circuit block IP-A is defined herein as a circuit block of which delay simulation can be performed or in which waveforms during operation are present. A circuit block IP-B is defined herein as a circuit block for RTL designing of which the logic synthesis is performed. A circuit block IP-C is defined herein as an IP in which a waveform required of an input pin is present. Under such conditions, a logic synthesis script required to perform the logic synthesis of the circuit block IP-B is generated automatically.

FIGS. 36A to 36E are views sowing the procedure of automatically generating the logic synthesis script in the present embodiment. FIGS. 37a and 37b are views showing a part of the logic synthesis script including a description of the setting of delay values and a description of the setting of a clock period. Referring to FIGS. 37a and 37B, the procedure of generating the logic synthesis script will be described with reference to FIGS. 36A to 36E.

First, as shown in FIG. 36A, the waveforms of output signals out-1, out-2 of the circuit block IP-A are inputted together with the waveform of a clock for the circuit block IP-B. As shown in FIG. 36C, the waveforms of input signals in-1, in-2, in-3, and in-4 of the circuit block IP-C are inputted together with the waveform of a clock for the circuit block IP-B. In FIG. 36B, a HDL description representing the configuration of the circuit block IP-B is shown.

Next, as shown in FIG. 36D, the logic synthesis script is generated automatically by using data in FIGS. 36A to 36C. At this time, the output signal out-1 of the circuit block IP-A is set as the input signal in-1 of the circuit block IP-B and the output signal out-2 of the circuit block IP-A is set as the input signal in-2 of the circuit block IP-B. Then, the respective delay values Δt1, Δt2 between the rising timings of the input signals in-1, in-2 and the clock CLK for the circuit block IP-B and the period T of the clock CLK for the circuit block IP-B are set. As a result, the description of the setting of the delay values and the description of the setting of the clock CLK are inserted in the logic synthesis script, as shown in FIG. 37B.

In this manner, the logic synthesis script of the circuit block IP-B is generated by using data on the delay between the outputs of the preceding circuit block IP-A and the clock for the circuit block IP-B and data on the delay between the inputs of the following circuit block IP-C and the clock for the circuit block IP-B. At this time, the outputs of the circuit block IP-B are given as conditions for outputting signals to the circuit block IP-C.

Thus, if the conditions on the input pins of the circuit block IP-C are given as the waveforms, the present embodiment enables automatic generation of the logic synthesis script of the circuit block IP-B by reflecting the conditions in the result of the logic synthesis of the circuit block IP-B. By automatically generating the logic synthesis script, the number of designing steps is reduced and the quality of the designed semiconductor integrated circuit device is improved.

In the where an output is produced by a gate, a proper load may also be added automatically.

What is claimed is:

1. A method of designing a semiconductor integrated circuit device by using a database, the method comprising the steps of:
   (a) storing, upon receipt of an operation of modifying a waveform of a signal extracted from the database on a display screen, a waveform of the signal after the modification in storing means;
   (b) extracting data representing said modified waveform stored in the storing means and converting the modification in the waveform to a circuit behavior based on a difference between the waveforms before and after the modification; and
   (c) generating a circuit for performing the circuit behavior.

2. The method of claim 1, further comprising the step of:
   inserting the circuit generated in the step (b) as an interface circuit between circuit blocks.

3. The method of claim 1, wherein the step (c) includes generating the circuit at an RT level.

4. The method of claim 1, wherein the step (c) includes generating the circuit at a gate level.

5. The method of claim 1, wherein the step (c) includes generating the circuit in a programming language for describing a function, the programming language having no conception of time.

6. The method of claim 1, wherein the step (c) includes generating the circuit in a programming language for describing a function in a cycle behavior, the programming language having a conception of time.

* * * * *